United States Patent
Yu et al.

(10) Patent No.: US 12,033,976 B2
(45) Date of Patent: Jul. 9, 2024

(54) SEMICONDUCTOR PACKAGE HAVING A THROUGH INTERVIA THROUGH THE MOLDING COMPOUND AND FAN-OUT REDISTRIBUTION LAYERS DISPOSED OVER THE RESPECTIVE DIE OF THE STACKED FAN-OUT SYSTEM-IN-PACKAGE

(71) Applicant: Taiwan Semiconductor Manufacturing Co., Ltd., Hsinchu (TW)

(72) Inventors: Chen-Hua Yu, Hsinchu (TW); Kuo-Chung Yee, Taoyuan (TW)

(73) Assignee: TAIWAN SEMICONDUCTOR MANUFACTURING COMPANY, LTD., Hsin-Chu (TW)

( * ) Notice: Subject to any disclaimer, the term of this patent is extended or adjusted under 35 U.S.C. 154(b) by 0 days.

(21) Appl. No.: 18/164,061

(22) Filed: Feb. 3, 2023

(65) Prior Publication Data
US 2023/0187408 A1    Jun. 15, 2023

Related U.S. Application Data

(63) Continuation of application No. 16/442,873, filed on Jun. 17, 2019, now Pat. No. 11,637,084, which is a
(Continued)

(51) Int. Cl.
*H01L 25/065* (2023.01)
*H01L 21/56* (2006.01)
(Continued)

(52) U.S. Cl.
CPC ........ *H01L 25/0652* (2013.01); *H01L 21/565* (2013.01); *H01L 21/568* (2013.01);
(Continued)

(58) Field of Classification Search
CPC ............... H01L 25/065; H01L 25/0652; H01L 25/0657; H01L 25/071; H01L 25/074;
(Continued)

(56) References Cited

U.S. PATENT DOCUMENTS 5,111,278 A    5/1992   Eichelberger
7,550,857 B1   6/2009   Longo et al.
(Continued)

*Primary Examiner* — Ermias T Woldegeorgis
(74) *Attorney, Agent, or Firm* — Slater Matsil, LLP

(57) ABSTRACT

An embodiment package includes a first fan-out tier having a first device die, a molding compound extending along sidewalls of the first device die, and a through intervia (TIV) extending through the molding compound. One or more first fan-out redistribution layers (RDLs) are disposed over the first fan-out tier and bonded to the first device die. A second fan-out tier having a second device die is disposed over the one or more first fan-out RDLs. The one or more first fan-out RDLs electrically connects the first and second device dies. The TIV electrically connects the one or more first fan-out RDLs to one or more second fan-out RDLs. The package further includes a plurality of external connectors at least partially disposed in the one or more second fan-out RDLs. The plurality of external connectors are further disposed on conductive features in the one or more second fan-out RDLs.

20 Claims, 57 Drawing Sheets

Related U.S. Application Data continuation of application No. 16/105,023, filed on Aug. 20, 2018, now Pat. No. 10,325,879, which is a continuation of application No. 15/464,011, filed on Mar. 20, 2017, now Pat. No. 10,056,351, which is a continuation of application No. 14/327,203, filed on Jul. 9, 2014, now Pat. No. 9,601,463.

(60) Provisional application No. 61/981,088, filed on Apr. 17, 2014.

(51) Int. Cl.
| | |
|---|---|
| H01L 21/683 | (2006.01) |
| H01L 21/768 | (2006.01) |
| H01L 23/00 | (2006.01) |
| H01L 23/31 | (2006.01) |
| H01L 25/00 | (2006.01) |
| H01L 25/10 | (2006.01) |
| H01L 23/36 | (2006.01) |
| H01L 23/498 | (2006.01) |
| H01L 23/538 | (2006.01) |

(52) U.S. Cl.
CPC .... *H01L 21/6835* (2013.01); *H01L 21/76885* (2013.01); *H01L 23/3128* (2013.01); *H01L 24/19* (2013.01); *H01L 24/20* (2013.01); *H01L 24/97* (2013.01); *H01L 25/0655* (2013.01); *H01L 25/0657* (2013.01); *H01L 25/105* (2013.01); *H01L 25/50* (2013.01); *H01L 23/36* (2013.01); *H01L 23/49827* (2013.01); *H01L 23/5389* (2013.01); *H01L 24/16* (2013.01); *H01L 24/17* (2013.01); *H01L 24/94* (2013.01); *H01L 2221/68345* (2013.01); *H01L 2221/68359* (2013.01); *H01L 2224/0231* (2013.01); *H01L 2224/02372* (2013.01); *H01L 2224/02379* (2013.01); *H01L 2224/0401* (2013.01); *H01L 2224/04105* (2013.01); *H01L 2224/05124* (2013.01); *H01L 2224/05147* (2013.01); *H01L 2224/12105* (2013.01); *H01L 2224/16145* (2013.01); *H01L 2224/16227* (2013.01); *H01L 2224/1703* (2013.01); *H01L 2224/32145* (2013.01); *H01L 2224/32225* (2013.01); *H01L 2224/32245* (2013.01); *H01L 2224/73204* (2013.01); *H01L 2224/73253* (2013.01); *H01L 2224/73267* (2013.01); *H01L 2224/81005* (2013.01); *H01L 2224/82005* (2013.01); *H01L 2224/83005* (2013.01); *H01L 2224/83191* (2013.01); *H01L 2224/8385* (2013.01); *H01L 2224/92225* (2013.01); *H01L 2224/92244* (2013.01); *H01L 2224/97* (2013.01); *H01L 2225/06517* (2013.01); *H01L 2225/06527* (2013.01); *H01L 2225/06548* (2013.01); *H01L 2225/06572* (2013.01); *H01L 2225/06586* (2013.01); *H01L 2225/06589* (2013.01); *H01L 2225/1035* (2013.01); *H01L 2225/1041* (2013.01); *H01L 2225/1058* (2013.01); *H01L 2924/01013* (2013.01); *H01L 2924/01029* (2013.01); *H01L 2924/01074* (2013.01); *H01L 2924/1431* (2013.01); *H01L 2924/1436* (2013.01); *H01L 2924/1437* (2013.01); *H01L 2924/1438* (2013.01); *H01L 2924/15311* (2013.01); *H01L 2924/18161* (2013.01); *H01L 2924/18162* (2013.01)

(58) Field of Classification Search
CPC ..... H01L 25/50; H01L 23/3107; H01L 24/33; H01L 24/83; H01L 21/565; H01L 21/76877; H01L 21/76802; H01L 2225/06548; H01L 2225/06589; H01L 2224/02379; H01L 2224/02372; H01L 2224/0231; H01L 2225/06541; H01L 2224/8385; H01L 2224/32145; H01L 25/112

See application file for complete search history.

(56) References Cited

U.S. PATENT DOCUMENTS

| | | |
|---|---|---|
| 2003/0017647 A1 | 1/2003 | Kwon et al. |
| 2006/0103014 A1 | 5/2006 | Huang et al. |
| 2008/0174008 A1 | 7/2008 | Yang et al. |
| 2010/0133704 A1 | 6/2010 | Marimuthu et al. |
| 2010/0140779 A1 | 6/2010 | Lin et al. |
| 2010/0246141 A1* | 9/2010 | Leung .................. H01L 24/82 |
| | | 156/245 |
| 2011/0068427 A1 | 3/2011 | Paek et al. |
| 2012/0104606 A1 | 5/2012 | Okuda et al. |
| 2013/0037950 A1* | 2/2013 | Yu .................. H01L 23/5226 |
| | | 257/E23.021 |
| 2013/0087897 A1 | 4/2013 | Pagaila et al. |
| 2013/0344653 A1 | 12/2013 | Sabatini et al. |
| 2014/0015131 A1 | 1/2014 | Meyer et al. |
| 2014/0353848 A1* | 12/2014 | Park .................. H01L 23/36 |
| | | 428/354 |

\* cited by examiner

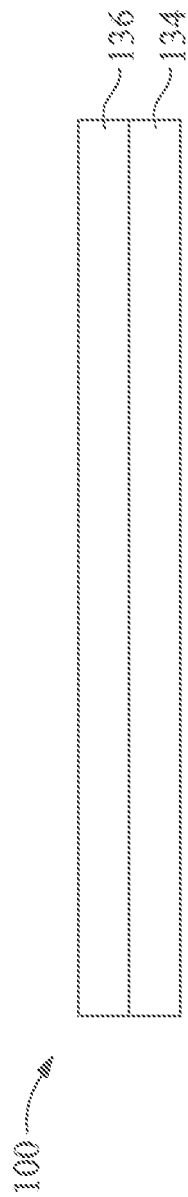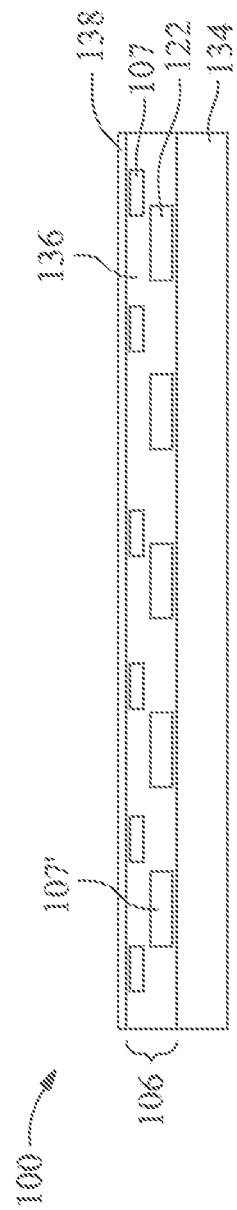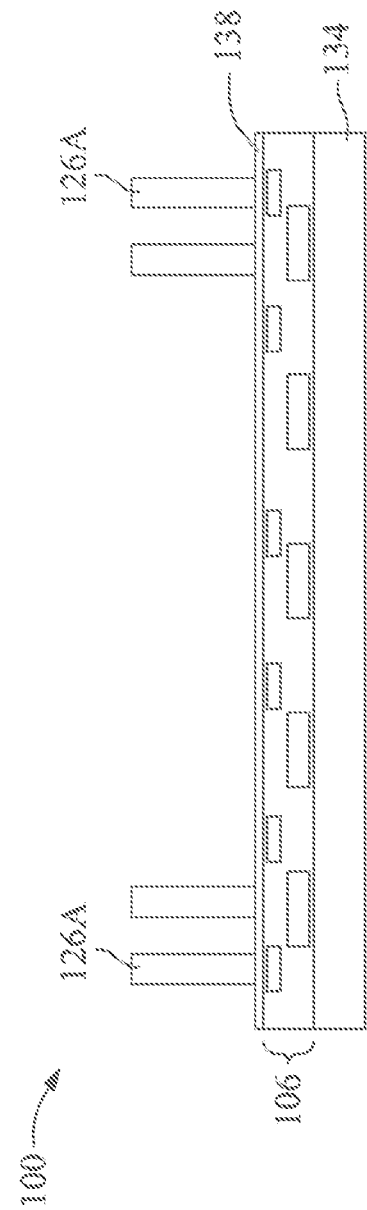

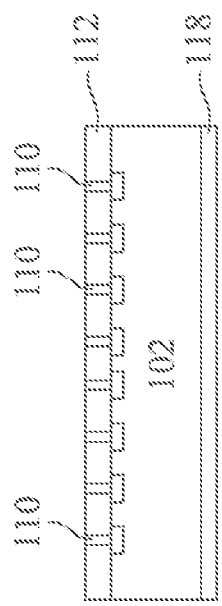
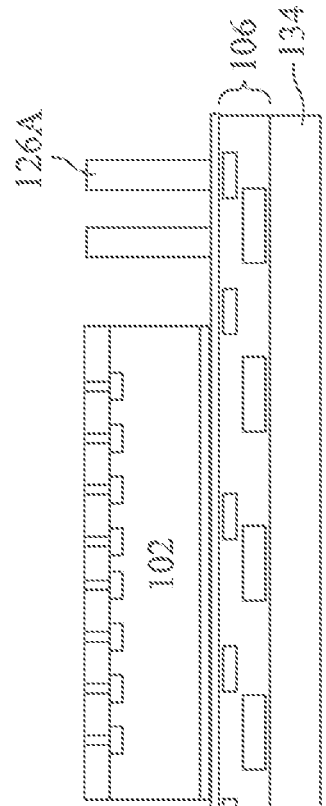
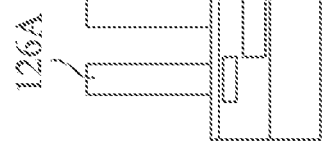
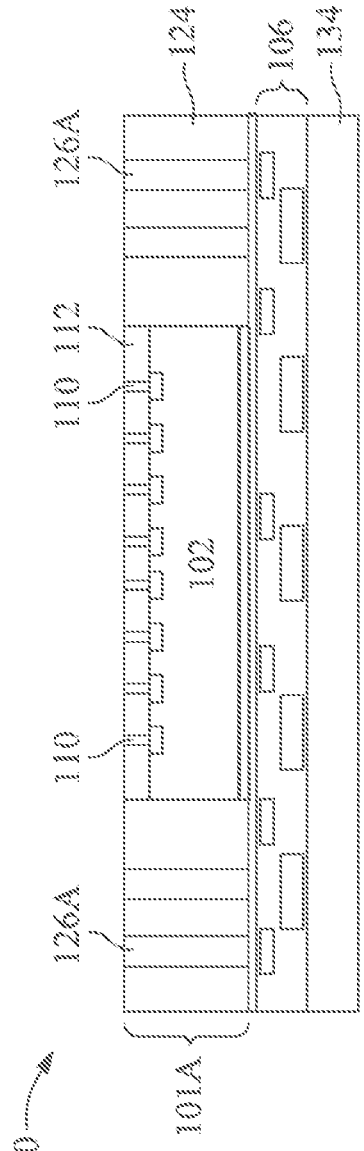

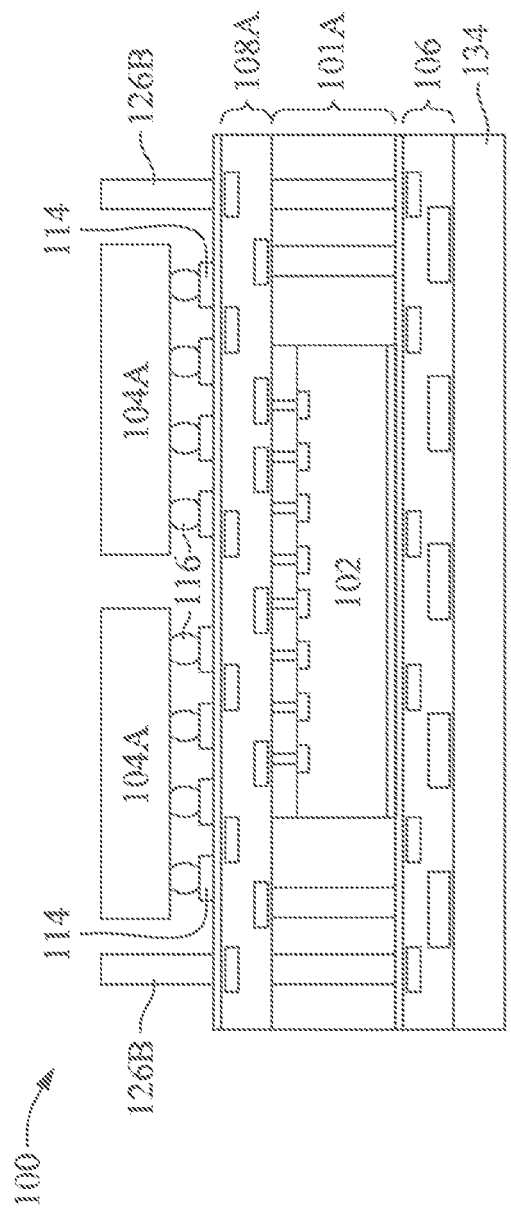
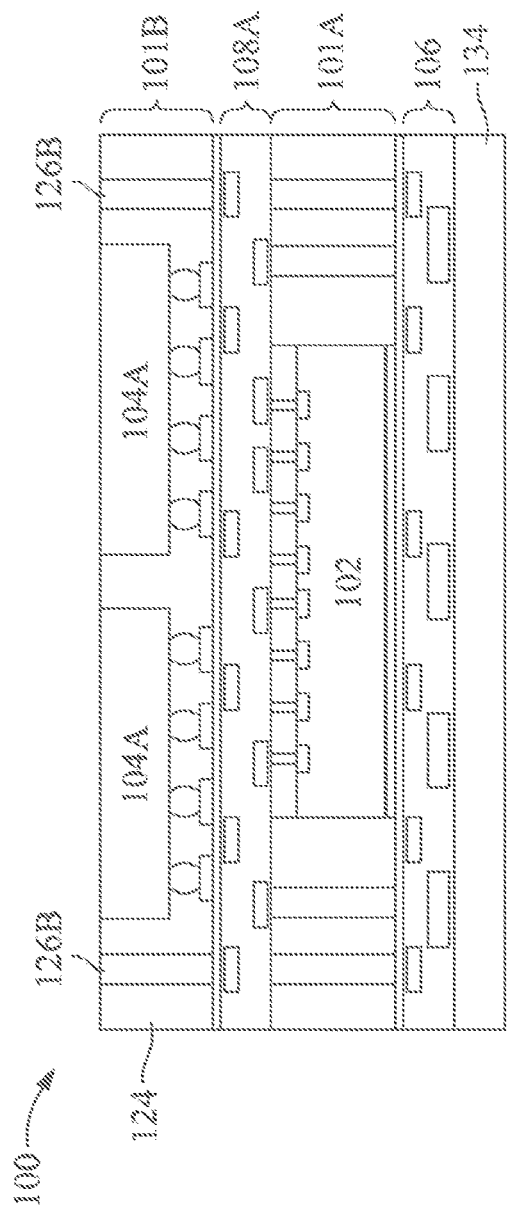

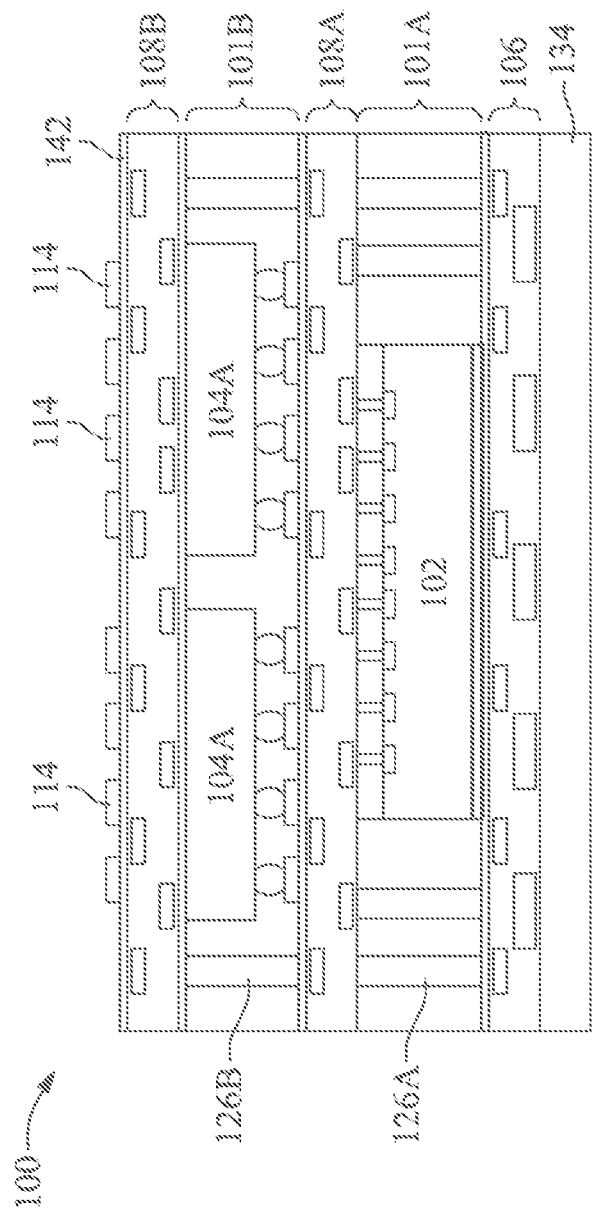

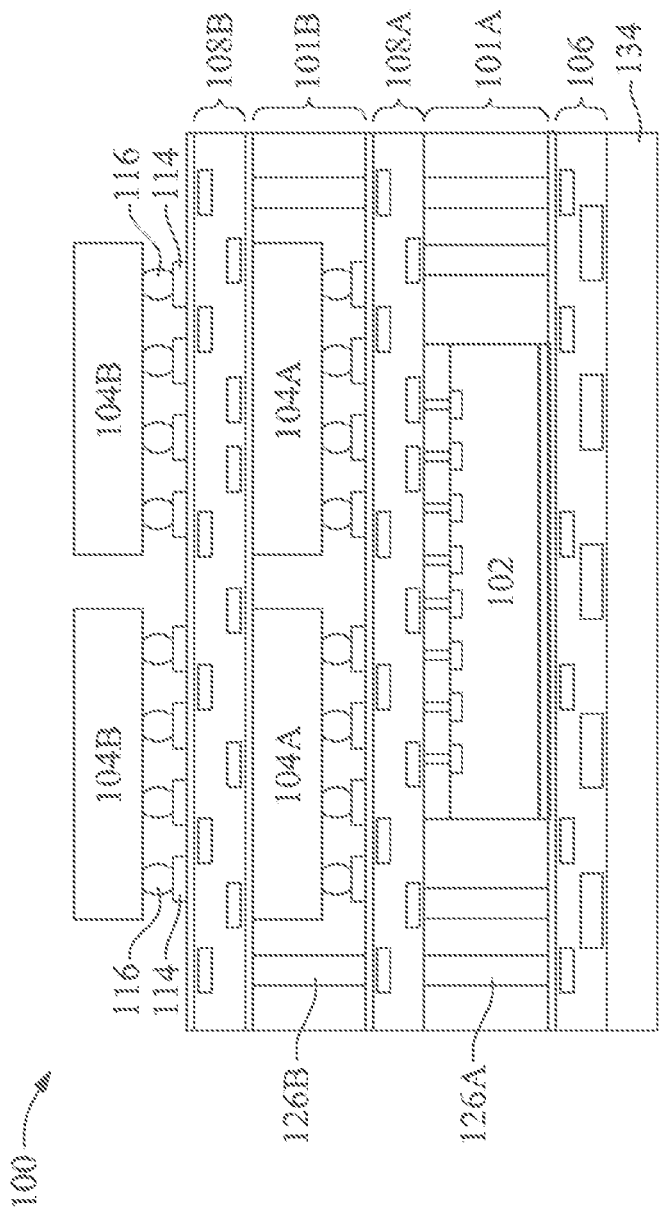

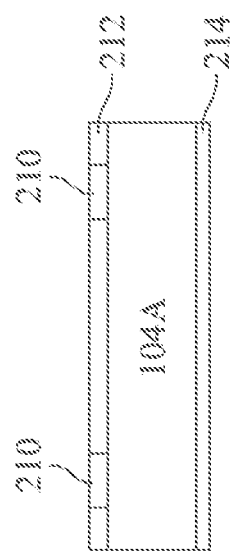
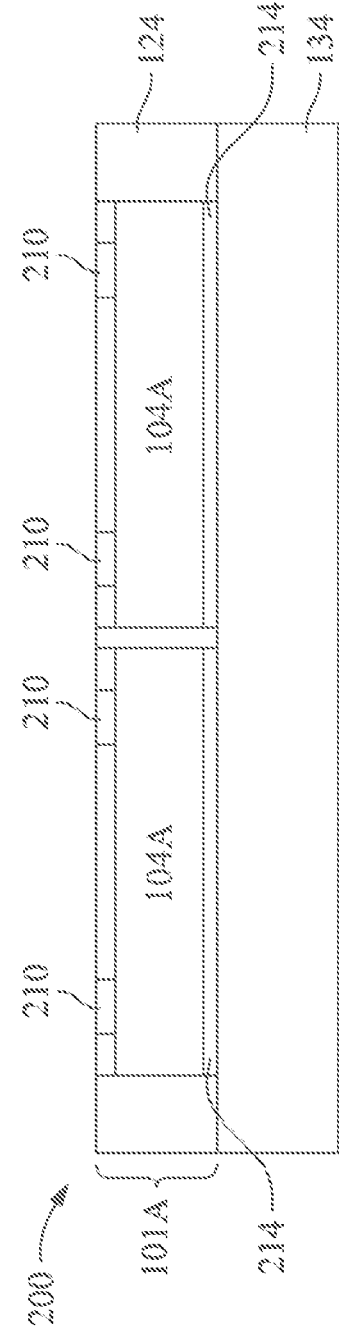
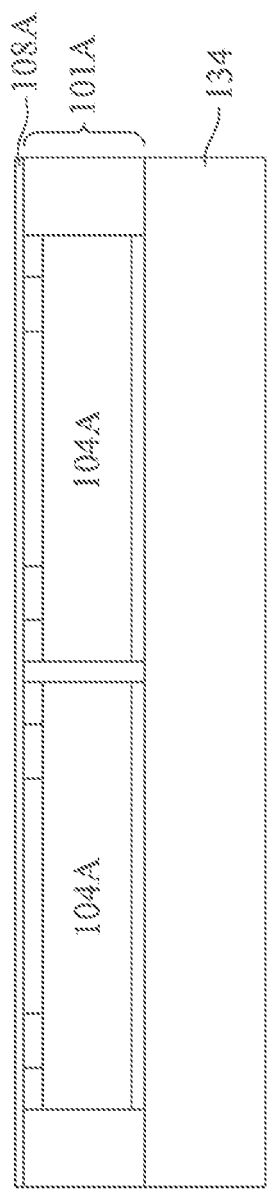
Fig. 4A
Fig. 4B
Fig. 4C

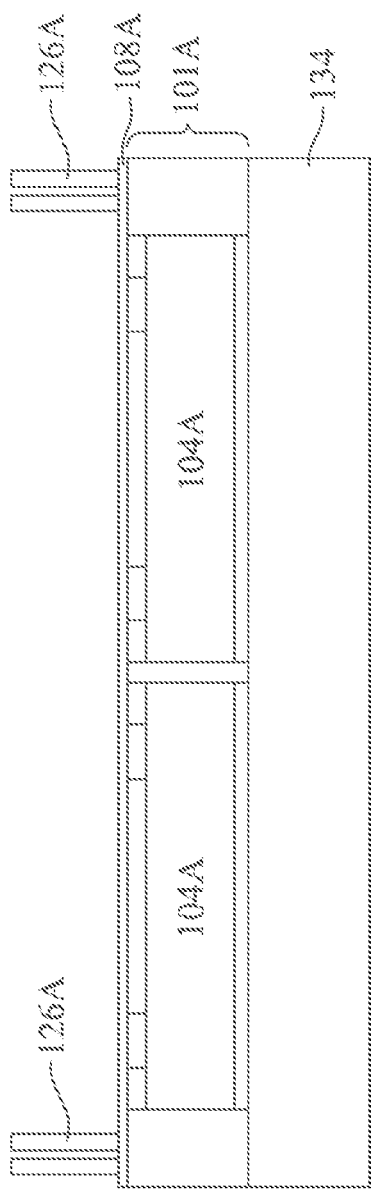
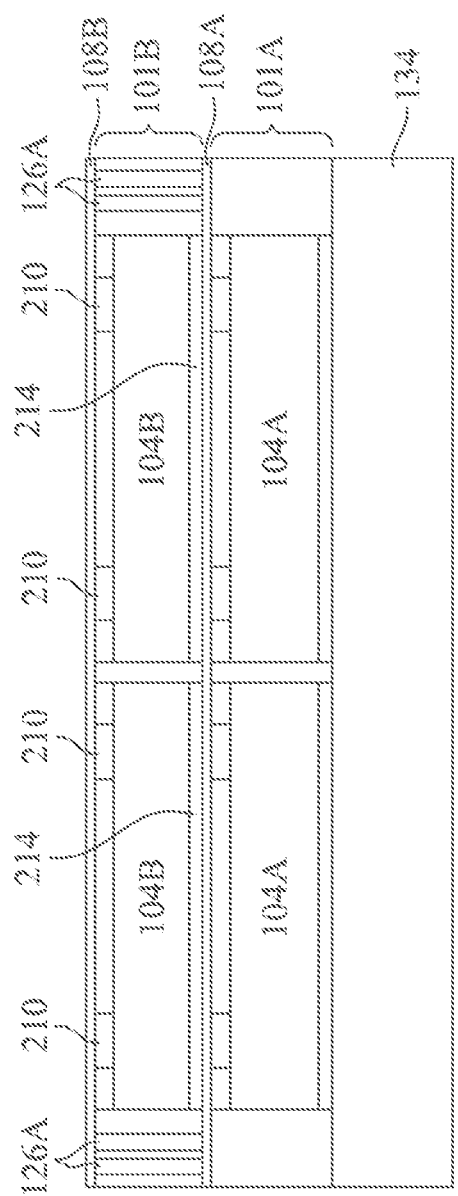

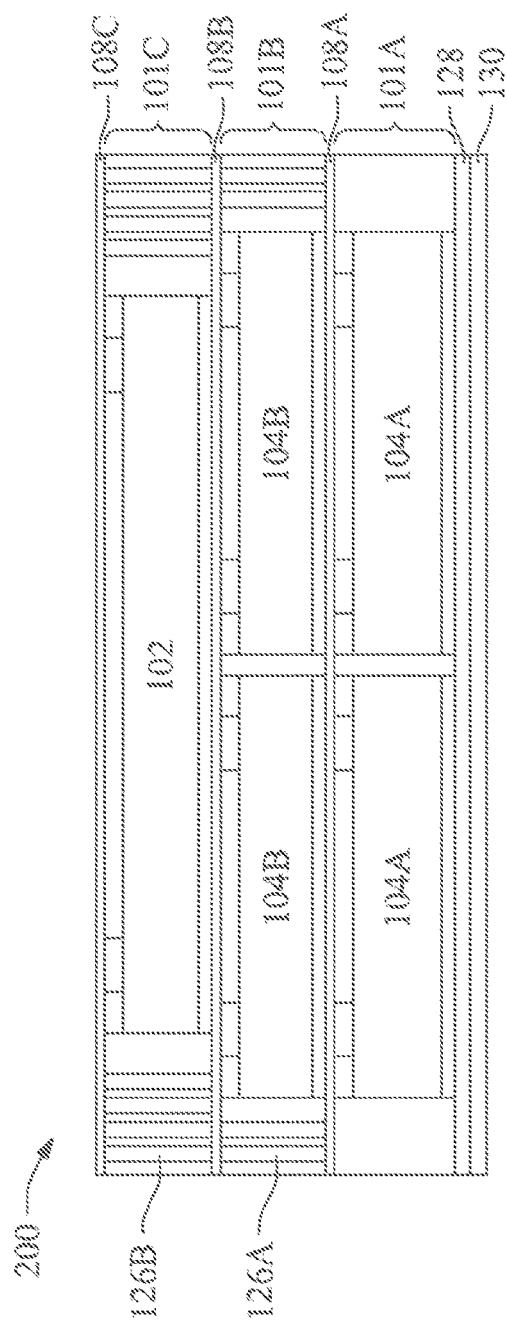
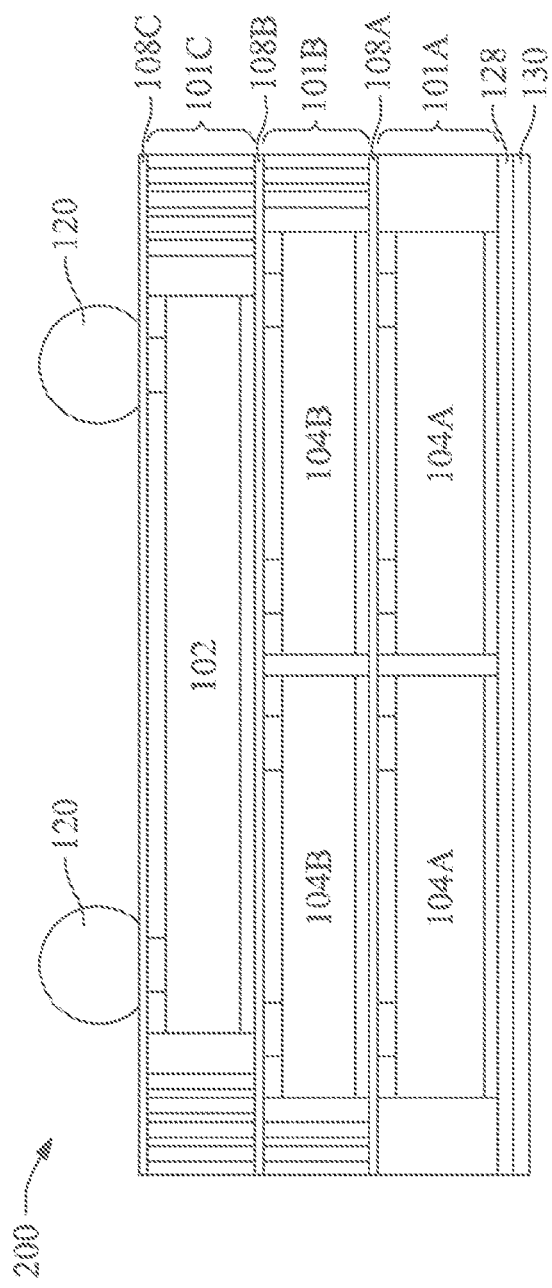

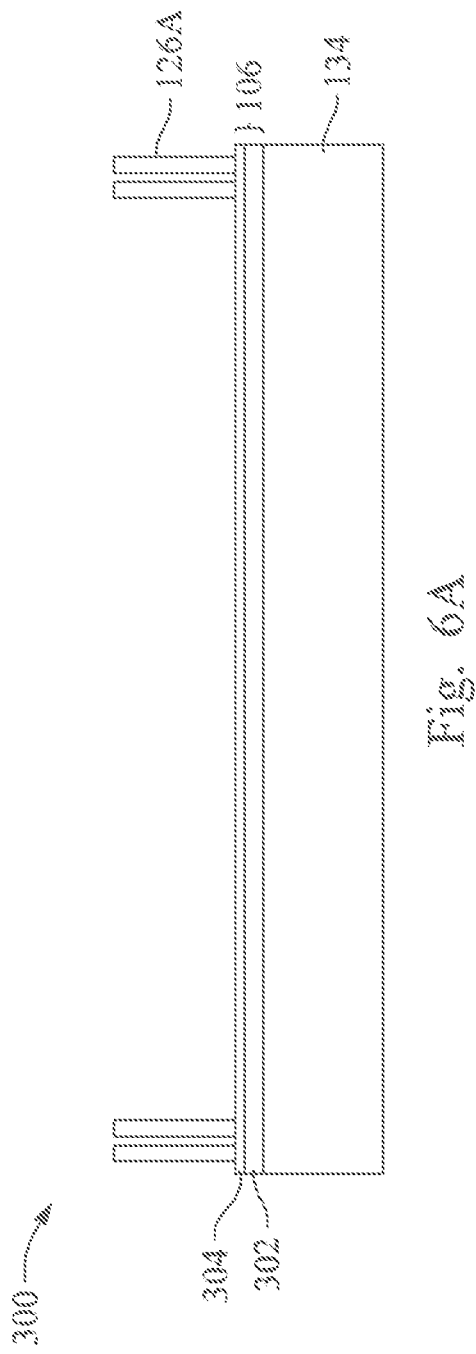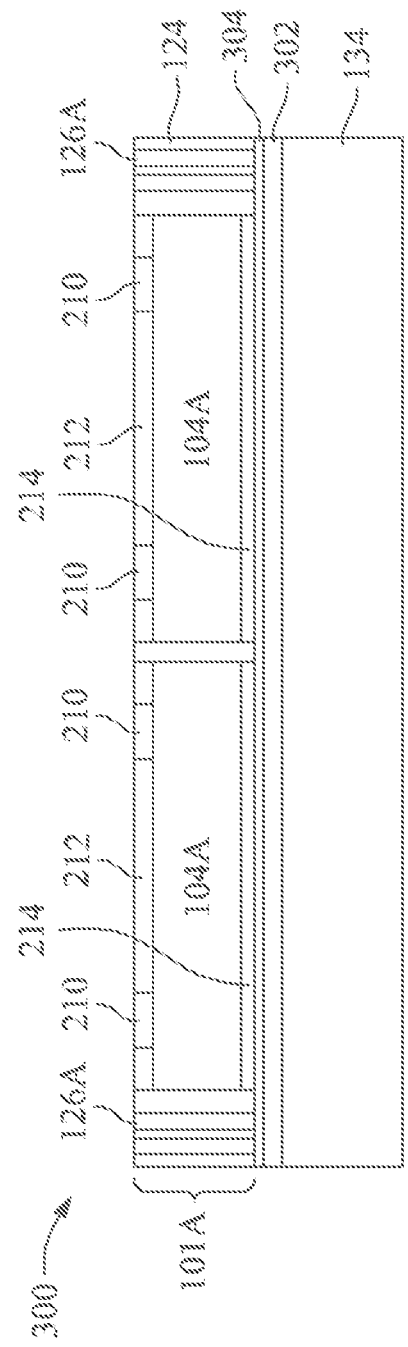

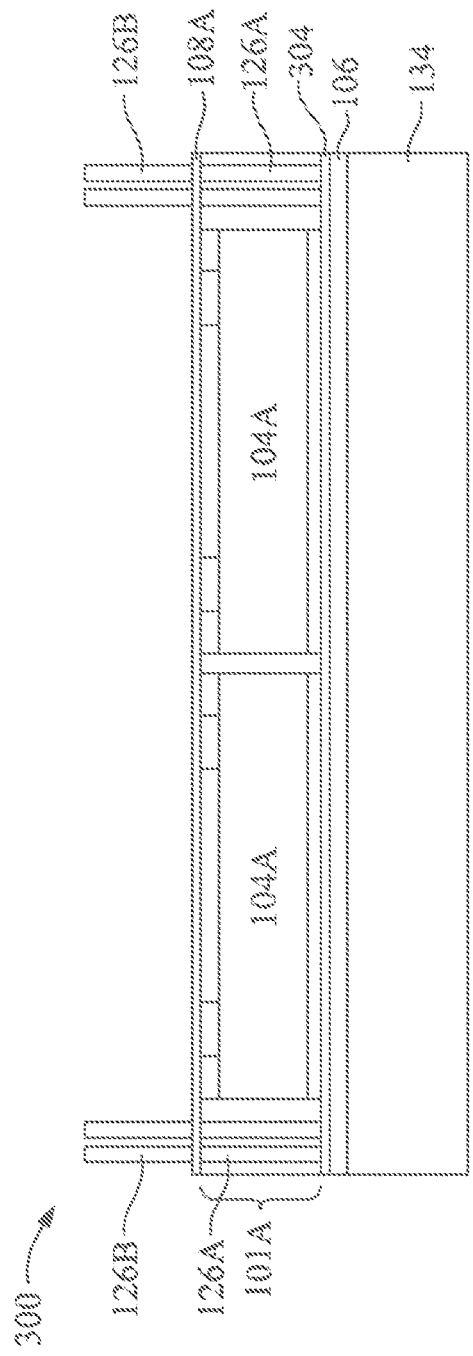
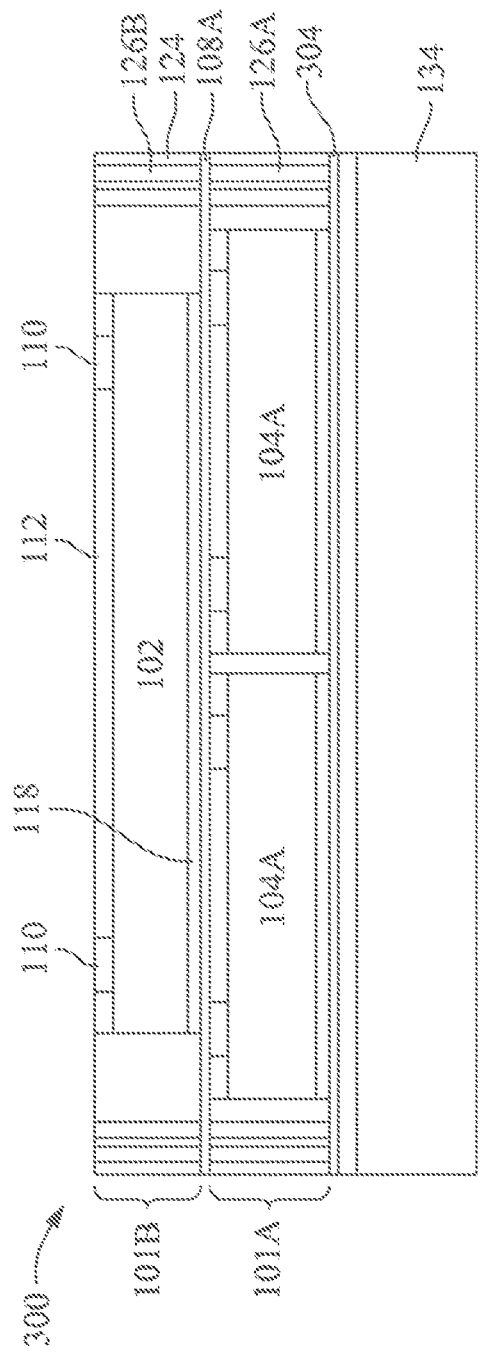

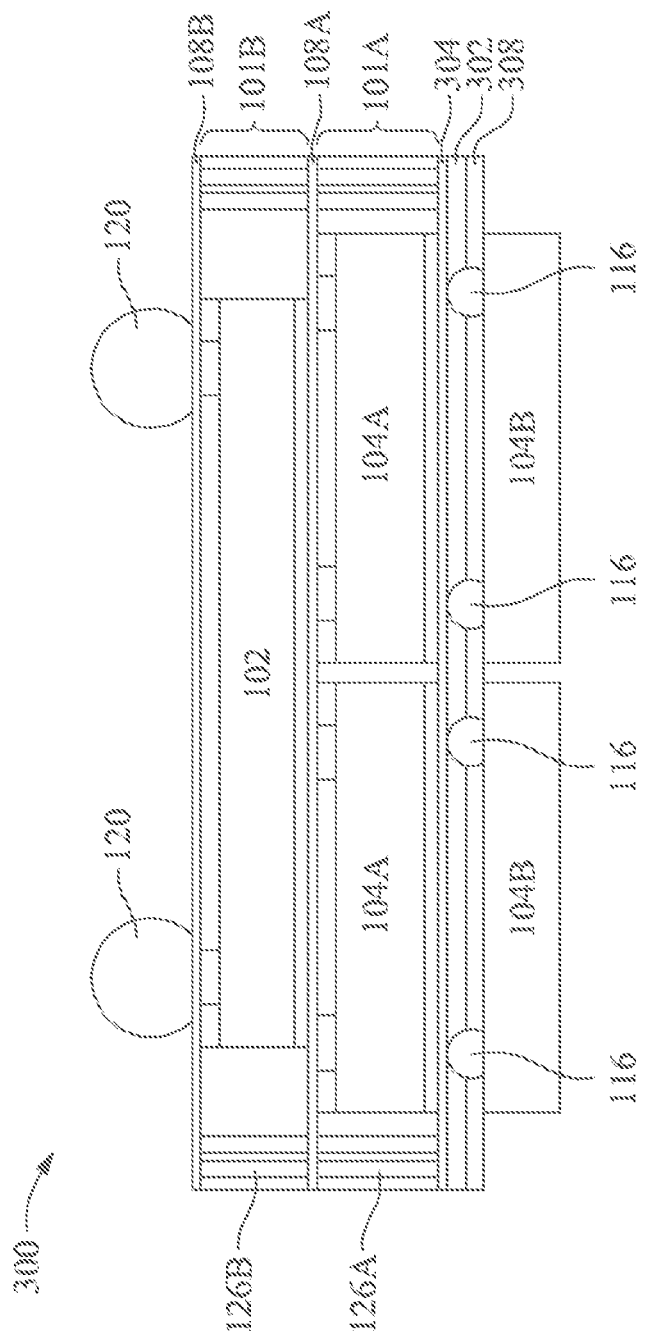

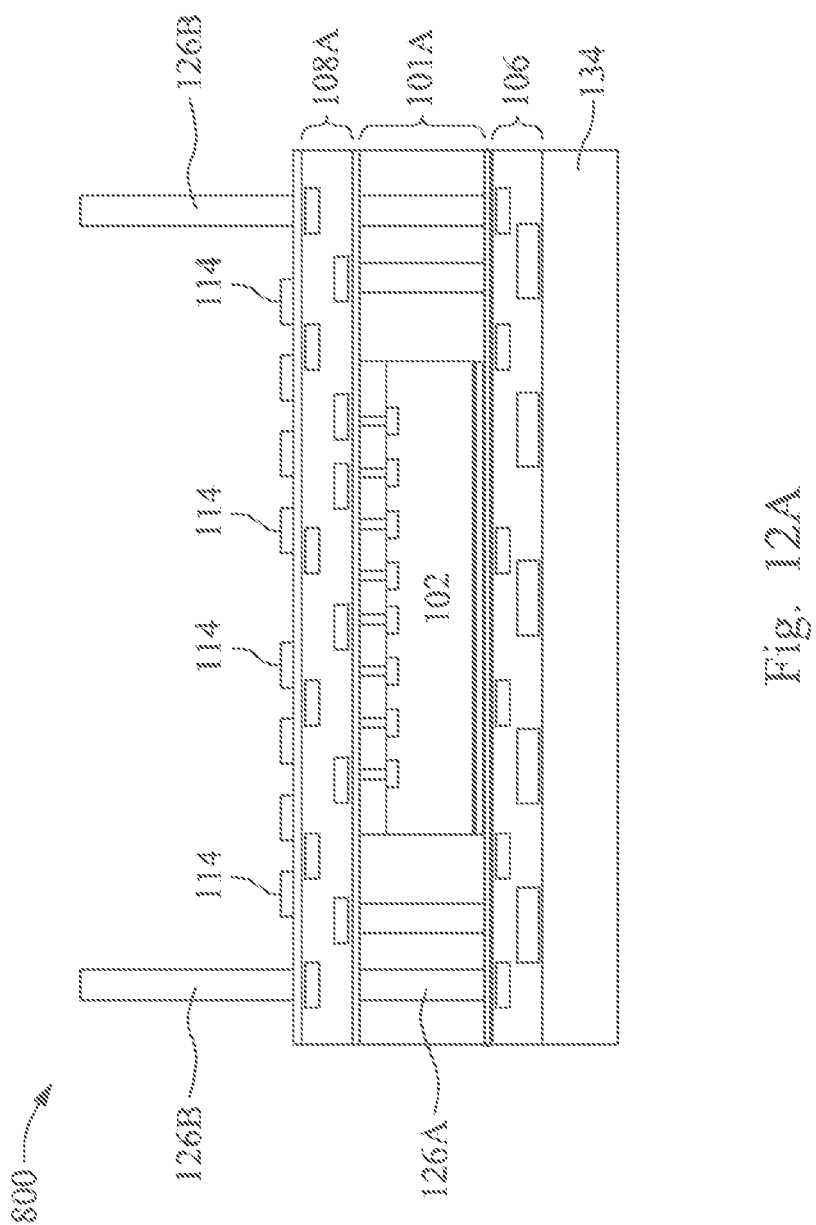

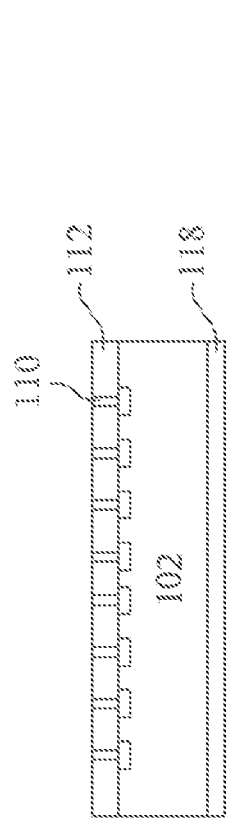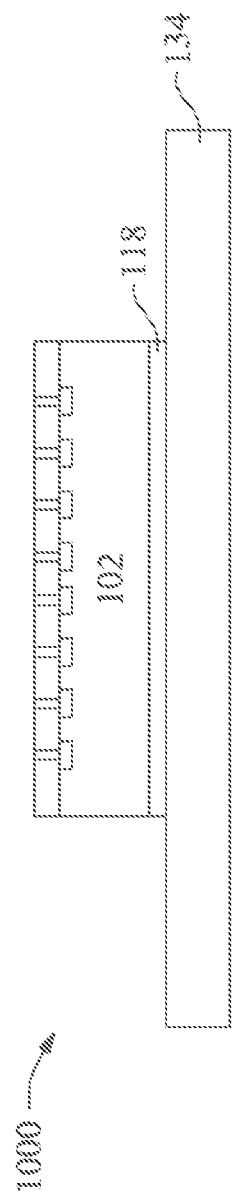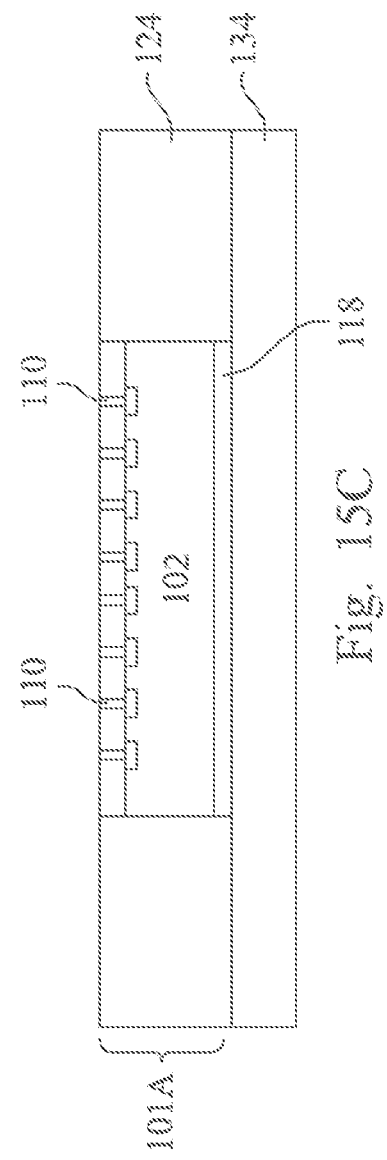

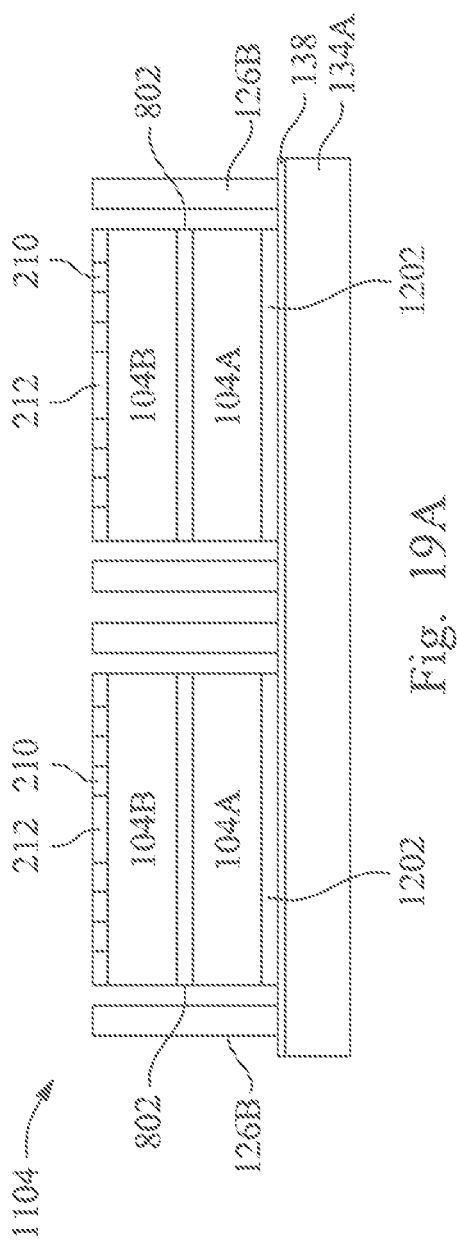
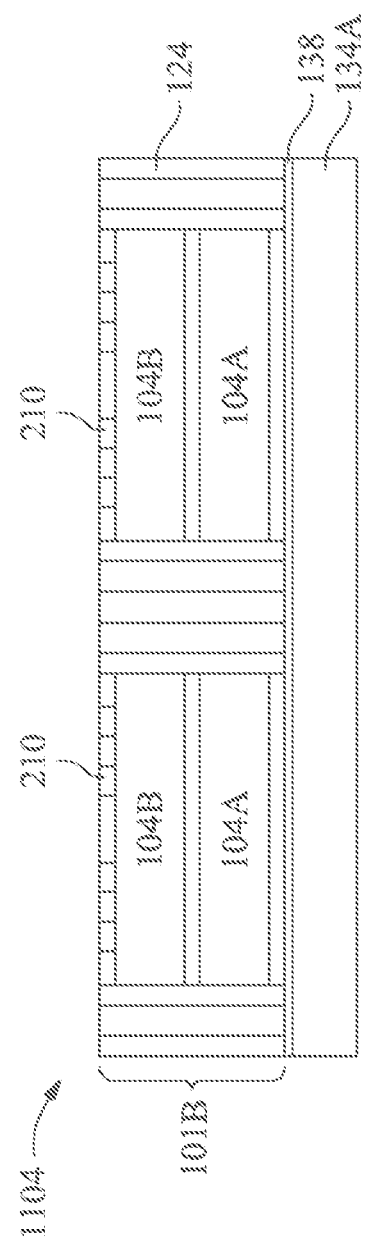
Fig. 19A
Fig. 19B

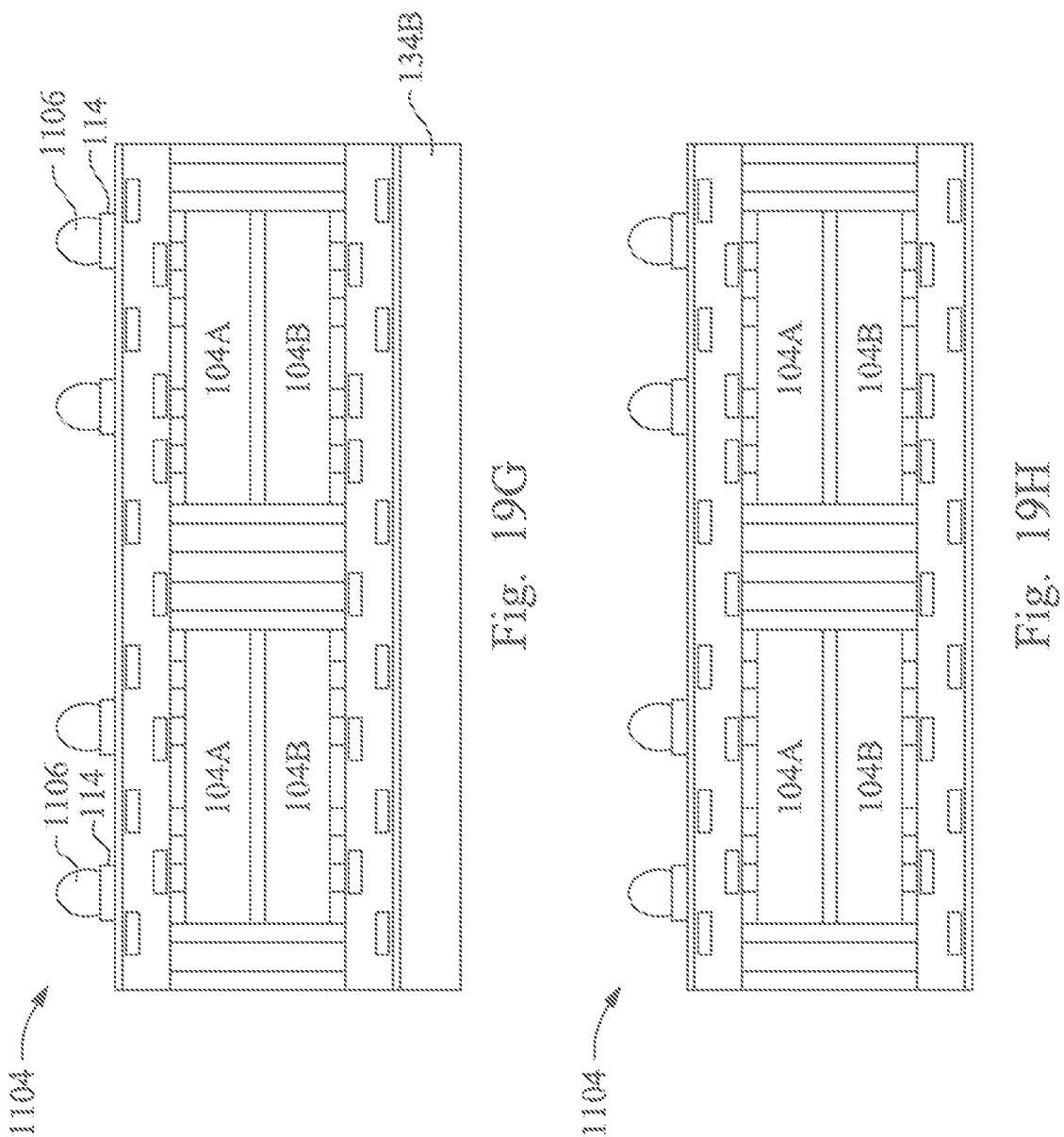

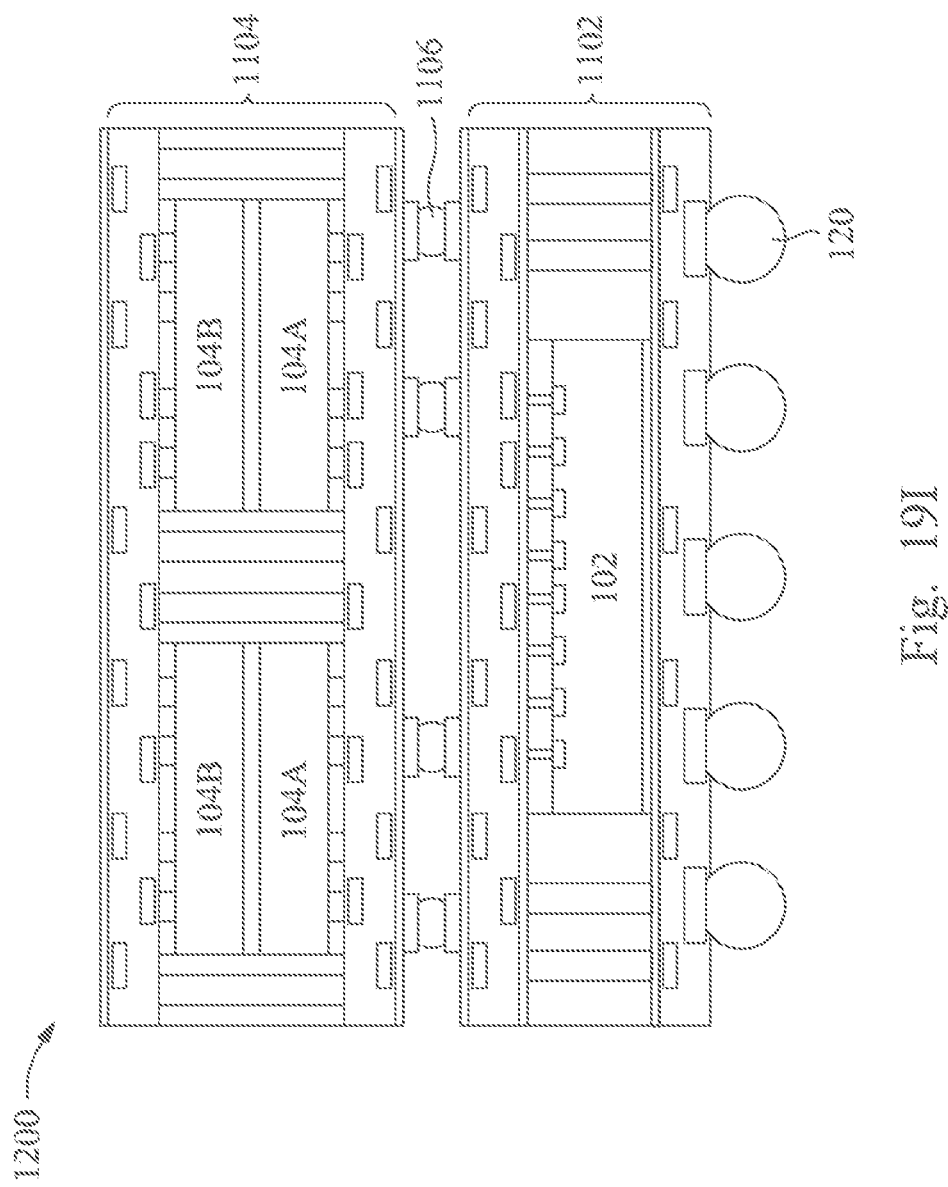

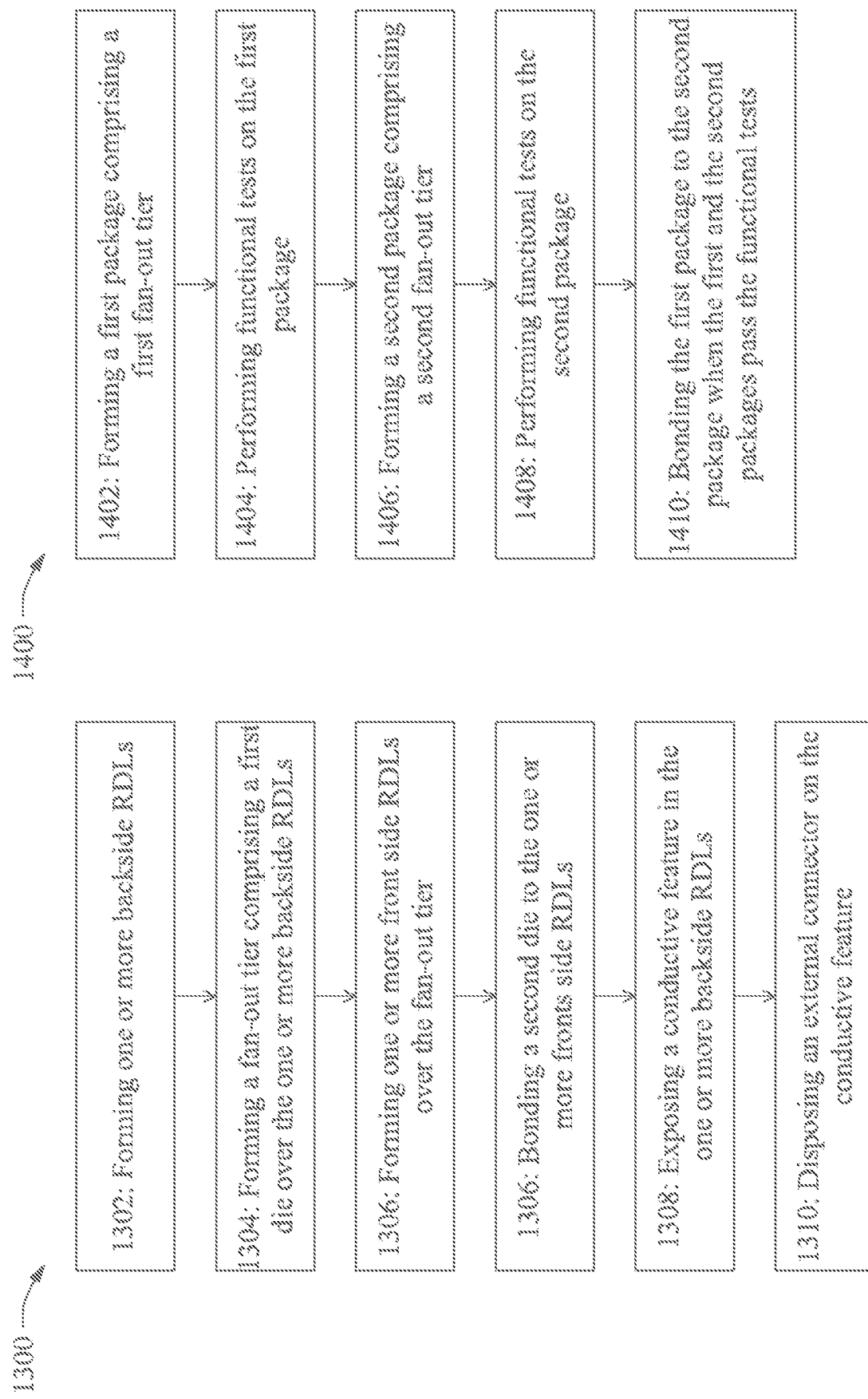

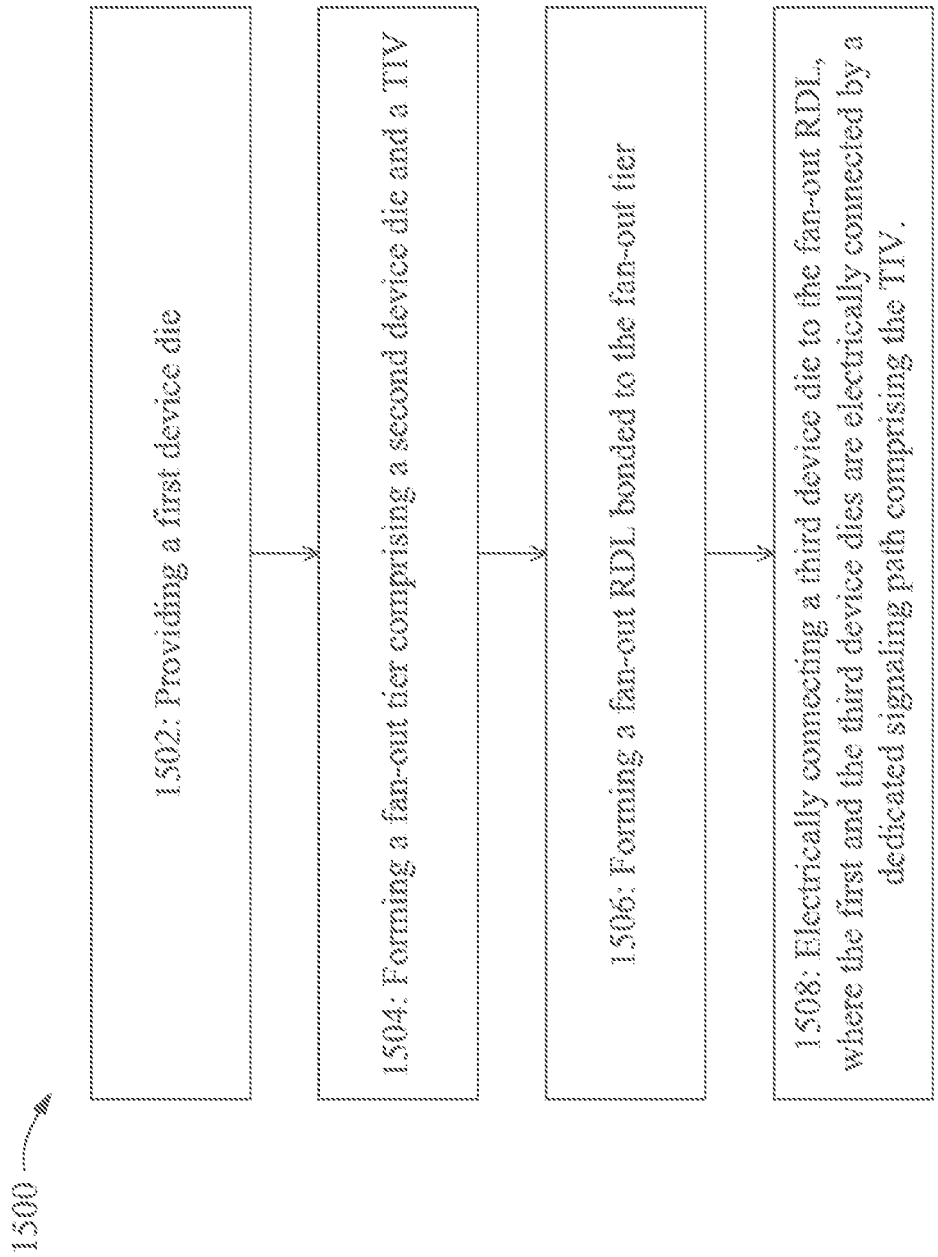

SEMICONDUCTOR PACKAGE HAVING A THROUGH INTERVIA THROUGH THE MOLDING COMPOUND AND FAN-OUT REDISTRIBUTION LAYERS DISPOSED OVER THE RESPECTIVE DIE OF THE STACKED FAN-OUT SYSTEM-IN-PACKAGE

PRIORITY CLAIM AND CROSS-REFERENCE

This application is a continuation of U.S. application Ser. No. 16/442,873, filed on Jun. 17, 2019, now U.S. Pat. No. 11,637,084, issued Apr. 25, 2023, entitled "Semiconductor Package Having a Through Intervia Through the Molding Compound and Fan-Out Redistribution Layers Disposed over the Respective Die of the Stacked Fan-Out System-in-Package," which is a continuation of U.S. application Ser. No. 16/105,023, filed on Aug. 20, 2018, now U.S. Pat. No. 10,325,879, issued Jun. 18, 2019, entitled "Fan-Out Stacked System in Package (SIP) and the Methods of Making the Same," which is a continuation of U.S. application Ser. No. 15/464,011, filed on Mar. 20, 2017, now U.S. Pat. No. 10,056,351, issued Aug. 21, 2018, entitled "Fan-Out Stacked System in Package (SIP) and the Methods of Making the Same," which is a continuation of U.S. application Ser. No. 14/327,203, filed on Jul. 9, 2014, now U.S. Pat. No. 9,601,463, issued Mar. 21, 2017, entitled "Fan-Out Stacked System in Package (SIP) and the Methods of Making the Same," which claims the benefit of U.S. Provisional Application No. 61/981,088, filed on Apr. 17, 2014, entitled "Fan-out Stacked System in Packages (SiP) and Methods of Making the Same," which applications are hereby incorporated herein by reference.

BACKGROUND 3D package applications such as package-on-package (PoP) are becoming increasingly popular and widely used in mobile devices because they can enhance electrical performance by integrating logic chips (e.g., application processors (APs)), high capacity/bandwidth memory chips (e.g., wide input/out (WIO) chips, low power double data rate X (LPDDR$_x$) chips, and the like), and/or other heterogeneous chips (e.g., sensors, micro-electro-mechanicals (MEMs), networking devices, and the like), for instance. However, existing PoP devices and packaging structures are challenged to meet fine channels and high density routing requirements of next-generation applications. For example, the wire bonding of a typical LPDDR$_x$, TSVs in AP/WIO chips, and the like impose various disadvantages on the package, such as increased manufacturing cost, large package thickness, and silicon access penalties. Improved devices and methods of manufacturing the same are required.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 4A through 4I illustrate various intermediary steps of manufacturing the second device package in accordance with some embodiments.

FIG. 6A through 6G illustrate various intermediary steps of manufacturing the third device package in accordance with some embodiments.

FIGS. 12A through 12F illustrate various intermediary steps of manufacturing the seventh device package with heat dissipation features in accordance with some embodiments.

FIG. 15A through 15K illustrate various intermediary steps of manufacturing the eighth device package in accordance with some embodiments.

FIG. 19A through 19I illustrate various intermediary steps of manufacturing the tenth device package in accordance with some embodiments.

FIG. 21 illustrates a process flow for forming a device package in a package on package configuration (PoP) in accordance with some other embodiments.

FIG. 22 illustrates a process flow for forming a device package with electrically isolated chips in accordance with some other embodiments.

DETAILED DESCRIPTION

Figure 1A:
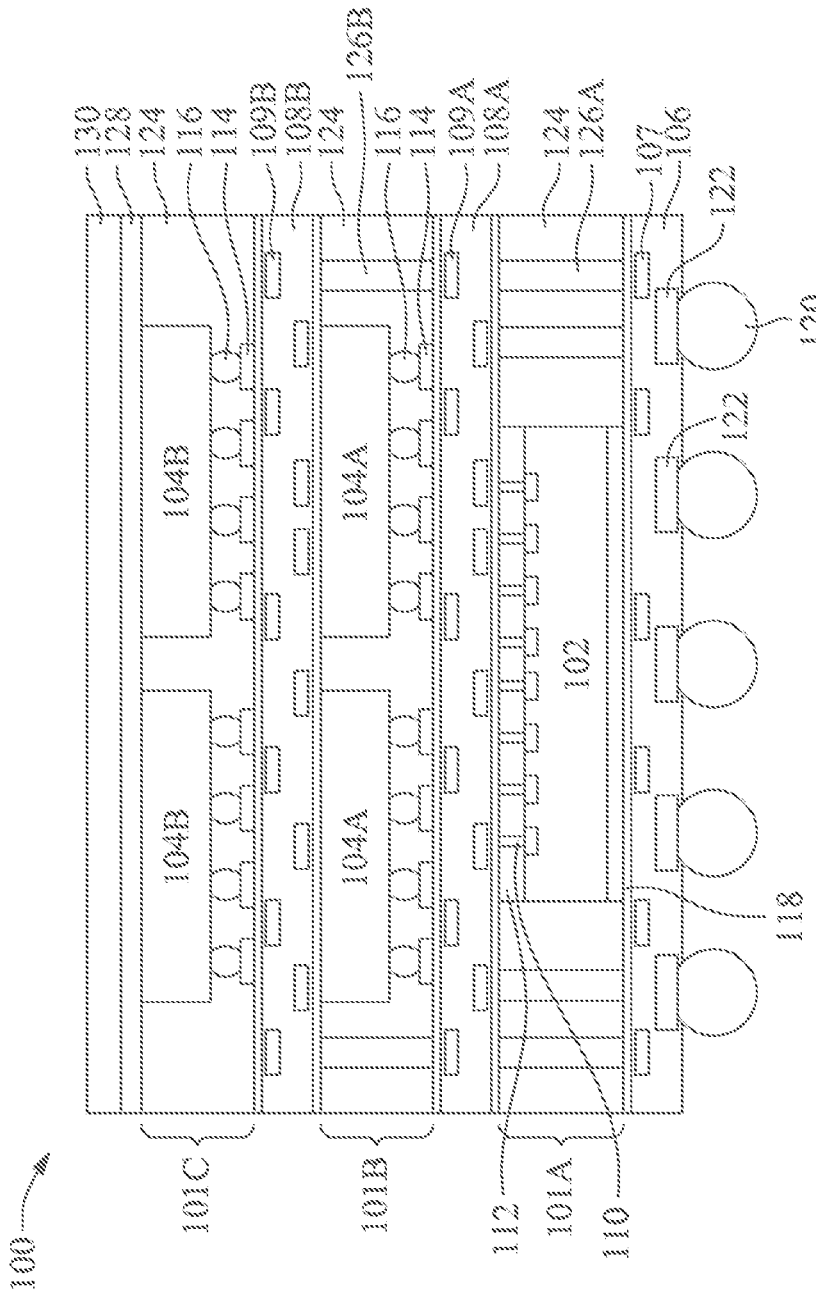
FIGS. 1A and 1B illustrate cross-sectional views of a first device package in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Before addressing the illustrated embodiments specifically, certain advantageous features and aspects of the present disclosed embodiments will be addressed generally in the subsequent paragraphs.

In some aspects, various example embodiments may enable an extremely thin package profile integrating memory (e.g., $LPDDR_x$/WIO) and logic chips, for example. Improved memory capacity and bandwidth may be achieved in thin-profiled stacked fan-out packages. Embodiments may use through-intervias (TIVs) as an option for electrical routing in lieu of or in addition to through silicon vias (TSVs), thus reducing silicon asset penalty and manufacturing cost. Embodiments may also provide better thermal performance in stacked system in package (SiP) and lower RLC parasitic effects.

Features that may be apparent from review of the example embodiments may include but are not limited to any combination of the following. In some embodiments, various device chips are integrated in a fan-out SiP. Various chips may be disposed in stacked fan-out tiers, and RDLs between each tier provide electrical connection between the chips and/or external connectors. For example, a core logic chip (e.g., an application processor (AP), system on chip (SoC), and the like) communicates with chips in other fan-out tiers through TIVs (disposed in each fan-out tier) and RDLs (disposed over and/or under each tier) of the package. TSVs may also be optionally employed in the chips for further electrical connection. Embodiments may include a logic-first and/or logic-last configuration with fan-out stacked SiP and/or package on package (PoP) structures. Each fan-out tier of the device package may include one or more of: low power-double data rate X ($LPDDR_x$), wide input/output (WIO) memory, NAND flash, SRAM catch, and the like memory chips. Other types of chips, such as, logic, analog, sensor, networking, micro-electro-mechanical (MEMS), and the like, may also be included. The number of chips in each fan-out tier may be greater than or equal to one. The integrated fan-out SiP may be used for various applications, such as, mobile computing, mobile health (e.g., heath monitoring), wearable electronics, internet of things (IoT), big data, and the like.

Turning now to the illustrated embodiments, FIG. 1A illustrates an example device package embodiment having stacked fan-out tiers. In the illustrated embodiment, package 100 includes three fan-out tiers 101 (labeled 101A, 101B, and 101C). Each fan-out tier 101 includes one or more device dies such as a core logic die 102 and other dies 104 (labeled 104A and 104B). Logic die 102 may be an AP, SoC, and the like, and logic die 102 may provide core control functionality in package 100. In some embodiments, core logic die 102 may be a die in the device package that consumes the most power (e.g., the most heat generating die), provides core logic functions, and the like. Dies 104 may be any type of integrated circuit, such as a memory die (e.g., $LPDDR_x$, WIO, NAND flash, and the like), analog circuit, digital circuit, mixed signal, sensor die, micro-electro-mechanical (MEMS) die, networking die, and the like. Front side (FS) fan-out redistribution layers (RDLs) 108A and 108B are disposed between each tier 101, and backside (BS) RDLs 106 may be disposed on a backside of first fan-out tier 101. RDLs 106/108 may include various conductive features 107/109 (e.g., conductive lines and vias), respectively, formed between dielectric (e.g., polymer) layers.

Die 102 in a first fan-out tier 101A may be electrically connected and bonded to first FS RDLs 108A using pillar bumps 110, which may be disposed over and electrically connected to contact pads of die 102. Die 102 may include a substrate, active devices, and an interconnect structure (not shown). The substrate may be a bulk silicon substrate although other semiconductor materials including group III, group IV, and group V elements may also be used. Alternatively, the substrate may be a silicon-on-insulator substrate, a germanium-on-insulator substrate, and the like. Active devices such as transistors may be formed at the top surface of the substrate. An interconnect structure may be formed over the active devices and a front side of the substrate. The term "face" or "front" surface or side is a term used herein implying the major surface of the device upon which active devices and interconnect layers are formed. Likewise, the "back" surface of a die is that major surface opposite to the face or front.

The interconnect structure may include inter-layer dielectric (ILD) and/or inter-metal dielectric (IMD) layers containing conductive features (e.g., conductive lines and vias comprising copper, aluminum, tungsten, combinations thereof, and the like) formed using any suitable method. The ILD and IMDs may include low-k dielectric materials having k values, for example, lower than about 4.0 or even 2.8 disposed between such conductive features. In some embodiments, the ILD and IMDs may be made of, for example, silicon oxide, SiCOH, and the like. The interconnect structure electrically connects various active devices to form functional circuits within die 102, such as logic control circuits.

Input/output (I/O) and passivation features may be formed over the interconnect structure. For example, contact pads may be formed over the interconnect structure and may be electrically connected to the active devices through the various conductive features in the interconnect structure. Contact pads may comprise a conductive material such as aluminum, copper, and the like. Furthermore, a passivation layer may be formed over the interconnect structure and the contact pads. In some embodiments, the passivation layer may be formed of materials such as silicon oxide, un-doped silicate glass, silicon oxynitride, and the like. Other suitable passivation materials may also be used. Portions of the passivation layer may cover edge portions of the contact pads.

Pillar bumps no may be disposed over contact pads, and a dielectric material 112 (e.g., a passivation layer) may be disposed between adjacent pillar bumps 110. In some embodiments, dielectric material 112 may comprise a polymer. Pillar bumps 110 may electrically connect die 102 to FS RDLs 108A.

Package 100 may further include under metallurgies (UBMs) 114 formed on an opposing side of FS RDLs 108A as die 102. Various connectors (e.g., microbumps, controlled collapse chip connector (C4) bumps, ball grid array (BGA) balls, and the like) on a front side of dies 104A may be bonded (e.g., flip chip bonded) to UBMs 114. Dies 104A may be disposed in a second fan-out tier 101B of package 100. In various embodiments, dies 104A may be substantially similar to dies 102 although dies 104A may include different functional circuits (e.g., memory, sensor, networking, and the like) than die 102 (e.g., logic). Thus, die 102 of tier 101A (e.g., a SoC die) and the dies 104 of tier 101B (e.g., memory dies, and the like) may be bonded to and electrically interconnected by FS RDLs 108A disposed between fan-out tiers 101A and 101B.

Additional FS RDLs may be used to bond additional fan-out tiers having additional dies to tiers 101A and 101B. For example, second FS RDLs 108B may be formed over tier 101B. FS RDLs 108B may or may not be electrically connected to dies 104A of tier 101B. UBMs 114 may be formed over FS RDLS 108B. Additional dies 104B may be bonded (e.g., flip chip bonded) to such UBMs 114 via connectors 116 disposed on a front side of dies 104B. Thus, dies 104B may be bonded and electrically connected to FS RDLs 108B.

Furthermore, backside (BS) RDLs 106 having conductive features 107 (e.g., conductive lines and/or vias) may be formed on a backside of tier 101A and die 102. As explained in greater detail in subsequent paragraphs, BS RDLs 106 may be used as a structural base for forming various fan-out tiers 101 in package 100. Die 102 may be attached to BS RDLs 106 by a glue layer (e.g., a die attach film (DAF) layer 118). Connectors 120 (e.g., BGA balls) may be disposed on BS RDLs 106, and the BS RDLs 106 may provide electrical connection to such connectors. For example, connectors 120 may be disposed on contact pads 122 formed as metal lines within BS RDLs 106. Connectors 120 may further bond package 100 to other package components such as other device dies, interposers, package substrates, printed circuit boards, a mother board, and the like.

Molding compounds 124 may be disposed around dies 102 and 104A/104B of fan-out tiers 101, and molding compounds 124 may provide structural support for the dies. TIVs 126A and 126B (also referred to as through-molding vias) may extend through molding compounds 124 and may help to electrically connect dies 104 to die 102 and/or connectors 120 by way of FS RDLs 108A/108B and/or BS RDLs 106.

Package 100 may also include additional features, such as heat dissipation features. For example, a thermal interface material (TIM) 128 and a heat dissipation lid 130 may be disposed over a top-most fan-out tier (e.g., tier 101C). TIM 128 may comprise, for example, a polymer having a good thermal conductivity, which may be between about 3 watts per meter kelvin (W/m·K) to about 5 W/m·K or more. Heat dissipation lid 130 may further have a high thermal conductivity, for example, between about 200 W/m·K to about 400 W/m·K or more, and may be formed using a metal, a metal alloy, grapheme, carbon nanotubes (CNT), and the like.

Figure 1B:
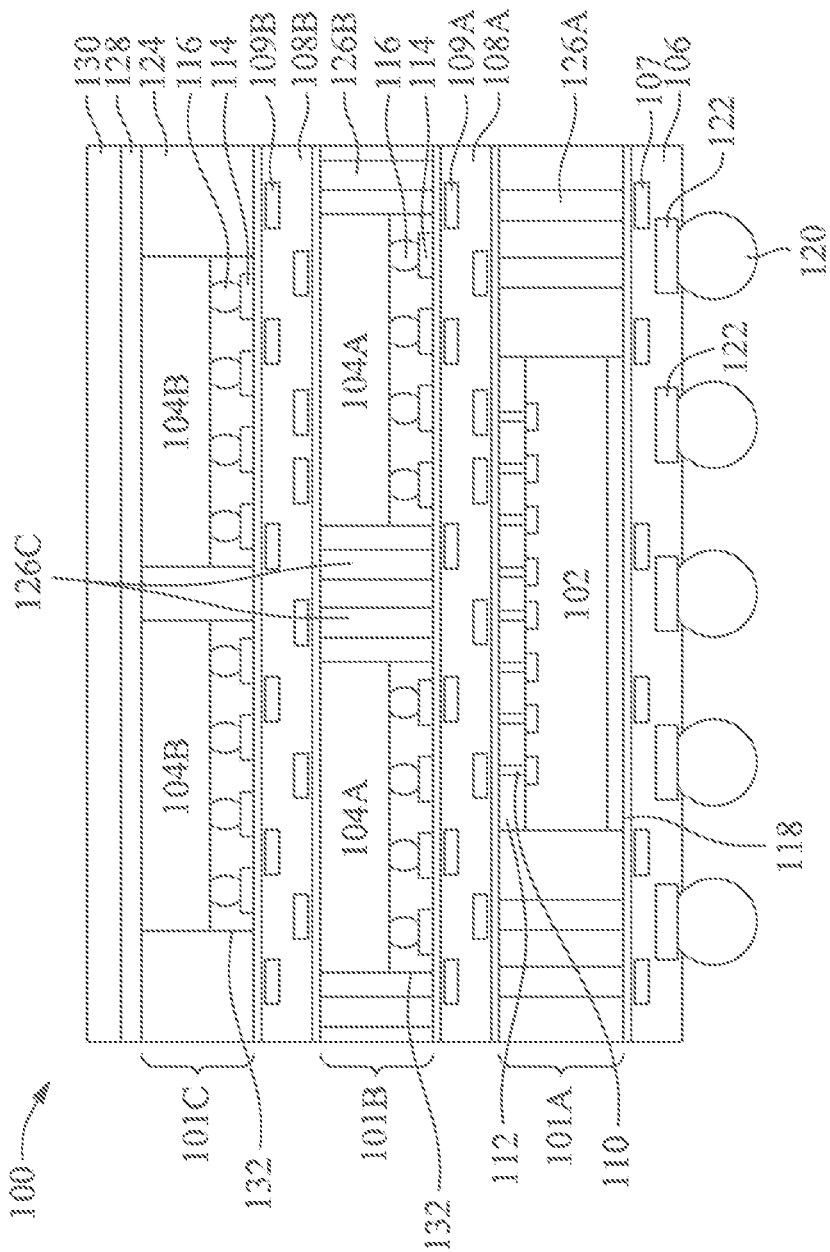

FIG. 1B illustrates a cross sectional view of an alternative configuration of package 100 in accordance with some embodiments. The embodiment illustrated in FIG. 1B is substantially similar to the embodiment illustrated in FIG. 1A where like reference numerals indicate like elements. However, in some embodiments, underfill 132 may optionally be disposed between connectors 116 of dies 104A/104B. Underfill 132 provides structural support for connectors 116, and underfill 132 may be dispensed using capillary force after connectors 116 are bonded to UBMs 114. In such embodiments, sidewalls of underfill 132 may comprise a fillet. Alternatively, underfill 132 may comprise a laminated non-conductive film (NCF) such as a polymer. Furthermore, in the embodiment illustrated by FIG. 1B, TIVs (e.g., TIVs 126C) may be disposed in a central area of a fan-out tier (e.g., tier 101B), such as between two adjacent dies (e.g., dies 104A). Other configurations of package 100 may also be used in alternative embodiments.

FIG. 2A through 2O illustrate various intermediary steps of manufacturing the device package 100 in accordance with some embodiments. In FIG. 2A, a dielectric material 136 is disposed on a carrier 134. Carrier 134 may be a glass or ceramic carrier and may provide temporary structural support during the formation of various features of package 100.

In FIG. 2B, various conductive features 107 may be formed in dielectric material 136 to form BS RDLs 106 over carrier 134. The backside RDLs may include one or more layers of dielectric material having conductive features 107 (e.g., conductive lines and vias) formed therein. Some conductive features (e.g., features 122) may be used as contact pads for various external connectors as will be discussed in greater detail in subsequent paragraphs. Such conductive features 122 may or may not have a larger physical dimension (e.g., a greater thickness) than other conductive lines in BS RDLs 106.

Dielectric material 136 may be formed of any suitable material (e.g., polyimide (PI), polybenzoxazole (PBO), BCB, epoxy, silicone, acrylates, nano-filled pheno resin, siloxane, a fluorinated polymer, polynorbornene, an oxide, a nitride, and the like) using any suitable method (e.g., a spin-on coating technique, sputtering, and the like). Conductive features 107 may be formed in dielectric material 136. The formation of conductive features 107 may include patterning dielectric material 136 (e.g., using photolithography and/or etching processes) and forming conductive features 107 in patterned dielectric layers 136 (e.g., by depositing a seed layer, using a mask layer to define the shape of the conductive features, and using an electroless/electrochemical plating process). Furthermore, a conductive seed layer 138 (e.g., comprising copper) may optionally be formed over BS RDLs 106.

Next, in FIG. 2C, TIVs 126A may be formed over BS RDLs 106 and conductive seed layer 138. TIVs 126A may comprise copper, for example, and may be formed by any suitable process. For example, a patterned photoresist (not shown) having openings may be used to define the shape of such TIVs. The openings may expose seed layer 138, and the openings may be filled with a conductive material (e.g., in an electroless plating process or electrochemical plating process). The plating process may uni-directionally fill openings (e.g., from seed layer 138 upwards) in the patterned photoresist. Uni-directional filling may allow for more uniform filling of such openings, particularly for high aspect ratio TIVs. Alternatively, a seed layer may be formed on sidewalls of openings in the patterned photoresist, and such openings may be filled multi-directionally. Subsequently, the photoresist may be removed in an ashing and/or wet strip process, leaving TIVs 126A over and electrically connected to BS RDLs 106. TIVs can also be formed using copper wire stud by copper wire bond processes (e.g., where mask, photoresist, and copper plating are not required).

In FIG. 2D, a die 102 is provided. In some embodiments, die 102 may provide logic functions and may be a SoC, AP, and the like. Die 102 may include an adhesive layer 118 (e.g., a DAF) disposed on a back surface. Pillars bumps 110 may be electrically connected to contact pads on a front side of die 102, and a dielectric layer 112 (e.g., a passivation layer) may be disposed between pillars bumps 110. Die 102 may be formed in a wafer (not shown) having multiple dies 102 and singulated along scribe lines. Next in FIG. 2E, die 102 may be mounted over BS RDLs 106 in an opening between TIVs 126A.

In FIG. 2F, a wafer level molding and molding grind back is performed. For example, molding compound 124 is dispensed to fill gaps between die 102 and TIVs 126A. Molding compound 124 may include any suitable material such as an epoxy resin, a molding underfill, and the like. Suitable methods for forming molding compound 124 may include compressive molding, transfer molding, liquid encapsulant molding, and the like. For example, molding compound 124 may be dispensed between die 102/TIVs 126A in liquid form. Subsequently, a curing process is performed to solidify molding compound 124. The filling of molding compound 124 may overflow die 102/TIVs 126A so that molding compound 124 covers top surfaces of die 102/TIVs 126A. A mechanical grinding, chemical mechanical polish (CMP), or other etch back technique may be employed to remove excess portions of molding compound 124 and expose connectors (e.g., pillars bumps 110) of die 102. After planarization, top surfaces of molding compound 124, die 102, and TIVs 126A may be substantially level. Thus, fan-out tier 101A may be formed over BS RDLs 106 in device package 100. In the formation process illustrated by FIGS. 2A through 2F, BS RDLs 106 provides a base platform for forming various features of fan-out tier 101A in package 100.

Figure 2G:
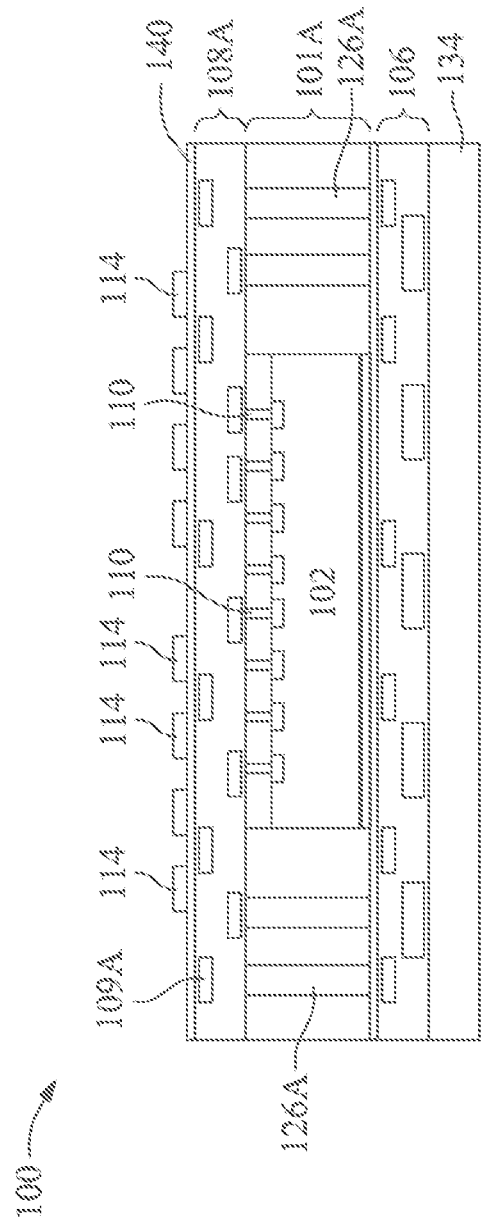
FIG. 2A through 2O illustrate various intermediary steps of manufacturing the first device package in accordance with some embodiments.

In FIG. 2G, FS RDLs 108A are formed over tier 101A. FS RDLs 108A may be substantially similar to BS RDLs 106 both in formation process and composition. Die 102 and TIVs 126A may be electrically connected to conductive features 109A in FS RDLs 108A. Additional contacts (e.g., UBMs 114) may be formed over FS RDLs 108A (e.g., on a surface of FS RDLs 108A opposing fan-out tier 101A). Furthermore, a seed layer 140 may optionally be formed over FS RDLs 108A.

Figure 2H:
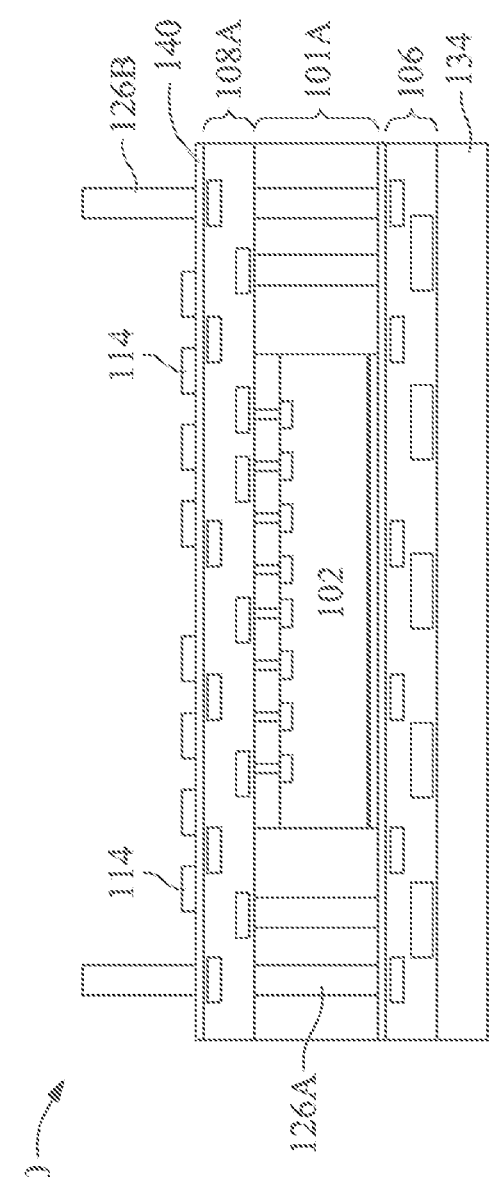

Next, additional TIVs 126B, which may be substantially similar to TIVs 126A, are formed over FS RDLs 108A. The formation of TIVs 126B may include a substantially similar process as the formation of TIVs 126A. For example, in some embodiments, the formation of TIVs 126B may comprise a uni-directional plating process using seed layer 140 to fill openings in a patterned photoresist layer (not shown). TIVs 126B may be electrically connected to FS RDLs 108A, which may electrically connect TIVs 126B to TIVs 126A, BS RDLs 106, and/or die 102. The resulting structure is illustrated in FIG. 2H. Although FIG. 2H illustrates TIVs 126B as being formed only in peripheral regions of package 100, in alternative embodiments, TIVs 126B may also be formed in central regions of package 100 (e.g., see FIG. 1B).

Subsequently, in FIG. 2I, semiconductor dies (e.g., 104A) may be bonded (e.g., flip chip bonded) to UBMs 114 using connectors 116 disposed on dies 104A. Dies 104A may be memory chips, logic chips, mixed signal chips, sensor chips, networking chips, and the like. Dies 104A may be electrically connected to FS RDLs 108A, which may electrically connect dies 104A to die 102. Referring next to FIG. 2J, a wafer level molding/grind back may be performed. For example, molding compound 124 may be dispensed between dies 104A and TIVs 126B. A CMP (or other etch back technique) may be performed to expose TIVs 126B, and a top surface of molding compound 124, TIVs 126B, and dies 104A may be substantially level. Thus, a second fan-out tier 101B is completed in device package 100.

FIG. 2K illustrates the formation of FS RDLs 108B over fan-out tier 101B. FS RDLs 108B may be substantially similar to FS RDLs 108A and BS RDLs 106. Additional UBMs 114 (or other contacts) may be formed over FS RDLs 108B, and a seed layer 142 may also be optionally formed over FS RDLs 108B. TIVs 126B electrically connect FS RDLs 108A to FS RDLs 108B.

Figure 2M:
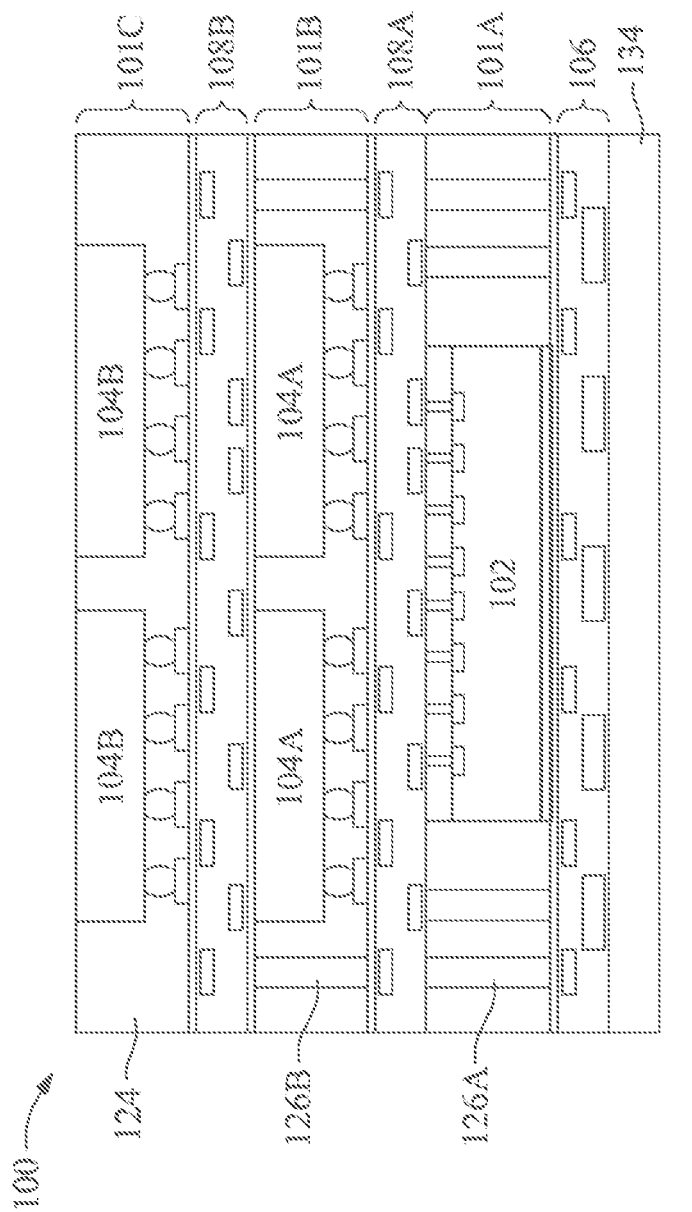
Figure 2N:
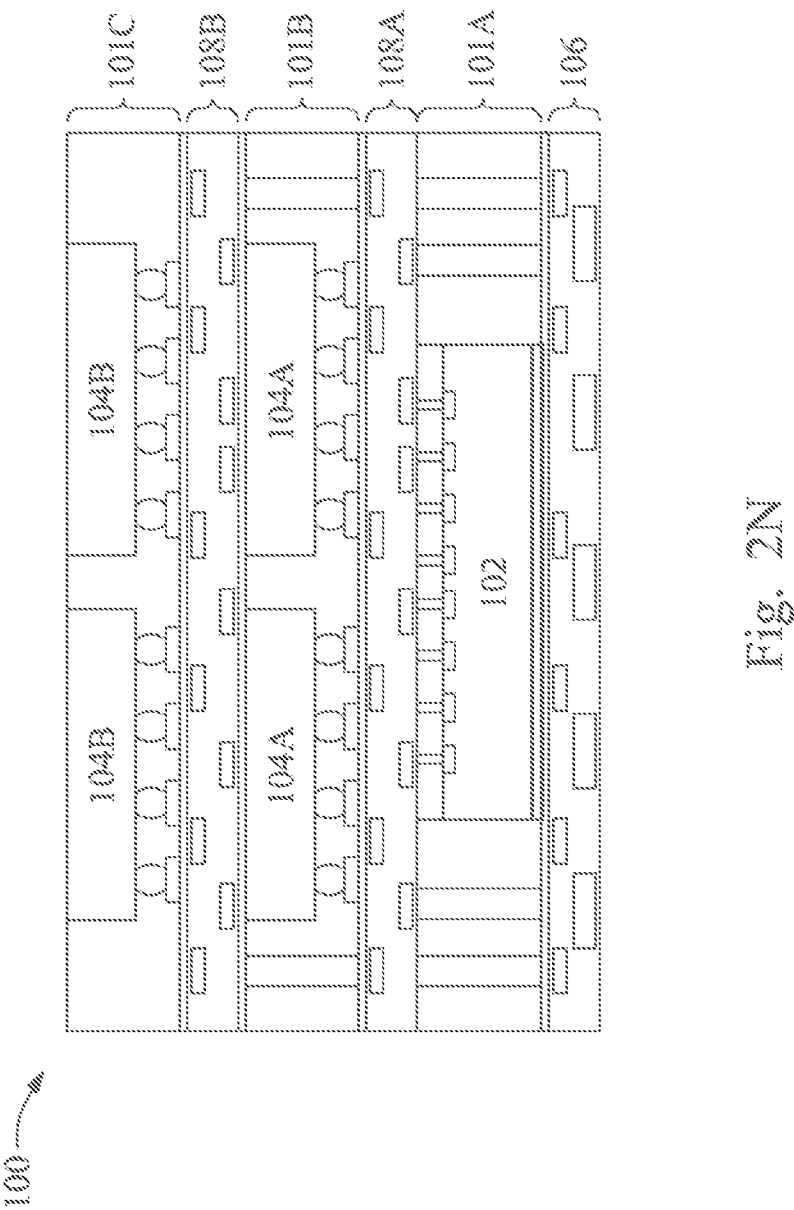

In FIG. 2L, additional semiconductor dies (e.g., dies 104B) may be bonded (e.g., flip chip bonded) to the additional UBMs 114 over FS RDLs 108B using connectors 116 on dies 104B. Dies 104B may be electrically connected to FS RDLs 108B, which may electrically connect dies 104B to die 102 (and optionally dies 104A) by way of TIVs 126B. Dies 104B may be memory chips, logic chips, mixed signal chips, sensor chips, networking chips, and the like. Referring next to FIG. 2M, a wafer level molding/grind back may be performed for fan-out tier 101C. For example, a molding compound 124 may be dispensed between dies 104B. A planarization (e.g., CMP or other etch back technique) may be performed to reduce the overall thickness of fan-out tier 101C, and top surfaces of molding compound 124 and dies 104B may be substantially level. Thus, fan-out tier 101C is completed in package 100. Although the illustrated device package has three fan-out tiers, fewer (e.g., two) or additional fan-out tiers may also be formed as desired based on package design. After various fan-out tiers are formed, carrier 134 may be removed as illustrated by FIG. 2N.

In FIG. 2O, additional package features may be formed. For example, conductive features (e.g., contact pads 122) in BS RDLs 106 may be exposed by laser drilling, etching, and the like. Connectors 120 may be mounted on exposed conductive features 122 in BS RDLs 106. Connectors 120 may be BGA balls and may be used to bond device package 100 to other package components, such as, a printed circuit board. The use of conductive features in BS RDLs 106 as contact pads for external connectors reduces the need to form additional conductive features (e.g., UBMs) on BS RDLs 106 or over a top-most fan-out tier (e.g., fan-out wafer tier 101C) in package 100. Other package features, such as various heat dissipation features (see FIGS. 1A/1B), may also be formed. Package may be sawed from other device packages (not shown) in a package wafer along scribe lines. Thus, package 100 having multiple fan-out tiers comprising dies and interconnect structures is formed.

Figure 3:
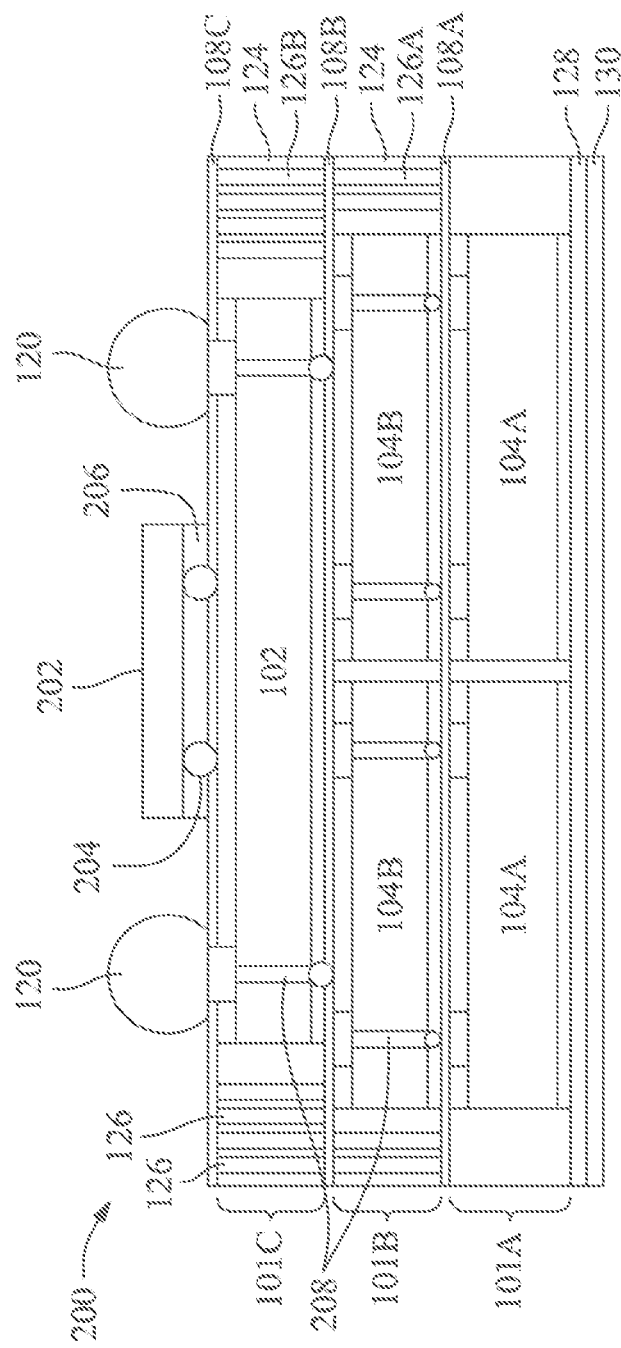
FIG. 3 illustrates a cross-sectional view of a second device package in accordance with some embodiments.

FIG. 3 illustrates a cross sectional view of a device package 200 in accordance with alternative embodiments. Package 200 may include similar features as package 100, where like reference numerals indicate like elements. Package 200 includes various fan-out tiers 101 having RDLs 108 disposed between each tier in a fan-out stacked SiP logic-last configuration having face to back bonded dies (e.g., a front side of dies 104 are bonded to a backside of die 102). Furthermore, package 200 may include any of the non-limiting features discussed below. Package 200 (e.g., having a thin Z-height) may include a thin profile SiP integrating heterogeneous dies 102/104. Package 200 may further allow for high memory capacity and bandwidth using multiple tiers of memory chips (e.g., dies 104A/104B). Additional tiers having additional memory chips (not shown) may also be included. Semiconductor dies 104 can be $LPDDR_x$, WIO, NAND flash, SRAM memory chips, and the like chips. Alternatively, dies 104 may also include logic or mixed signal, MEMS, sensors, networking, combinations thereof, and the like chips.

Dies 104 may be electrically connected to a core logic die 102 and/or external connectors 120 across fan-out tiers 101 through TIVs 126 and FS RDLs 108. Various TIVs 126 may be dedicated interconnects which electrically connect a single die 104 to die 102 and/or external connectors 120. Dedicated TIVs 126 may simplify electrical routing and control signals between die 102 and dies 104. Dies 102/104 may further optionally include TSVs to provide additional electrical connections between dies 102 and/or 104. Other semiconductor dies, packages, or other device (e.g., surface mount device (SMD)), such as die 202, can be optionally included for F2F (face to face) bonding (e.g., flip chip bonding) with core logic die 102. Bonding may be done through connectors 204 disposed on die 202. Package 200 may further include heat dissipation features (e.g., TIM 128 and contour lid 130) on back surface of fan-out tier 101A (e.g., dies 104A), which may allow for improved thermal performance.

Figure 4F:
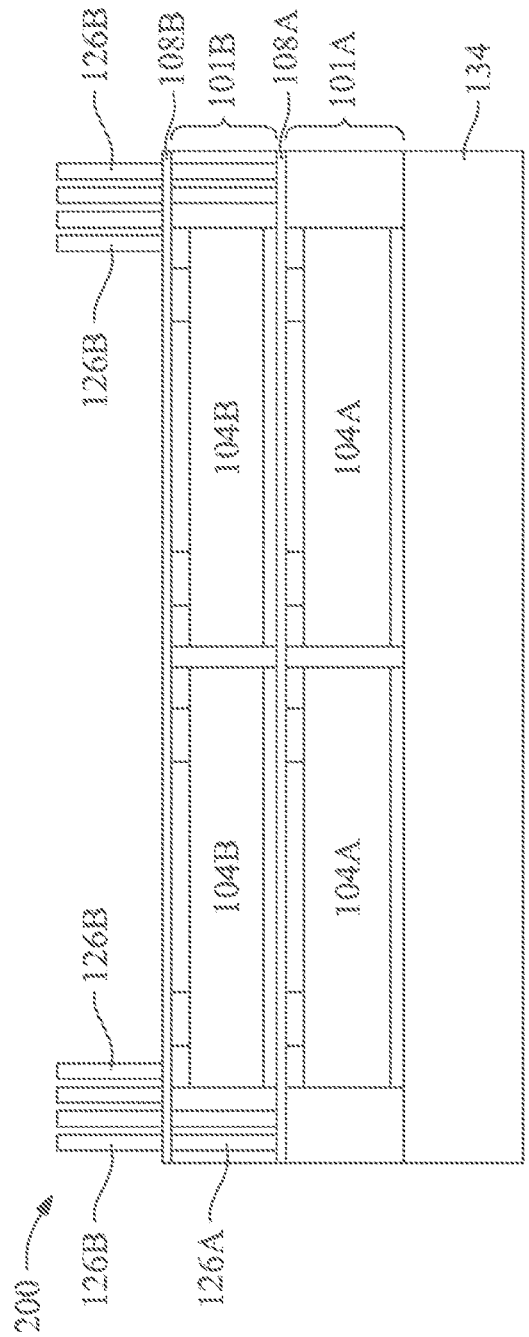

FIG. 4A through 4I illustrate various intermediary steps of manufacturing the device package 200 in accordance with some embodiments. In FIG. 4A, a semiconductor die (e.g., die 104A) is provided. Die 104A may be a logic die, memory die (e.g., $LPDDR_x$, WIO, NAND flax), a MEMS die, sensor die, networking die, and the like. Contacts, such as pillar bumps 210, are formed on a front side of die 104A, and a dielectric material 212 (e.g., a passivation layer) may optionally be disposed between pillar bumps 210. In alternative embodiments, pillar bumps 210 may be replaced with other interconnect structures, such as, RDLs and micro-vias on die 104A. An adhesive layer 214 (e.g., a DAF) may be disposed on a backside of die 104A. The various features of die 104A may be formed as part of a wafer (not shown), and a dicing/die saw may be performed to singulate die 104A from other dies in the wafer.

In FIG. 4B, one or more dies 104A are mounted to a carrier 134. For example, dies 104A may be adhered to carrier 134 though adhesive layers 214 on the backside of each die 104A. Mounted dies 104A may be the same die (e.g., providing the same functionality) or different dies (e.g., providing different functionality). A wafer level molding/grind back may be performed. For example, a molding compound 124 may be dispensed between the dies 104A, and a CMP, planarization, or other etch back may be performed to expose pillar bumps 210. Thus, a first fan-out tier 101A is completed in device package 200. In FIG. 4C, a one or more FS RDLs (e.g., FS RDLs 108A) is formed over tier 101A. FS RDLs 108A may include various conductive features in a dielectric material (e.g., a polymer). FS RDLs 108A may be electrically connected to dies 104A by pillar bumps 210. A seed layer (not shown) may optionally be disposed over a top surface of FS RDLs 108A.

Next, TIVs 126A may be formed over FS RDLs 108A as illustrated by FIG. 4D. TIVs 126A may be electrically connected to conductive features in FS RDLs 108A, which may electrically connect TIVs 126A to dies 104A. In some embodiments, TIVs 126A may be dedicated interconnect structures, which may electrically connect to a single die 104A in tier 101A.

In FIG. 4E, additional semiconductor dies (e.g., dies 104B) may be bonded (e.g., adhered via a DAF) to FS RDLs 108A. A wafer level molding/grind back may be performed to dispense a molding compound 124 around dies 104B and exposes pillar bumps on dies 104B. Thus, a second fan-out tier 101B is formed in device package 200. Subsequently, one or more RDLs (e.g., FS RDLs 108B) may be formed over fan-out tier 101B (e.g., dies 104B and the molding compound). FS RDLs 108B may be electrically connected to dies 104B and TIVs 126A. Dies 104A and 104B may or may not be electrically connected in package 200 depending on package configuration. The resulting structure is illustrated in FIG. 4E.

Figure 4G:
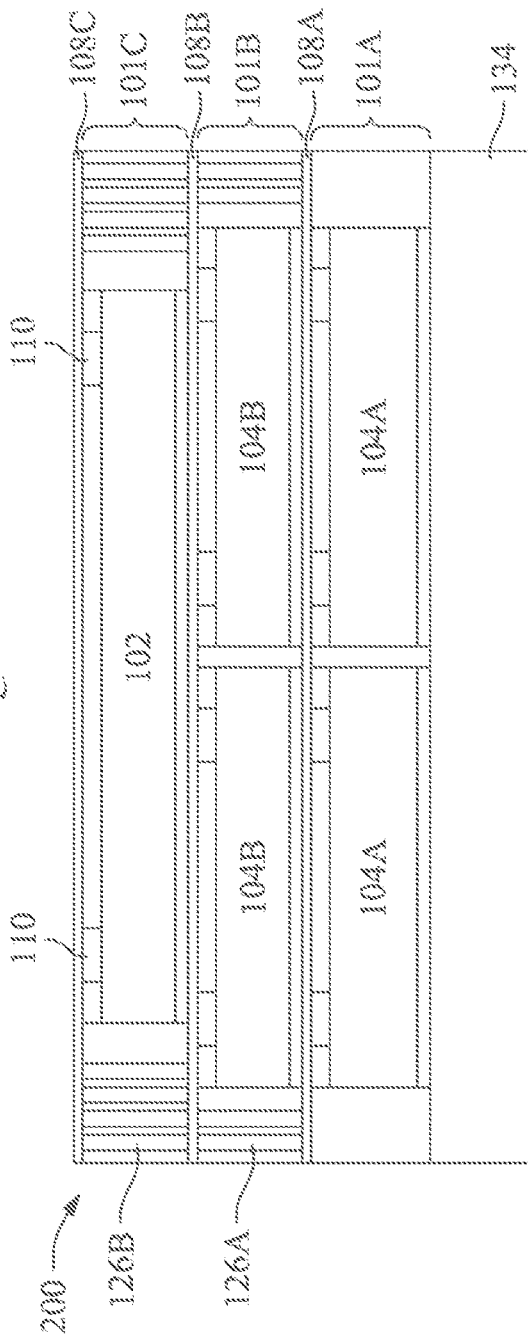

In FIG. 4F, additional TIVs 126B are formed over FS RDLs 108B. The additional TIVs 126B may be electrically connected to conductive features in FS RDLs 108B and dies 104B. Some TIVs 126B may also be electrically connected to FS RDLs 108A and dies 104A. In some embodiments, TIVs 126B may be dedicated interconnects, which may be electrically connected to a single die 104B while being electrically isolated from other dies 104A. In FIG. 4G, another semiconductor die 102 (e.g., a core logic die) may be bonded (e.g., adhered via a DAF) over FS RDLs 108B. A wafer level molding/grind back may be performed to expose pillar bumps no on die 102. For example, a molding compound may be dispensed to encircle die 102. Thus, a third fan-out tier 101C is formed in device package 200.

Subsequently, one or more RDLs (e.g., FS RDLs 108C) may be formed over fan-out tier 101C (e.g., die 102 and the molding compound). FS RDLs 108C may be electrically connected to both die 102 and TIVs 126B. A combination of FS RDLs 108A, FS RDLs 108B, FS RDLs 108C, and TIVs 126 electrically connect various semiconductor dies (e.g., dies 104A and dies 104B) in tiers 101A and 101B to die 102 in tier 101C. Various TIVs 126 in package 200 may be dedicated TIVs that electrically connect a single die 104A or 104B to die 102. For example, dies 104 may be electrically connected to die 102 by way of a dedicated signaling path specific to each die 104. Individual signaling paths may be electrically isolated from each other, and such signaling paths may include dedicated TIVs and/or conductive features in FS RDLs 108. Thus, dies 104 may or may not be electrically connected to each other, and electrical signaling and control logic may be simplified between a core logic die 102 and other dies 104 in package 200. The resulting structure is illustrated in FIG. 4G. Although not illustrated, additional tiers having additional dies 104 may be optionally disposed between tiers 101B and 101C to further increase capacity depending on package design.

In FIG. 4H, carrier 134 is removed. A backside of tier 101A may be ground back and an adhesive layer may be disposed on a backside of dies 104A. Furthermore, heat dissipation features such as TIM 128 and contour lid 130 may be disposed on a backside of tier 101A. Next, connectors 120 (e.g., BGA balls) may be disposed on the FS RDLs 108C over package 200. These connectors may further bond the device package to other package components such as other device dies, interposers, package substrates, printed circuit boards, a mother board, and the like. Additional features and/or dies (e.g., die 202, see FIG. 3) may also be bonded to package 200. Dedicated TIVs 126 may electrically connect individual device dies 104 to external connectors 120 by way of dedicated signaling paths in RDLs 108. Package 200 may be sawed from other device packages (not shown) along scribe lines.

Figure 5:
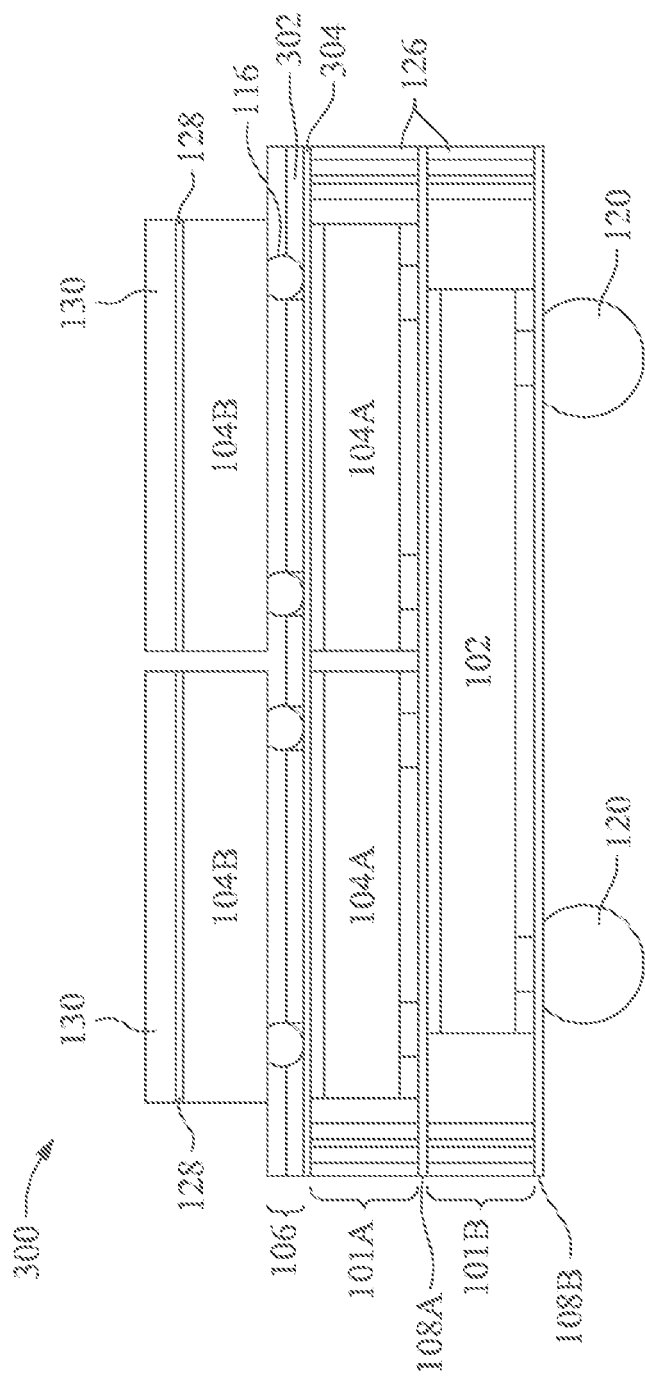
FIG. 5 illustrates a cross-sectional view of a third device package in accordance with some embodiments.

FIG. 5 illustrates a cross sectional view of a device package 300 in accordance with alternative embodiments. Package 300 may be substantially similar to package 200 where like reference numerals indicate like elements. Package 300 includes various fan-out tiers 101 having RDLs 108 disposed between each tier 101 in a fan-out stacked SiP logic-last configuration having face to back bonded dies. Some dies (e.g., 104B) may be bonded to package 300 without being disposed in a fan-out tier 101 while other dies (e.g., dies 102 and 104A) are disposed in fan-out tiers 101. For example, dies 104B may be flip chip bonded to a BS RDLs 106 (e.g., having a conductive seed layer 304) on a backside of fan-out tier 101A/dies 104A. Alternatively dies 104B could be replaced by a package with bonding connectors of BGA, C4 bump, and the like. The function of package may include memory, RF network communication, MEMS, sensor, power management, and the like.

Furthermore, package 300 may include any of the following non-limiting features as discussed below. Package 300 (e.g., having a thin Z-height) may include a thin profile SiP integrating heterogeneous dies 102/104. Package 300 may further allow for high memory capacity and bandwidth with multiple tiers of memory chips (e.g., dies 104A/104B). Semiconductor dies 104 can be $LPDDR_x$, WIO, NAND flash memory chips. Alternatively, dies 104 may also include logic or mixed signal, MEMS, sensors, networking, combinations thereof, and the like chips. Additional fan-out tiers 101 having additional memory, logic, sensor, mixed signal, networking, and the like dies (not shown) may also be included.

Dies 104 may be electrically connected to a core logic die 102 and/or external connectors 120 across fan-out tiers 101 through TIVs 126 and FS RDLs 108. Various TIVs 126 may be dedicated interconnects which electrically connect a single die 104 to die 102 and/or external connectors 120. Dedicated TIVs 126 may simplify electrical routing and control signals between die 102 and dies 104. Dies 102/104 may further optionally include TSVs (not shown) to provide additional electrical connections between dies 102 and/or 104. Package 300 may further include heat dissipation features (e.g., TIM 128 and contour lid 130) on back surfaces of dies 104B, which may allow for improved thermal performance.

Figure 6E:
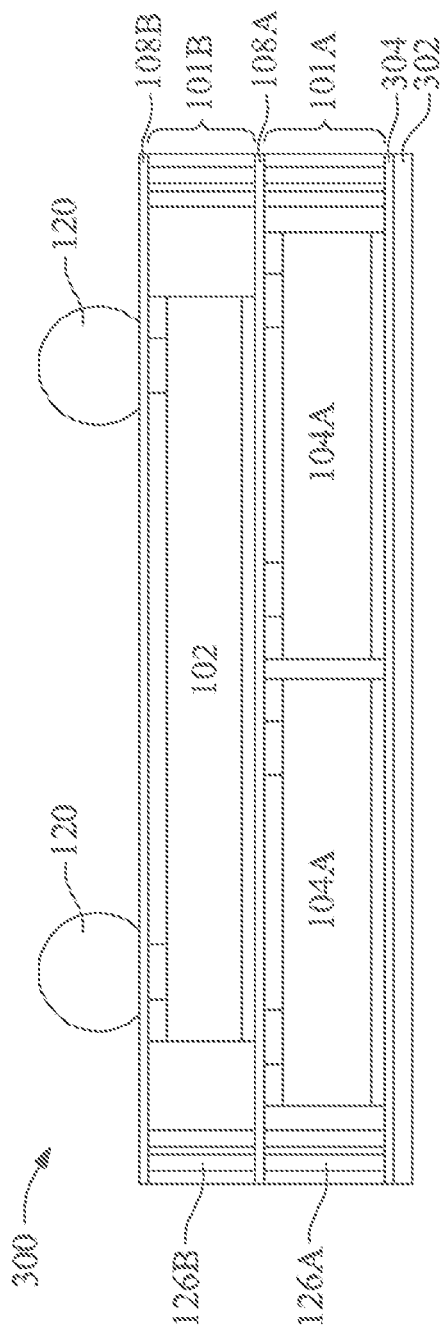

FIG. 6A through 6G illustrate various intermediary steps of manufacturing device package 300 in accordance with some embodiments. In FIG. 6A, a carrier 134 is provided. BS RDLs 106 is disposed over carrier 134. BS RDLs 106 may include a seed layer 304 formed over a polymer layer 302. TIVs 126A may be formed over seed layer 304.

In FIG. 6B, one or more semiconductor dies (dies 104A) are mounted to a carrier. For example, the dies 104A may be adhered to the carrier though adhesive layer 214 on the backside of each die 104A. A wafer level molding/grind back may be performed. For example, a molding compound 124 may be dispensed between the dies 104A and TIVs 126A, and a planarization may be performed to exposed connectors (e.g., pillar bumps 210) of dies 104A. Thus, a first fan-out tier 101A is completed in the device package. Each die 104A may be a logic die, memory die (e.g., LPDDRx, WIO, NAND flax), a MEMS die, sensor die, networking die, and the like. Contacts, such as pillar bumps 210, are formed on dies 104A, and a dielectric material 212 may optionally be disposed between pillar bumps 210. In alternative embodiments, pillar bumps may 210 be replaced with RDLs and micro-vias on dies 104A.

In FIG. 6C, a one or more FS RDLs (e.g., FS RDLs 108A) is formed over tier 101A. FS RDLs 108A may be electrically connected to dies 104A and TIVs 126A. TIVs 126A may further electrically connect the seed layer 304 with FS RDLs 108A. In FIG. 6D, another semiconductor die (e.g., a core logic die 102) may be bonded (e.g., adhered via DAF 118) over FS RDLs 108A. A wafer level molding/grind back may be performed. For example, a molding compound 124 may be dispensed between die 102 and various TIVs 126B in tier 101B, and a planarization may be performed to expose connectors (e.g., pillar bumps no) on die 102. Thus, a second fan-out tier 101B is formed in device package 300.

Figure 6F:
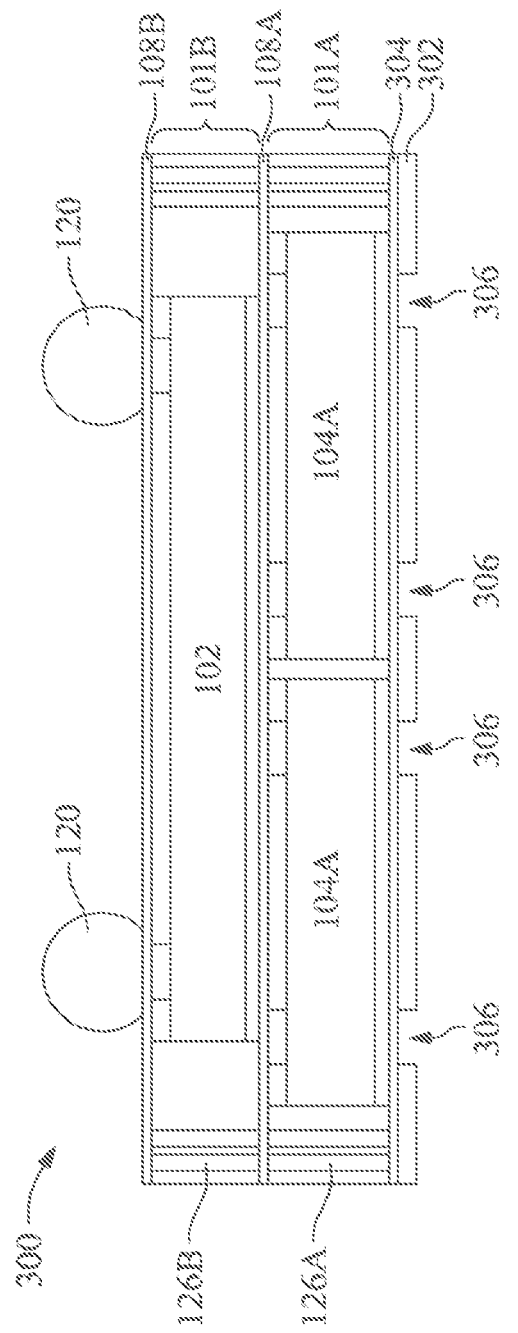

Next, one or more FS RDLs (FS RDLs 108B) is formed over tier 101B. FS RDLs 108B may be electrically connected to die 102 and the TIVs 126B. TIVs 126B may further electrically connect FS RDLs 108A and 108B. Carrier 134 is then removed, and connectors 120 (e.g., BGA balls) may be disposed on FS RDLs 108B over tier 101B. These connectors 120 may further bond package 300 to other package components such as other device dies, interposers, package substrates, printed circuit boards, a mother board, and the like. The resulting structure is illustrated in FIG. 6E. In FIG. 6F, polymer layer 302 of BS RDLs 106 is patterned to include openings 306, exposing portions of seed layer 304. The patterning process may include a laser drilling process, a combination of photolithography and/or etching, and the like, for example.

In FIG. 6G, additional semiconductor dies (e.g., dies 104B) may be bonded to seed layer 304. For example, connectors 116 (e.g., C4 bumps) on the dies 104B may be bonded to seed layer 304 through openings 306 of patterned polymer layer 302. An underfill 308 may be dispensed between tier 101A and dies 104B. Dies 104B may be electrically connected to die 102 and/or external connectors 120 through the seed layer 304, FS RDLs 108A and 108B, and various TIVs 126 in device package 300. In package 300, some or all TIVs 126 may be dedicated TIVs that provides a dedicated signaling path between single die 104 to die 102 and/or external connectors 120. Such dedicated signaling paths may include dedicated conductive paths in RDLs 106/108 for electrically connecting a single die 104 to die 102. Thus, dies 104 may or may not be electrically connected to each other, and electrical signaling and control logic may be simplified between a core logic die 102 and other dies 104 in package 300. Additional features, such as heat dissipation features (see FIG. 5) may be optionally disposed on a backside of dies 104B.

Figure 7:
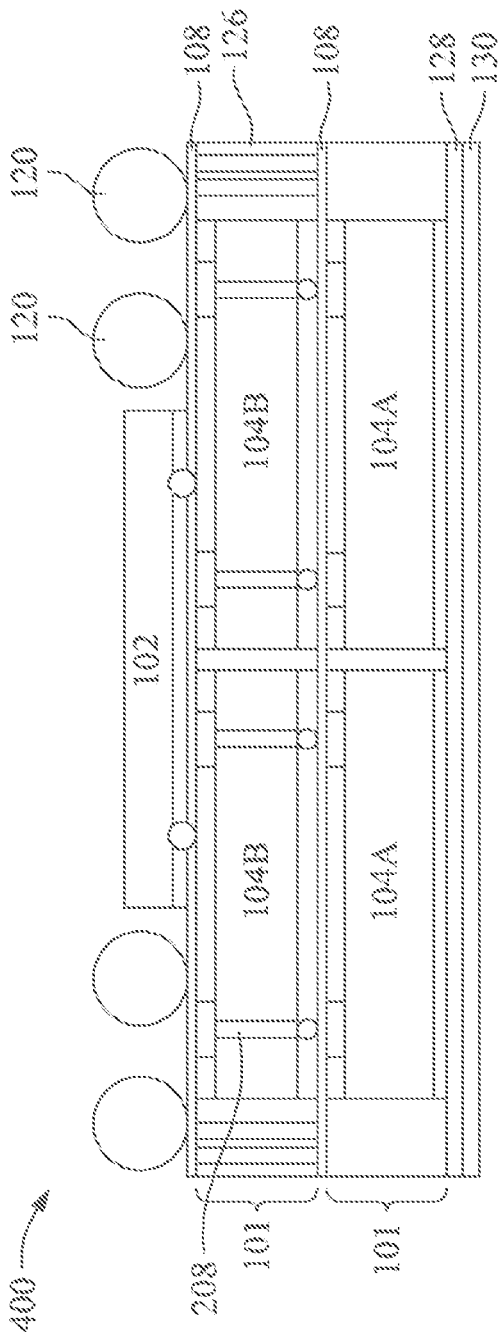
FIG. 7 illustrates a cross-sectional view of a fourth device package in accordance with some embodiments.

FIG. 7 illustrates a cross sectional view of a device package 400 in accordance with alternative embodiments. Package 400 may include similar features as package 200, where like reference numerals indicate like elements. Package 400 includes various fan-out tiers having RDLs disposed between each tier in a fan-out stacked SiP logic-last configuration. Package 400 includes various fan-out tiers 101 having RDLs 108 disposed between each tier 101 in a fan-out stacked SiP logic-last configuration having face to back bonded dies. A core logic die 102 may be bonded to package 400 without being disposed in a fan-out tier 101 while other dies 104 are disposed in fan-out tiers 101. For example, die 102 may be flip chip bonded to a FS RDLs 108.

Furthermore, package 400 may include any of the non-limiting features discussed below. Package 400 (e.g., having a thin Z-height) may include a thin profile SiP integrating heterogeneous dies 102/104. Package 400 may further allow for high memory capacity and bandwidth with multiple tiers of memory chips (e.g., dies 104A/104B). Semiconductor dies 104 can be $LPDDR_x$, WIO, NAND flash, SRAM memory chips, and the like. Alternatively, dies 104 may also include logic or mixed signal, MEMS, sensors, networking, combinations thereof, and the like chips. Additional tiers having additional memory chips (not shown) may also be included.

Dies 104 may be electrically connected to a core logic die 102 and/or external connectors 120 across fan-out tiers 101 through TIVs 126 and FS RDLs 108. Various TIVs 126 may be dedicated interconnects which provide dedicated signaling paths for electrically connecting a single die 104 to die 102 and/or external connectors 120. Dedicated TIVs 126 may simplify electrical routing and control signals between die 102 and dies 104. Dies 102/104 may further optionally include TSVs 208 to provide additional electrical connections between dies 102 and/or 104. Package 400 may further include heat dissipation features (e.g., TIM 128 and contour lid 130) on back surfaces of dies 104A, which may allow for improved thermal performance.

Figure 8:
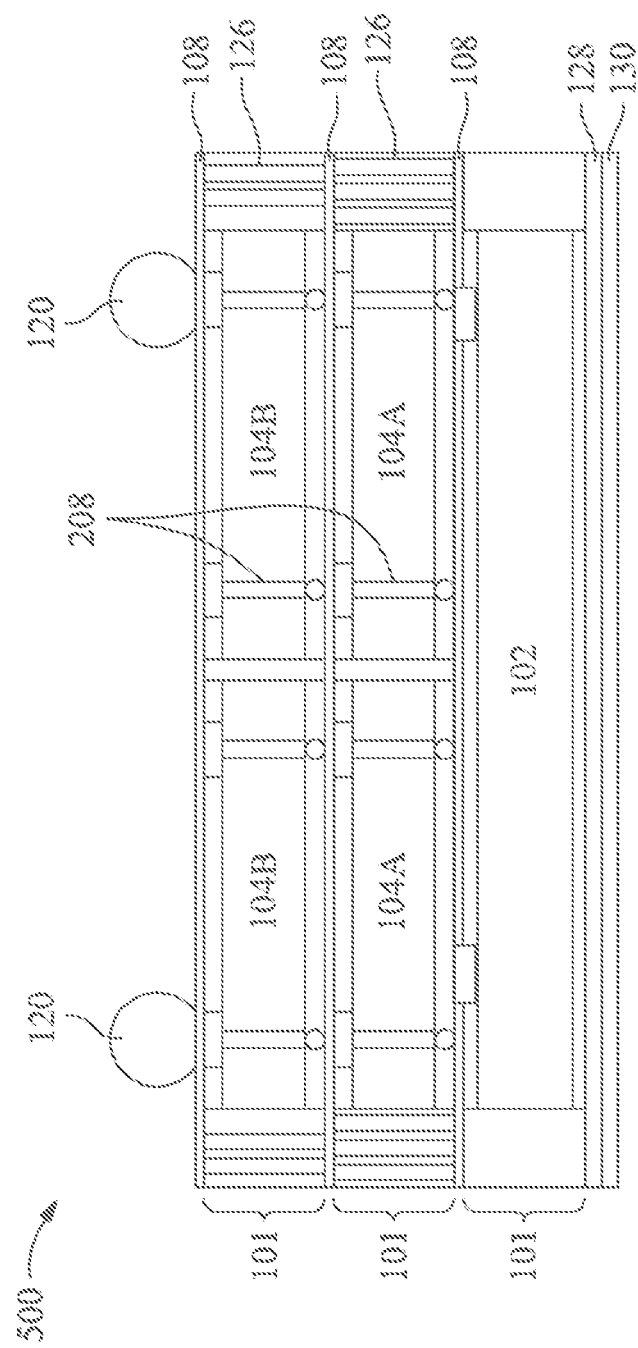
FIG. 8 illustrates a cross-sectional view of a fifth device package in accordance with some embodiments

FIG. 8 illustrates a cross sectional view of a device package 500 in accordance with alternative embodiments. Package 500 may include similar features as package 200, where like reference numerals indicate like elements. Package 500 includes various fan-out tiers 101 having RDLs 108 disposed between each tier 101 in a fan-out stacked SiP logic-first configuration having face to back bonded dies. The logic-first configuration allows for the disposition of heat dissipation features on a backside of a core logic die 102. For example, depending on the configuration of a package, a logic die or memory die (or other die) may be more tolerant of heat generated during package operation. Therefore, depending on package design, a device package may be configured to allow heat dissipation features to be disposed on memory dies and/or logic dies.

Furthermore, package 500 may include any of the non-limiting features discussed below. Package 500 (e.g., having a thin Z-height) may include a thin profile SiP integrating heterogeneous dies 102/104. Package 500 may further allow for high memory capacity and bandwidth with multiple tiers of memory chips (e.g., dies 104A/104B). Semiconductor dies 104 can be $LPDDR_x$, WIO, NAND flash, SRAM memory chips. Alternatively, dies 104 may also include logic or mixed signal, MEMS, sensors, networking, combinations thereof, and the like chips. Additional tiers having additional memory chips (not shown) may also be included.

Dies 104 may be electrically connected to a core logic die 102 and/or external connectors 120 across fan-out tiers 101 through TIVs 126 and FS RDLs 108. Various TIVs 126 may be dedicated interconnects which provide dedicated signaling paths for electrically connecting a single die 104 to die 102 and/or external connectors 120. Dedicated TIVs 126 may simplify electrical routing and control signals between die 102 and dies 104. Dies 102/104 may further optionally include TSVs 208 to provide additional electrical connections between dies 102 and/or 104.

Figure 9:
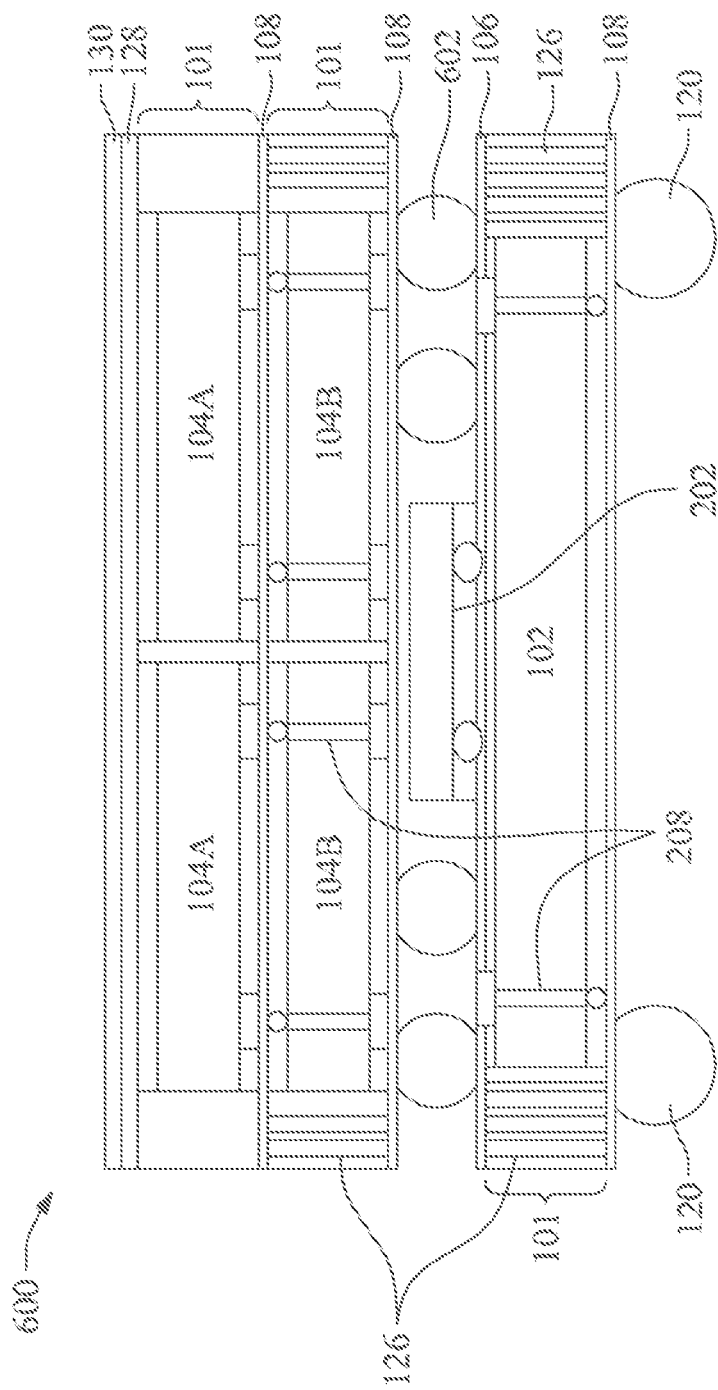
FIG. 9 illustrates a cross-sectional view of a sixth device package in accordance with some embodiments.

FIG. 9 illustrates a cross sectional view of a device package 600 in accordance with alternative embodiments. Package 600 may include similar features as package 200, where like reference numerals indicate like elements. The embodiment illustrated in FIG. 9 includes various fan-out tiers 101 having RDLs 108 disposed between each tier in a multiple fan-out PoP configuration. Some fan-out tiers 101 may further be bonded to each other by connectors 602 (e.g., microbumps, C4 bumps, BGA balls, and the like) disposed between two fan-out tiers 101. Additional device features and/or dies (e.g., dies 202) may optionally be disposed between such connectors 602.

Furthermore, package 600 may include any of the non-limiting features discussed below. Package boo (e.g., having a thin Z-height) may include a thin profile SiP integrating heterogeneous dies 102/104. Package 600 may further allow for high memory capacity and bandwidth with multiple tiers of memory chips (e.g., dies 104A/104B). Semiconductor dies 104 can be $LPDDR_x$, WIO, NAND flash, SRAM memory chips. Alternatively, dies 104 may also include logic or mixed signal, MEMS, sensors, networking, combinations thereof, and the like chips. Additional tiers having additional memory chips (not shown) may also be included.

Dies 104 may be electrically connected to a core logic die 102 and/or external connectors 120 across fan-out tiers 101 through TIVs 126 and FS RDLs 108. Various TIVs 126 may be dedicated interconnects which provide dedicated signaling paths for electrically connecting a single die 104 to die 102 and/or external connectors 120. Dedicated TIVs 126 may simplify electrical routing and control signals between die 102 and dies 104. Dies 102/104 may further optionally include TSVs 208 to provide additional electrical connections between dies 102 and/or 104. Dies 202 (e.g., WIO die) can be optionally bonded in a face to face configuration with die 102.

Figure 10:
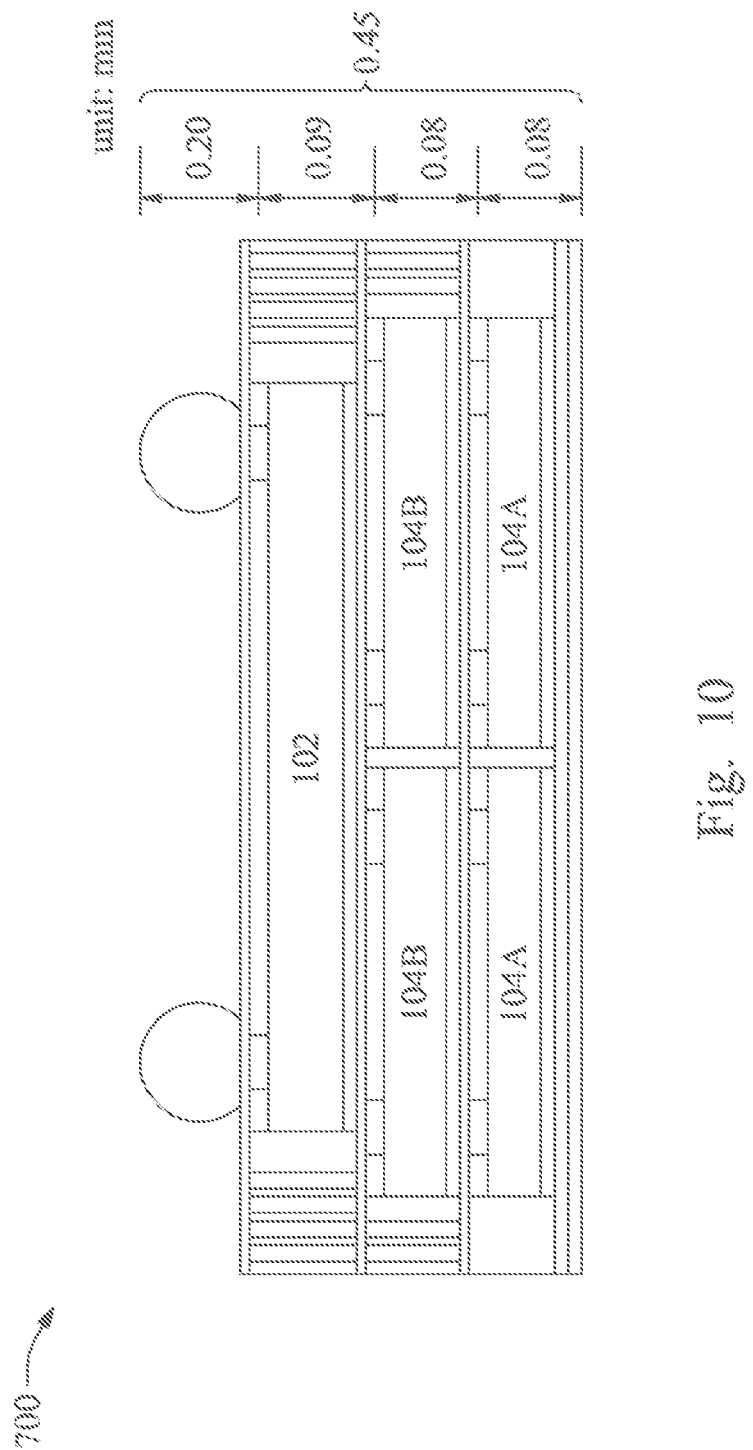
FIG. 10 illustrates example dimensions of a device package in accordance with some embodiments.

FIG. 10 illustrates example dimensions of a device package 700 in accordance with some embodiments. For example, the device package 700 may include three device tiers 101 having a die 102, dies 104A, dies 104B, various FS RDLs, heat dissipation features, and connectors over die 102. Generally, the configuration of embodiment device packages allows for thinner packaging at each tier by reducing the height of interconnect structures between each tier, thus reducing overall package height. The measurements given in FIG. 10 are purely an example, and other device packages may have varying dimensions based on package design.

Figure 11A:
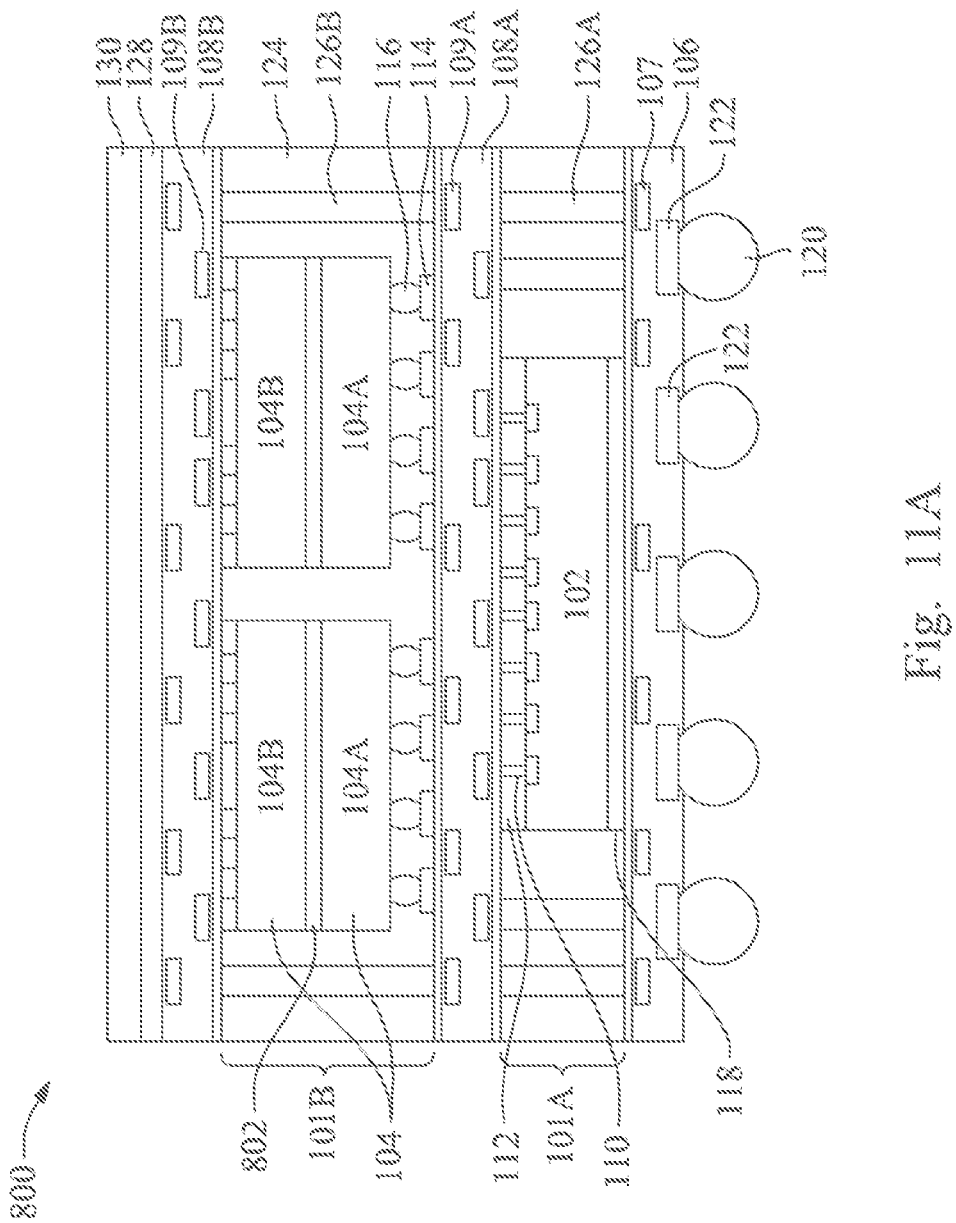
FIGS. 11A and 11B illustrate cross-sectional views of a seventh device package in accordance with some embodiments.
Figure 11B:
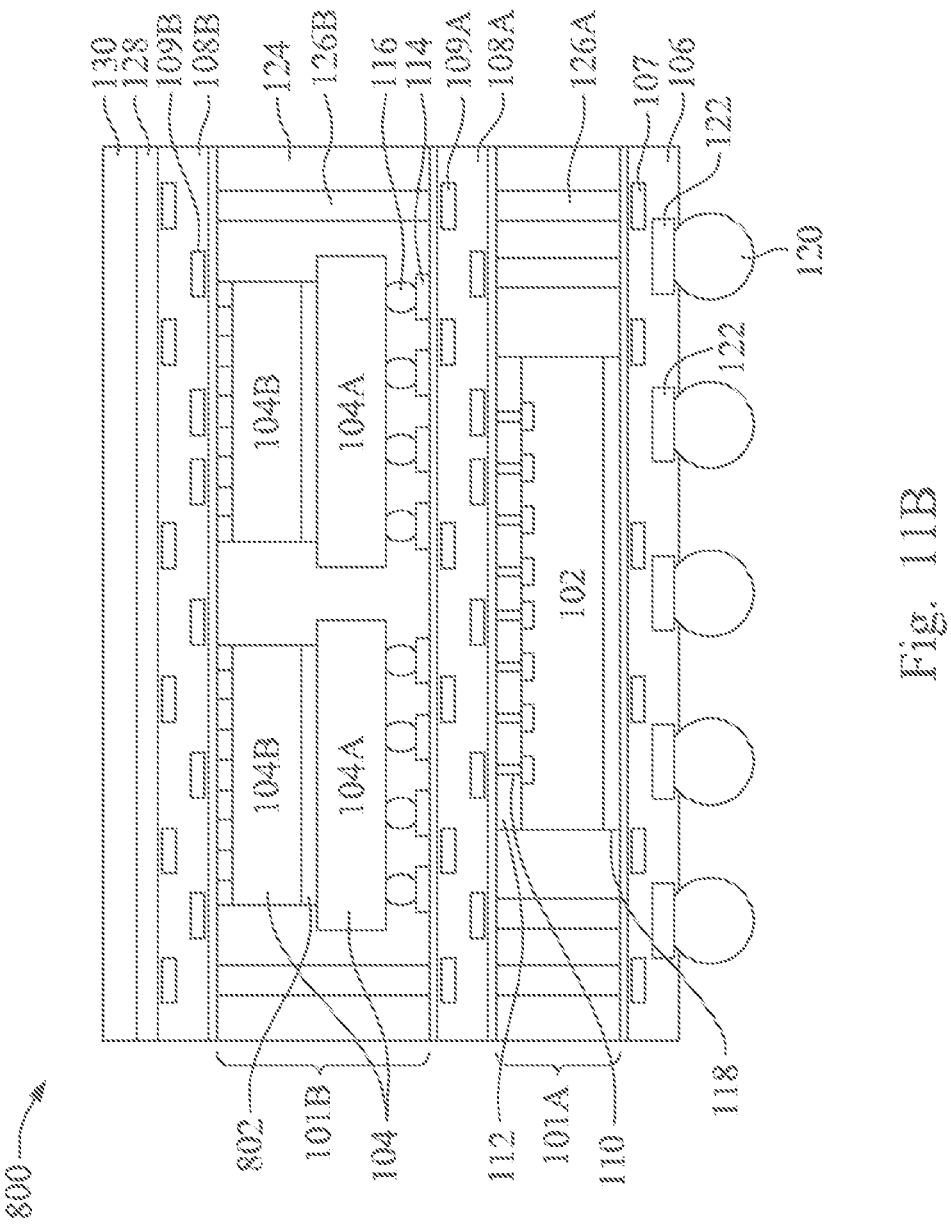

FIGS. 11A and 11B illustrate cross sectional views of device packages 800 in accordance with alternative embodiments. Device packages 800 may be similar to the device package 100, where like reference numerals indicate like elements. However, a second fan-out tier 101B of package 800 may include stacked semiconductor dies 104 (e.g., dies 104A and 104B). Backsides of dies 104 may be bonded by an adhesive layer 802 (e.g., a DAF). Dies 104A may be flip chip bonded to a first FS RDLs 108a between tiers 101A and 101B while dies 104B may be electrically connected to a second FS RDLs 108b over tier 101B. Electrical connection between dies 104A and dies 104B may or may not be achieved through various FS RDLs 108 and TIVs 126 in device package 800. The configuration of bonded dies 104A and 104B may vary. For example, FIG. 11A illustrates an embodiment where widths of bonded dies 104A and 104B are substantially the same while FIG. 11B illustrates an embodiment where widths of bonded dies 104A and 104B are different (e.g., width of dies 104A is greater than width of 104B).

Figure 12B:
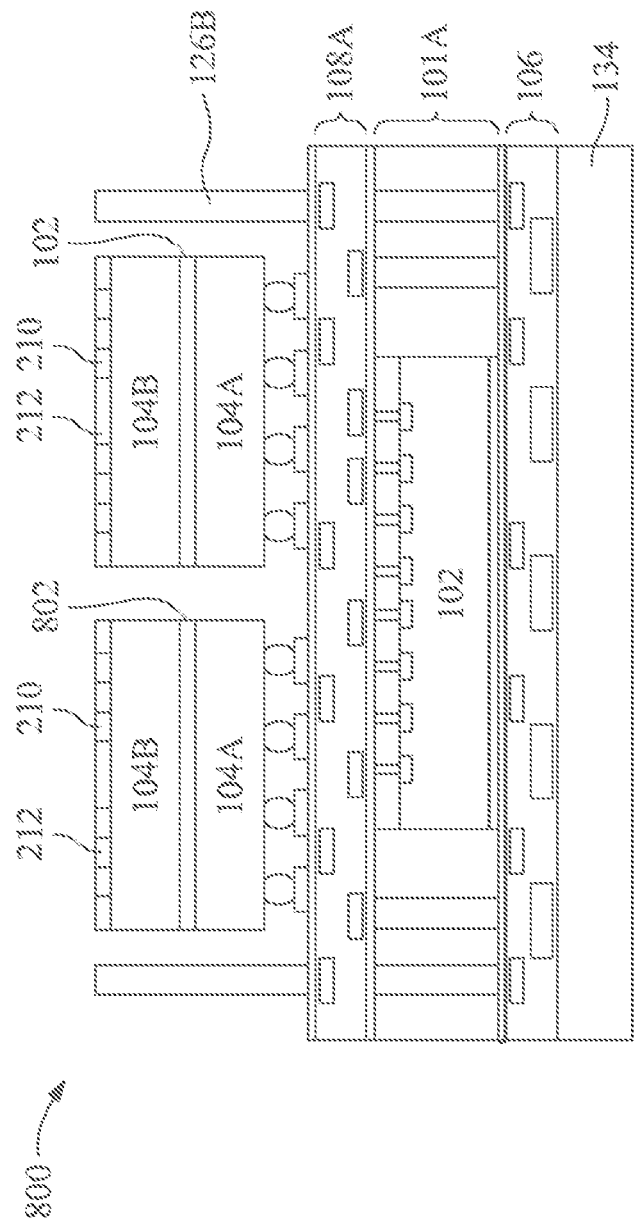

FIG. 12A through 12M illustrate various intermediary steps of manufacturing device package 800 in accordance with some embodiments. FIG. 12A illustrates a portion of package 800 during an intermediary step of manufacture. The structure illustrated by FIG. 12A is substantially similar as the structure of FIG. 2H, and substantially similar process steps as those illustrated in FIGS. 2A through 2H may be used to form the structure of FIG. 12A. Thus, detailed description of the formation of FIG. 12A is omitted for brevity.

As illustrated by FIG. 12A, a FS RDLs 108A is formed over a first fan-out tier 101A, and contacts (e.g., UBMs 114) are formed over FS RDLs 108A. Tier 101A includes TIVs 126A and a core logic die 102 electrically connected to FS RDLs 108A. BS RDLs 106 may be disposed on a backside of tier 101A, and TIVs 126A may electrically connect FS RDLs 108A to BS RDLs 106. Additional TIVs 126B may further be formed over peripheral regions of FS RDLs 108A. In alternative embodiments, TIVs 126B may further be disposed over center regions of FS RDLs 108A (see, e.g., FIG. 1B).

Figure 12C:
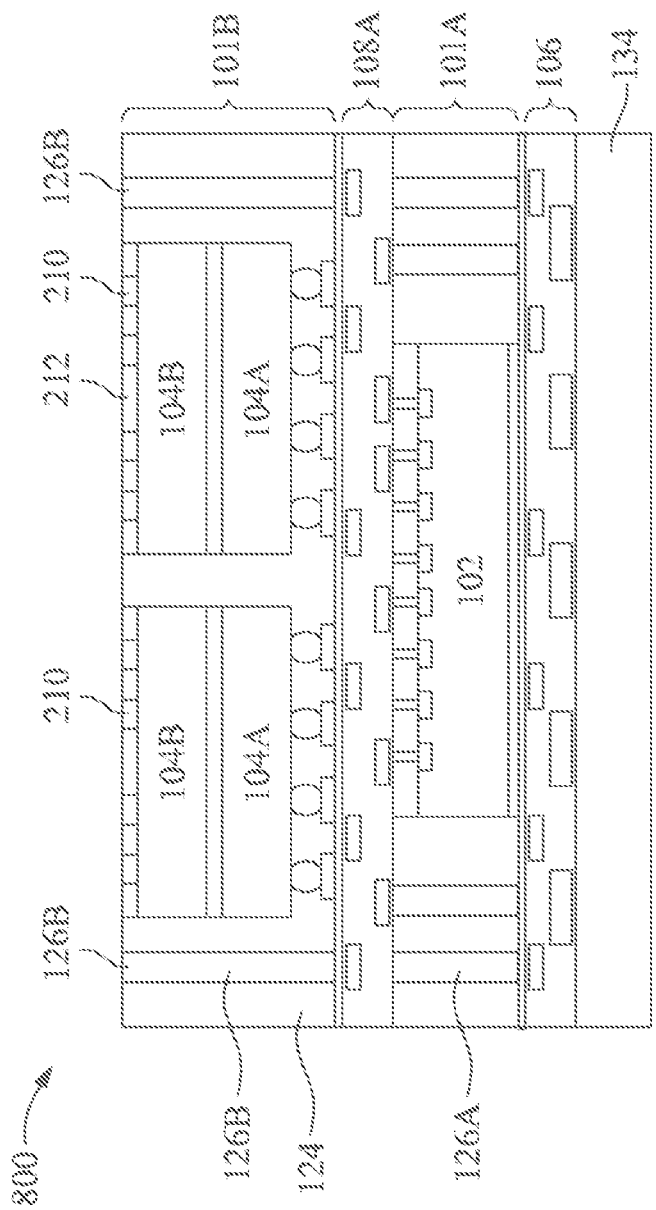

Subsequently, in FIG. 12B, semiconductor dies (e.g., dies 104A bonded to dies 104B) may be bonded (e.g., flip chip bonded) to UBMs 114 over FS RDLs 108A. A back surfaces of dies 104A may be bonded to a back surface o dies 104B by an adhesive layer 802. Connectors 116 (e.g., microbumps, C4 bumps, BGA balls, and the like) of dies 104A may be bonded to UBMs 114 over FS RDLs 108A. Dies 104A may be electrically connected to FS RDLs 108A, which may electrically connect dies 104A to die 102. The functions of die 104A may include SRAM, WIO, LPDDRx memory, while die 104B may include SRAM, WIO, LPDDRx memory, and the like. Functions of dies 104A and 104B may or may not be the same. The die size of die 104A may be larger than, substantially equal to, or smaller than die 104B based on design requirements. Referring next to FIG. 12C, a wafer level molding/grind back may be performed. For example, a molding compound 124 may be dispensed between the bonded dies 104A/104B and TIVs 126B. The molding compound may be planarized to expose connectors (e.g., pillar bumps 210) on a front side of dies 104B. Thus, a second fan-out tier 101B is completed in device package 800.

Figure 12D:
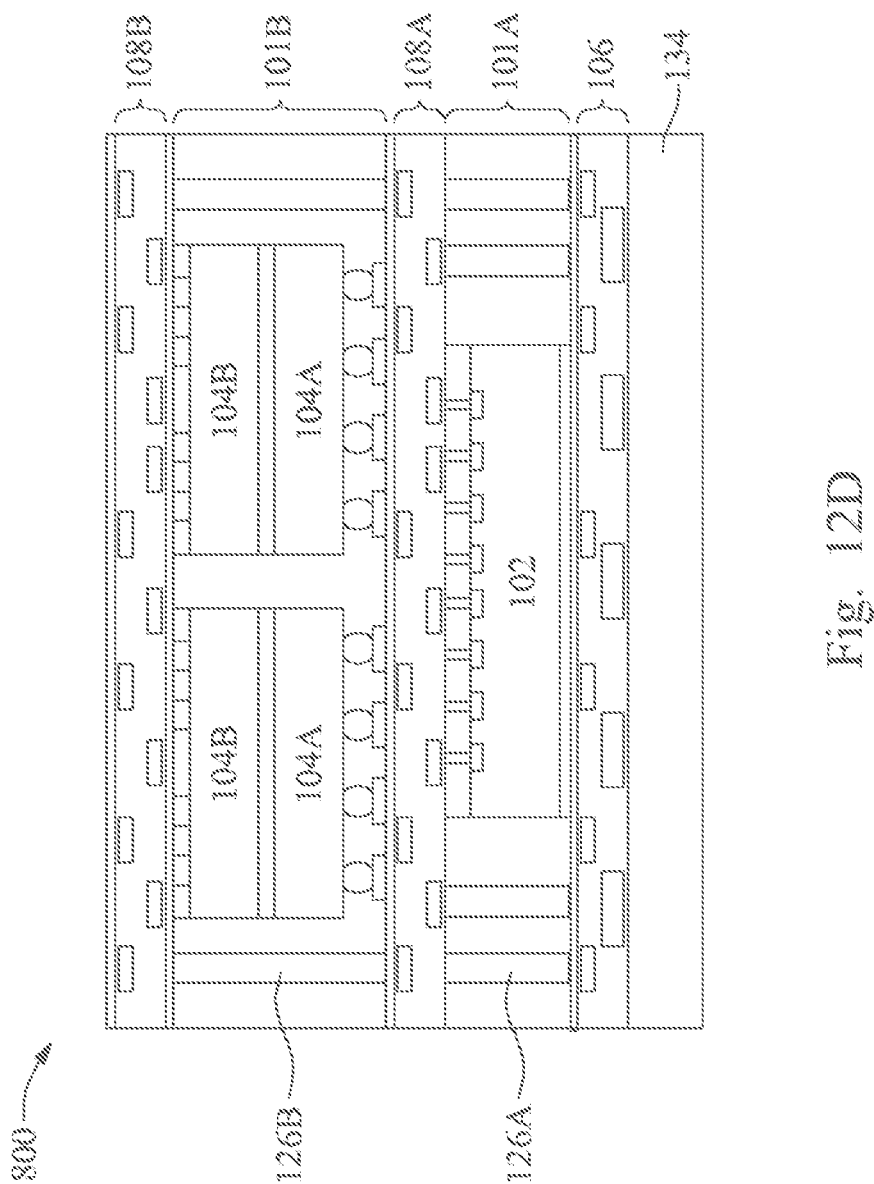

FIG. 12D illustrates the formation of FS RDLs 108B over tier 101B. FS RDLs 108B may be substantially similar to FS RDLs 108A and BS RDLs 106. FS RDLs 108B may be electrically connected to pillar bumps 210 of dies 104B. TIVs 126B in tier 101B electrically connect FS RDLs 108A to FS RDLs 108B, and thus, dies 104B may be electrically connected to die 102 and optionally dies 104A through FS RDLs 108B, FS RDLs 108A, and various TIVs 126 in package 800.

Figure 12E:
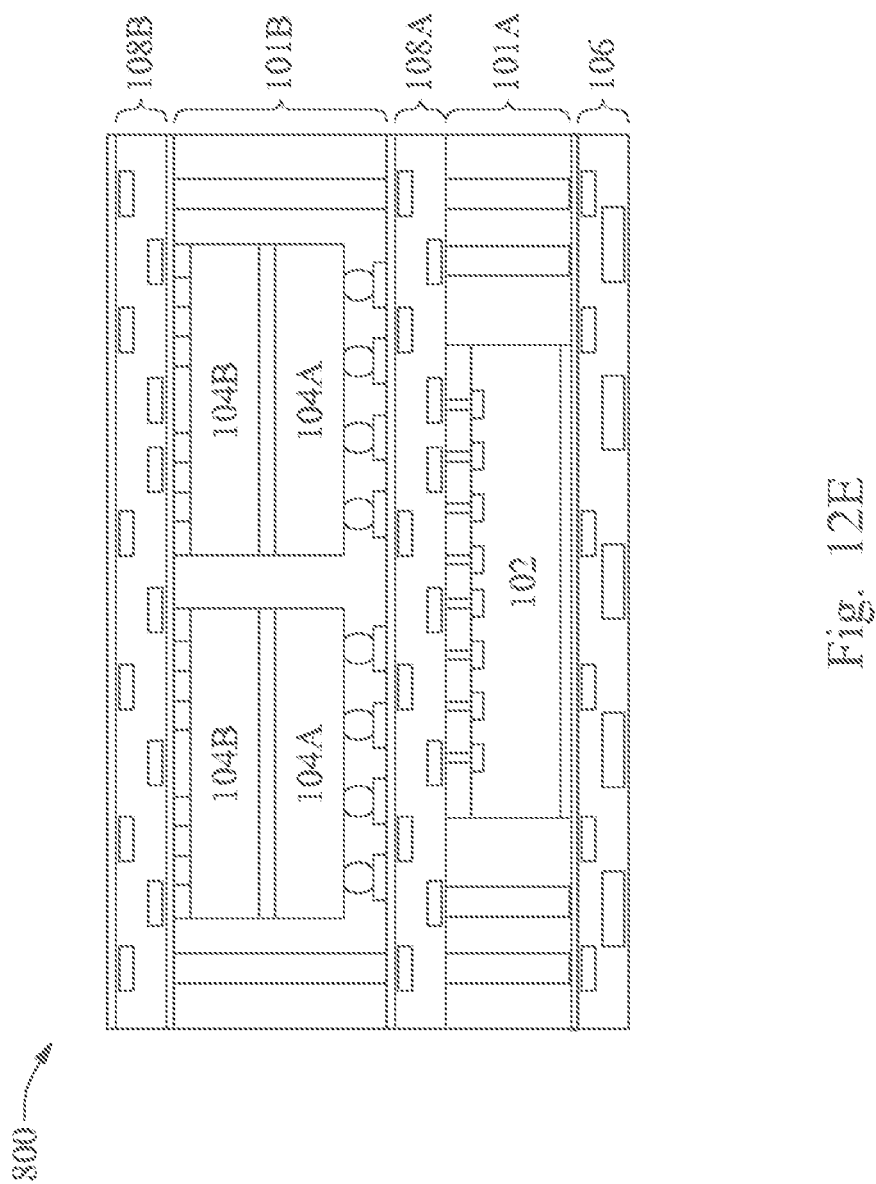
Figure 12F:
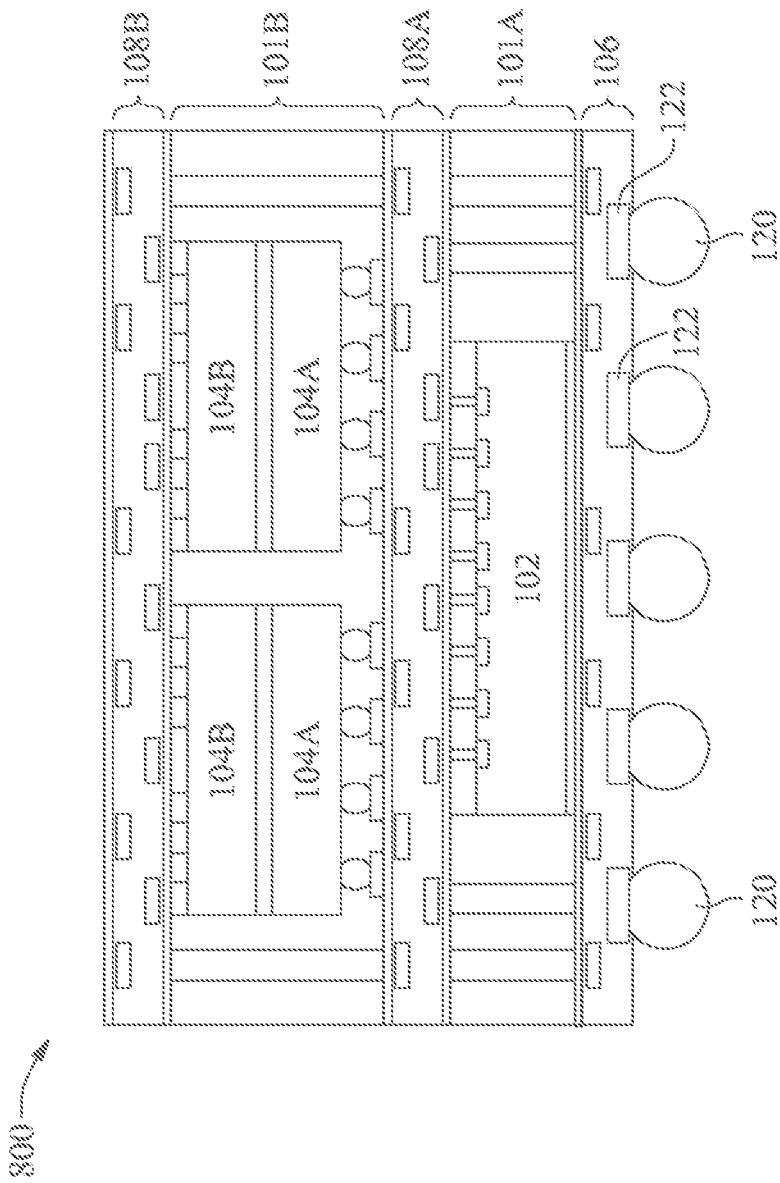

Although the illustrated device package has two fan-out tiers, any number of additional fan-out tiers may also be formed over tier 101B as desired based on package design. Also additional packages may be bonded to FS RDLs 108B or BS RDLs 106 with connectors (e.g., BGA balls, C4 bump, and the like). The package functions may include LPDDRx, WIO, SRAM, RF networking, power management, MEMS, and the like (not shown in the drawing). After various fan-out tiers are formed, carrier 134 may be removed as illustrated by FIG. 12E. In FIG. 12F, additional package features may be formed. For example, conductive features (e.g., contact pads 122) in BS RDLs 106 may be exposed by laser drilling, etching, and the like. Connectors 120 may be mounted on exposed contact pads 122. Connectors 120 may be BGA balls and may be used to bond the device package to other package components, such as, a printed circuit board. The package may be sawed from other device packages (not shown) along scribe lines.

Figure 13A:
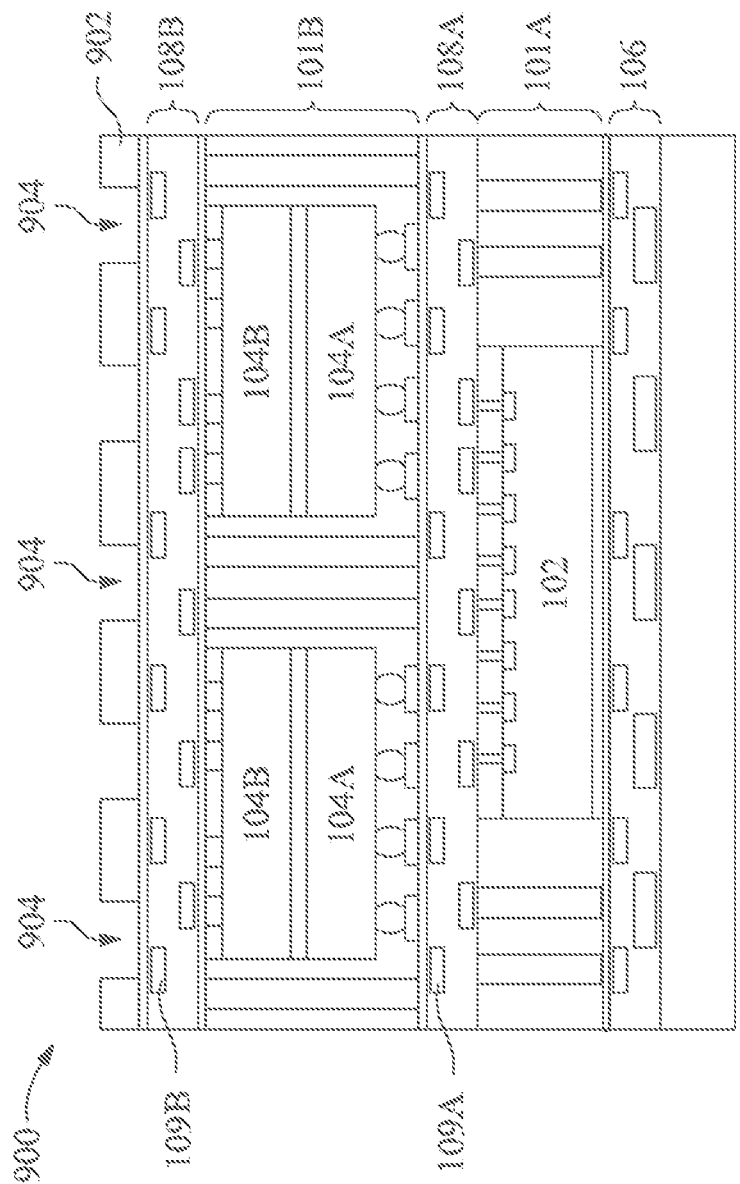
FIGS. 13A and 13B illustrate various intermediary steps of manufacturing the seventh device package with heat dissipation features in accordance with some embodiments.
Figure 13B:
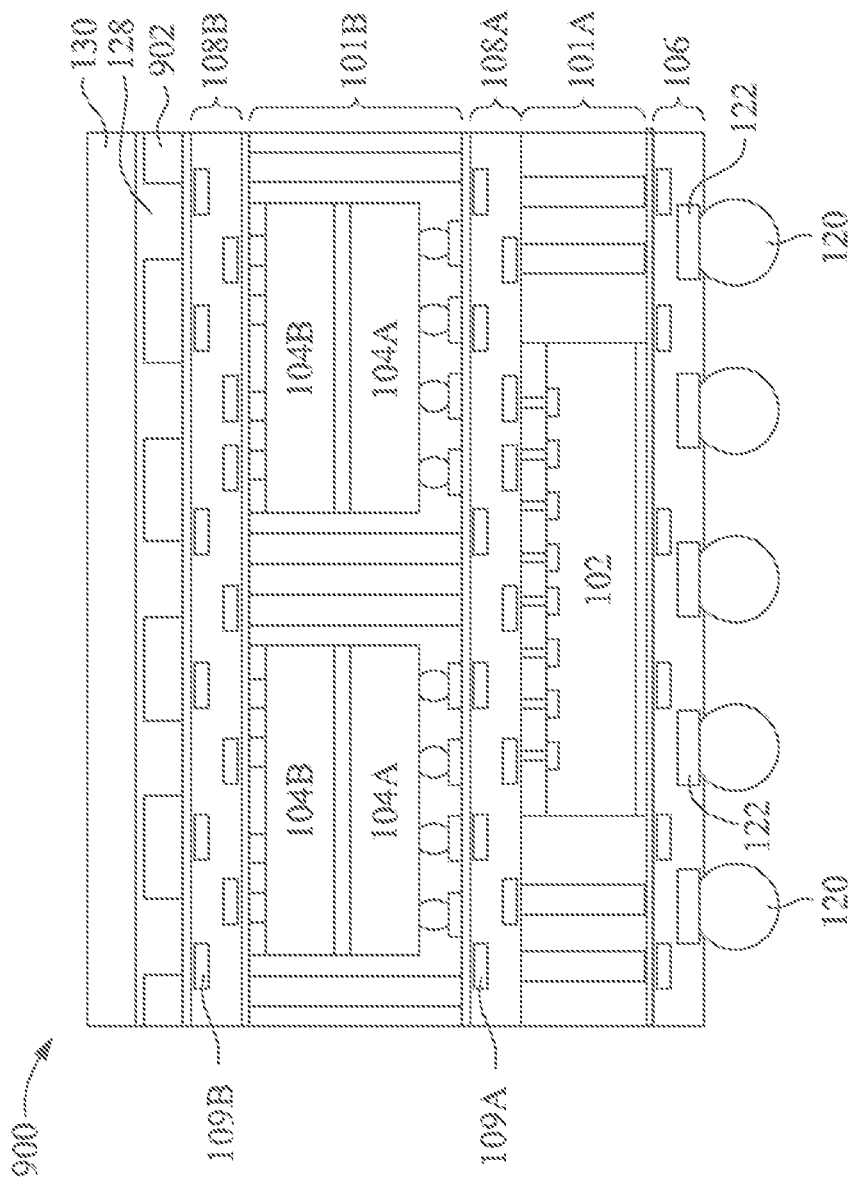

Other package features, such as various heat dissipation features may also be formed. For example, FIGS. 13A and 13B illustrate the formation of some heat dissipation features in accordance with some embodiments. In FIG. 13A, a device package 900 is provided. Device package 900 includes similar features to device package 800 at an intermediary manufacturing phase illustrated by FIG. 12D where like reference numerals indicate like elements.

As illustrated by FIG. 13A, a laminate film 902, such as Ajinomoto build-up film (ABF), may be laminated over a FS RDLs 108B. Laminate film 902 may be patterned (e.g., using a laser drilling process) to include openings 904, which expose thermal pads at a top surface of FS RDLs 108B. In some embodiments, such thermal pads may be conductive features 109B (e.g., a seed layer, contact pads, and the like) at a top surface of FS RDLs 108B. Such thermal pads may be thermally connected to dies 102 and/or 104 to allow for the dissipation of heat away from dies 102 and/or 104. Next, in FIG. 13B, a TIM 128 is disposed over laminate film 902. TIM 128 may also be disposed in openings 904 to contact thermal contacts in FS RDLs 108. Contour lid 130 may further be disposed over TIM 128.

Thus, heat dissipation features may be included in a device package 900, which may allow for the thermal dissipation of heat away from dies 102 and/or 104. Also additional packages may be bonded to FS RDLs 108B or BS RDLs 106 (e.g., using BGA balls, C4 bump, and the like). The package functions may include LPDDRx, WIO, SRAM, RF networking, power management, MEMS and the like (not shown in the drawing). In some embodiments, the use of a laminate film 902 rather than a dielectric allows for a laser drilling process to form openings 904 rather than traditional photolithography and/or etching processes, which may reduce overall process costs.

Figure 14:
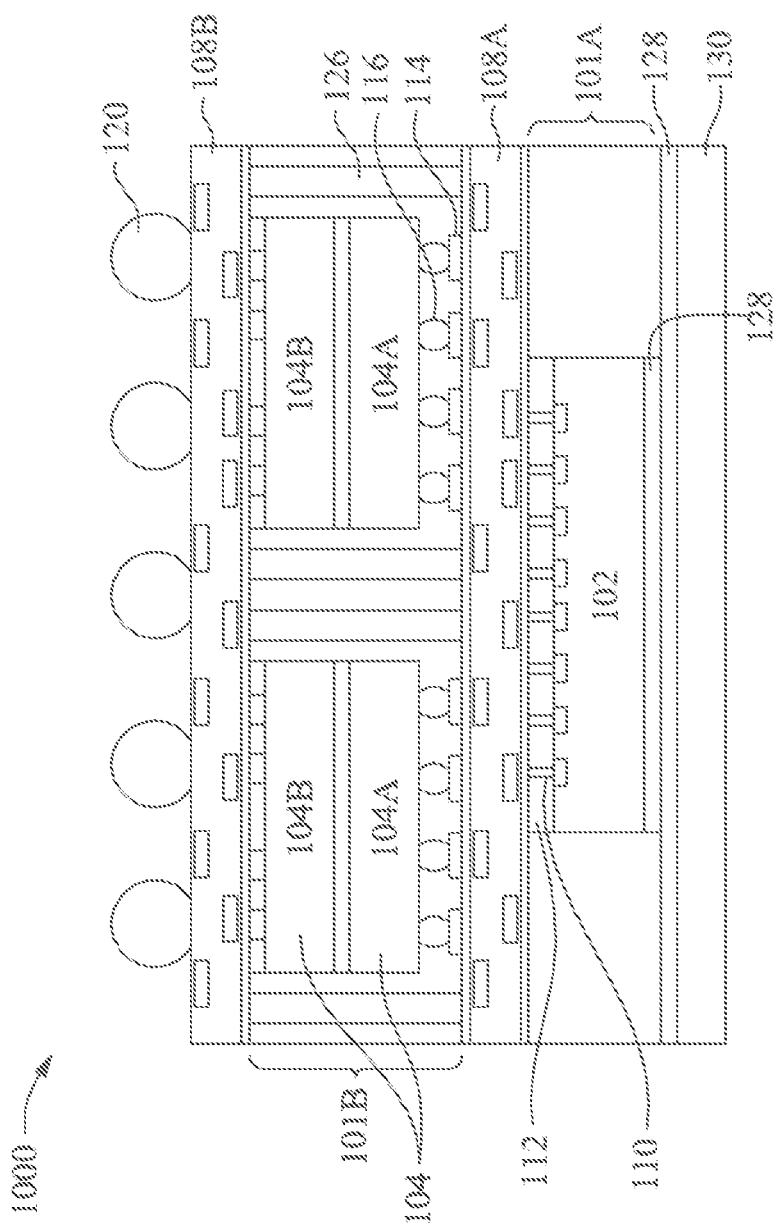
FIG. 14 illustrates a cross-sectional view of an eighth device package in accordance with some embodiments.

FIG. 14 illustrates a cross sectional view of device package 1000 in accordance with alternative embodiments. Device packages 1000 may be similar to the device package 800, where like reference numerals indicate like elements. However, device package 1000 may not include BS RDLs 106 on a backside of first fan-out tier 101A, and fan-out tier 101 may be substantially free of any TIVs. Instead, heat dissipation features (e.g., TIM 128 and contour lid 130) may be disposed on a backside of fan-out tier 101A. The heat dissipation features may further contact a backside of a core logic die 102. In some embodiments, die 102 be a high or highest power consuming die in device package 1000; thus, die 102 may generate a relatively large amount of heat compared to other dies (e.g., dies 104) in device package 1000. The configuration of heat dissipation features directly on a surface of die 102 allows for improved thermal management in device package 1000. Furthermore, the removal of TIVs in fan-out tier 101A and BS RDLs 106 allows for a simplified package configuration/signaling paths while still providing similar performance characteristics and functionalities as package 800. For example, the number of dies in package 1000 and 800 are the same.

Figure 15D:
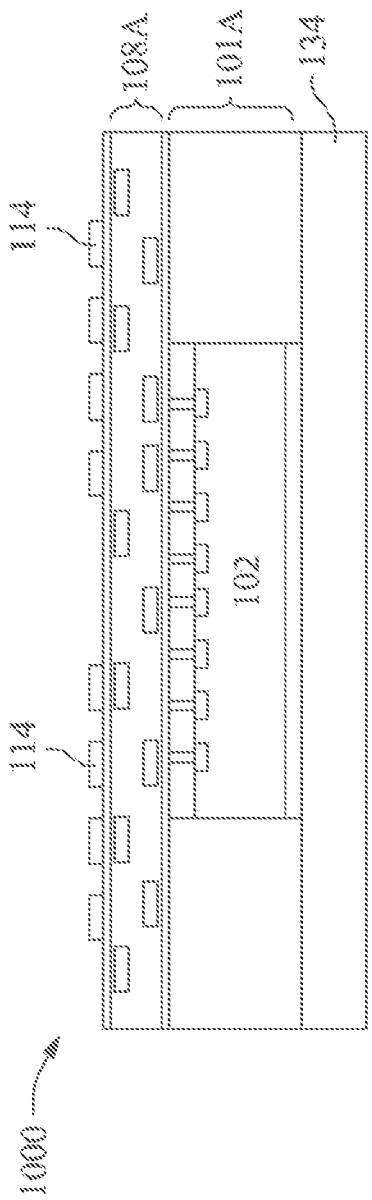
Figure 15E:
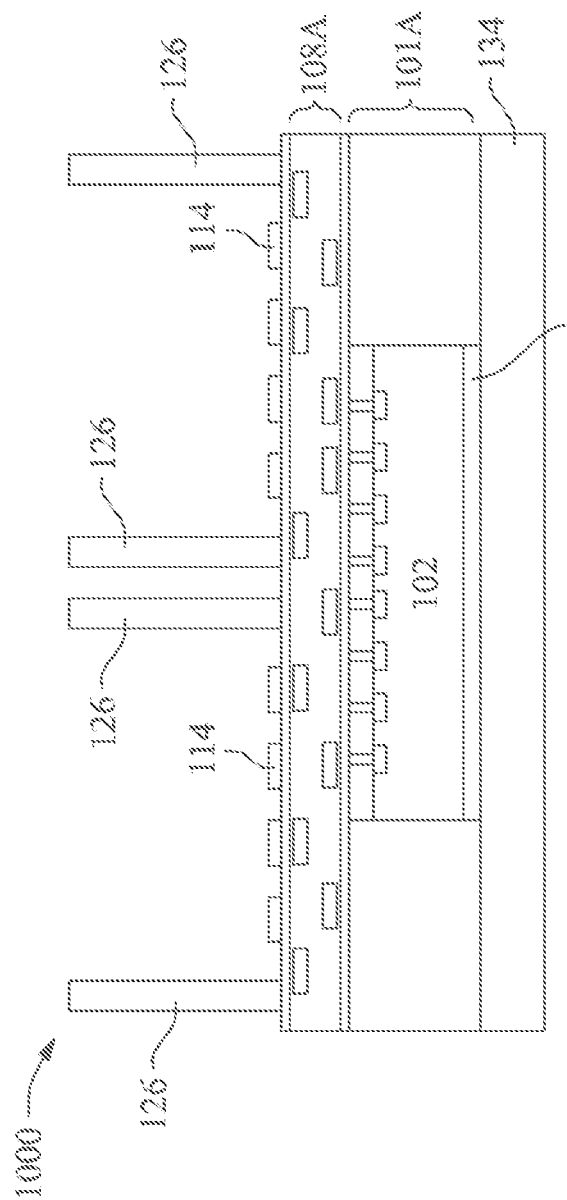

FIG. 15A through 15K illustrate various intermediary steps of manufacturing device package 1000 in accordance with some embodiments. FIG. 15A illustrates a core logic die 102 having contacts 110. A dielectric 112 (e.g., a passivation layer comprising a polymer) may be disposed around contacts 110, and an adhesive layer 118 (e.g., a DAF) may be disposed on a backside of die 102. In some embodiments, core logic die 102 may be a high power consuming die, which may provide core logic control functions in device package 1000. For example, die 102 may be the highest power consuming die in device package 1000. As a result, die 102 may also generate a relatively large amount of heat in device package 1000. In FIG. 12B, die 102 is adhered to carrier 134 through adhesive layer 118, and in FIG. 15C a wafer lever molding is performed. For example, a molding compound 124 may be dispensed around die 102, and a planarization may be performed to expose contacts 110. Thus, a first fan-out tier 101 is completed.

As illustrated by FIG. 15D, a FS RDLs 108A is formed over a first fan-out tier 101A, and contacts (e.g., UBMs 114) are formed over FS RDLs 108A. Die 102 may be electrically connected to FS RDLs 108A. Next, in FIG. 15E, TIVs 126 may be formed over peripheral and central regions of FS RDLs 108A. The formation of TIVs 126 may include using a photoresist to define a shape of TIVs 126 and using an electro-chemical plating process (e.g., a uni-directional plating process grown from a seed layer disposed on a top surface of FS RDLs 108A). In alternative embodiments, TIVs 126 may only be disposed in peripheral regions of FS RDLs 108A (see, e.g., FIG. 1A).

Figure 15F:
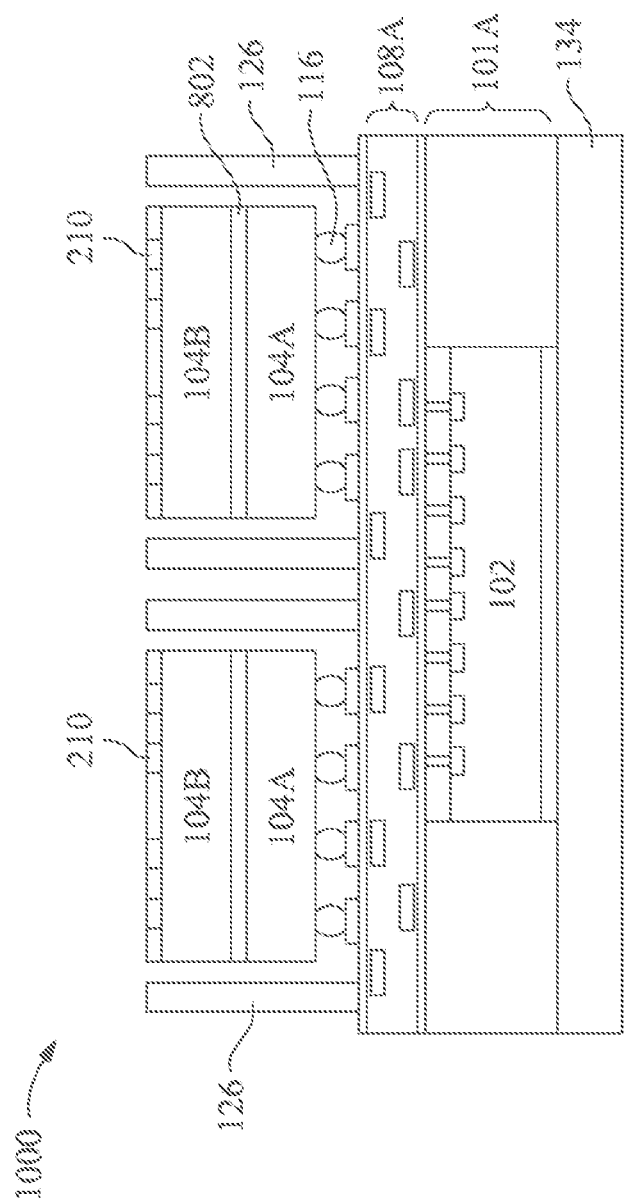
Figure 15G:
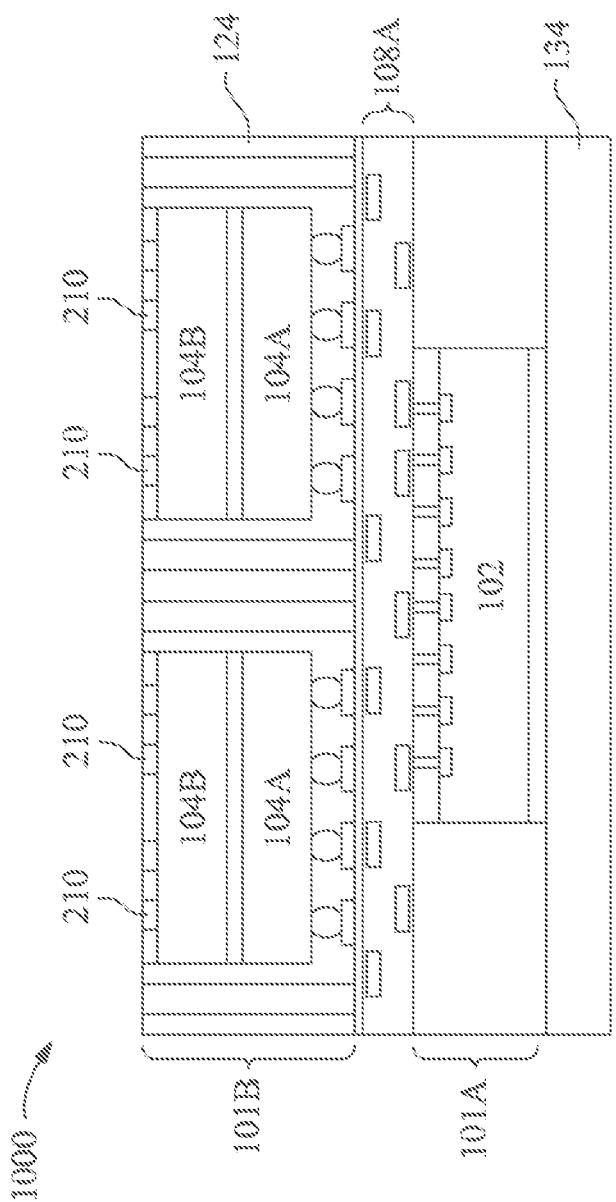

Subsequently, in FIG. 15F, semiconductor dies (e.g., dies 104A bonded to dies 104B) may be bonded (e.g., flip chip bonded) to UBMs 114 over FS RDLs 108A. A back surfaces of dies 104A may be bonded to a back surfaces of dies 104B by an adhesive layer 802. Connectors 116 (e.g., microbumps, C4 bumps, BGA balls, and the like) of dies 104A may be bonded to UBMs 114 over FS RDLs 108A. Dies 104A may be electrically connected to FS RDLs 108A, which may electrically connect dies 104A to die 102. Referring next to FIG. 15G, a wafer level molding/grind back may be performed. For example, a molding compound 124 may be dispensed between the bonded dies 104A/104B and TIVs 126. The molding compound may be planarized to expose connectors (e.g., pillar bumps 210) on a front side of dies 104B. Thus, a second fan-out tier 101B is completed in device package 1000.

Figure 15H:
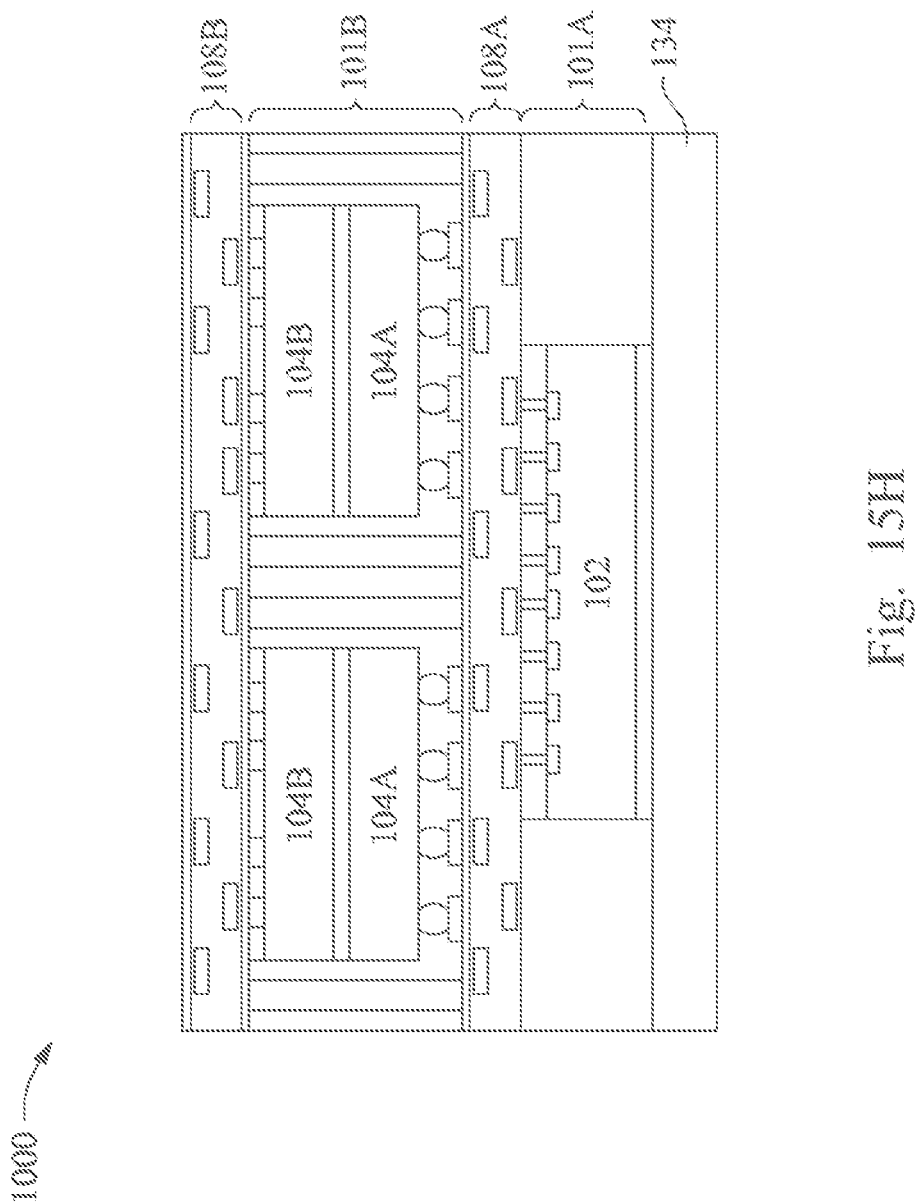

FIG. 15H illustrates the formation of FS RDLs 108B over tier 101B. FS RDLs 108B may be substantially similar to FS RDLs 108A. FS RDLs 108B may be electrically connected to pillar bumps 210 of dies 104B. TIVs 126 in tier 101B electrically connect FS RDLs 108A to FS RDLs 108B, and thus, dies 104B may be electrically connected to die 102 and optionally dies 104A through FS RDLs 108B, FS RDLs 108A, and various TIVs 126 in package 1000.

Figure 15I:
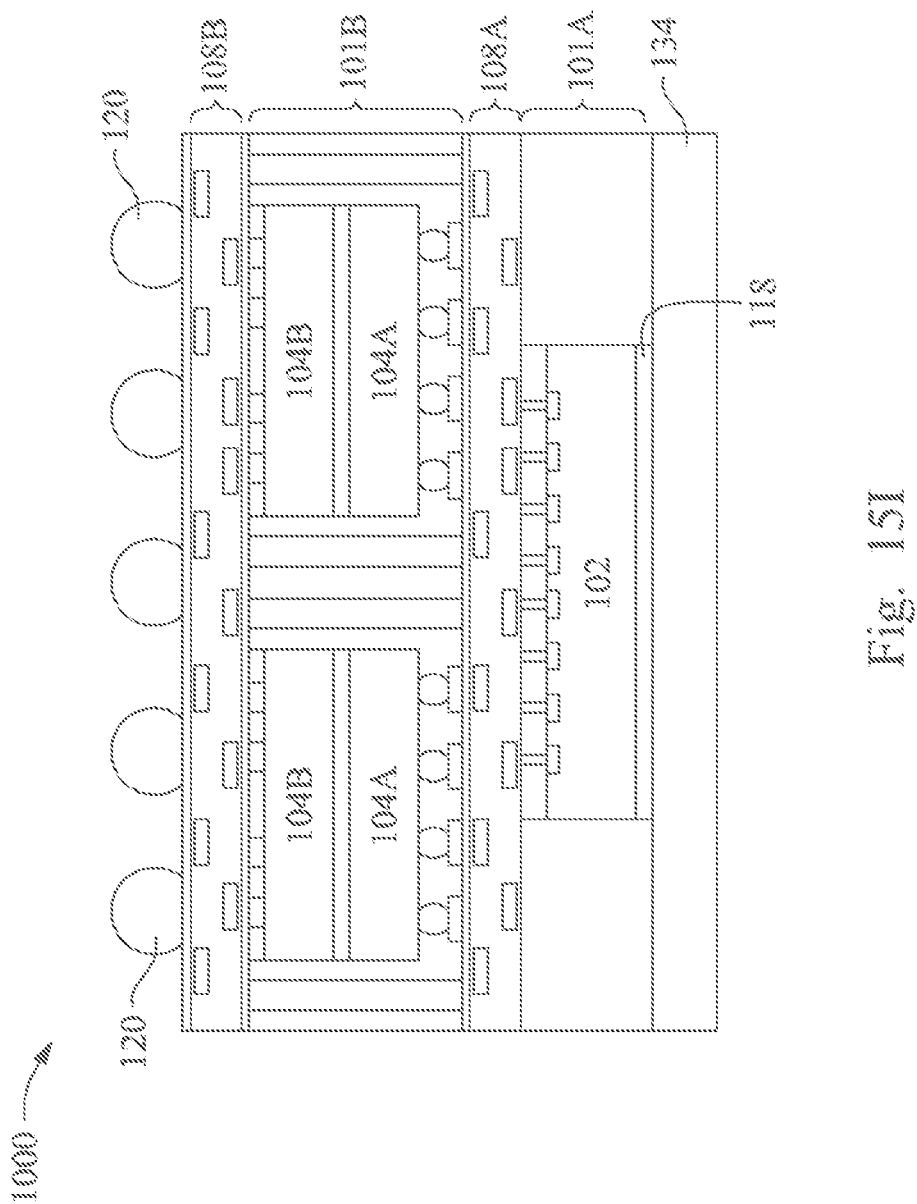
Figure 15J:
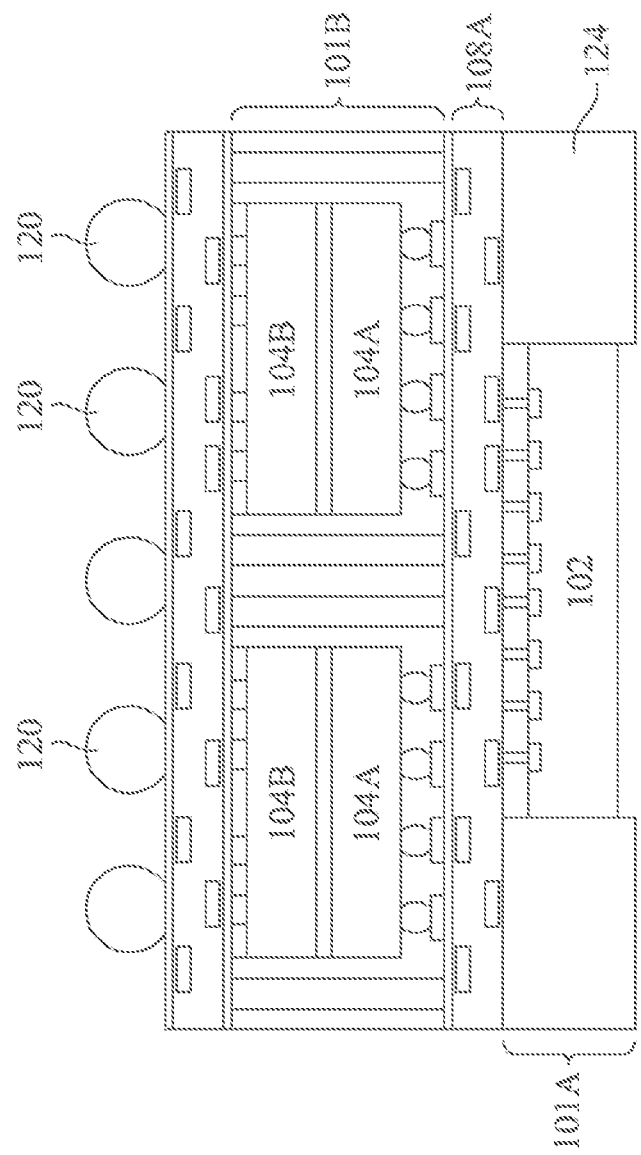

Although the illustrated device package has two fan-out tiers, any number of additional fan-out tiers may also be formed over tier 101B as desired based on package design. After various fan-out tiers are formed, connectors 120 may be disposed over package 1000. Connectors 120 may be BGA balls and may be used to bond the device package to other package components, such as, a printed circuit board. The resulting structure is illustrated in FIG. 15I.

After connectors 120 are attached, carrier 134 and adhesive layer 118 are removed. For example, when adhesive layer 118 is a DAF, heat may be applied to release carrier 134 and remove adhesive layer 118. In the resulting structure, bottom surfaces of molding compound 124 and die 102 may not be substantially level. For example, in the orientation illustrated by FIG. 15J, a bottom surface of die 102 may be higher than a bottom surface of molding compound 124.

Figure 15K:
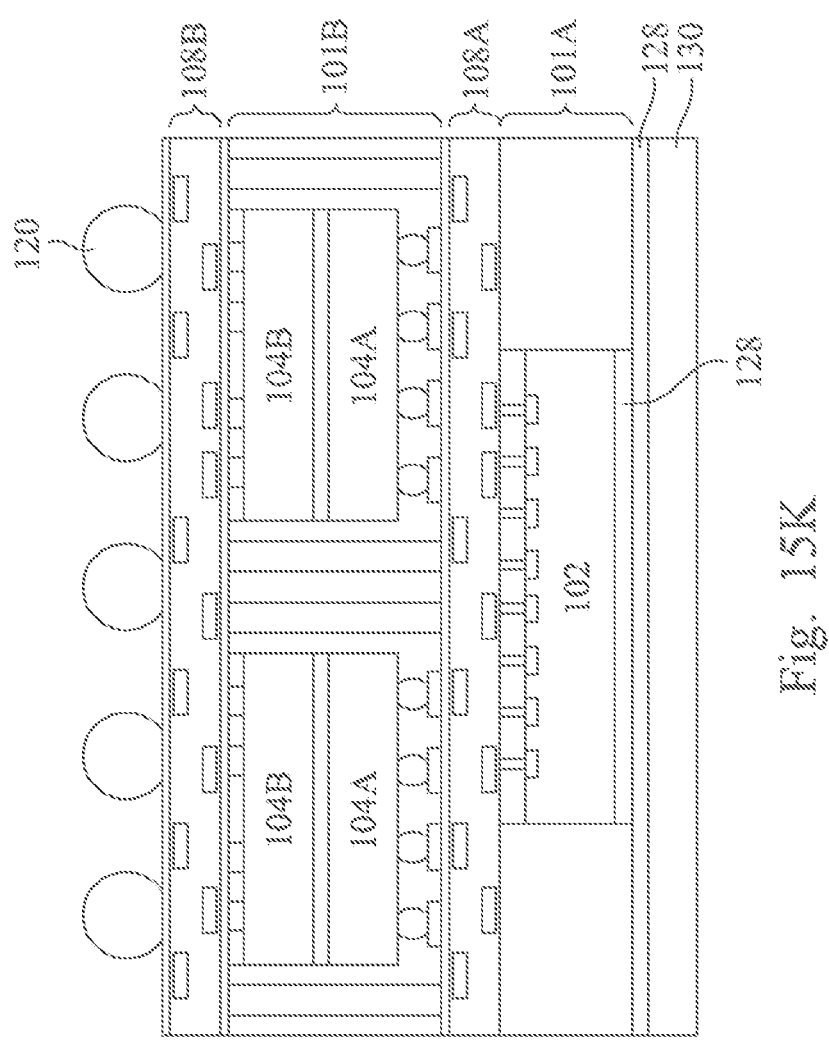

In FIG. 15K, heat dissipation features may be disposed on a back surface of die 102 and fan-out tier 101A. The heat dissipation may include a TIM 128 contacting a backside of die 102 and a contour lid 130 on TIM 128. Because die 102 may be a high power consuming die (e.g., generating a relatively high amount of heat), the direct disposition of heat dissipation features on die 102 may allow for improved thermal management in package 1000. Furthermore, in package 1000, heat may be dissipated through a bottom surface of die 102 rather than dissipating upwards through dies 104 (e.g., in the configuration illustrated by FIG. 13B). Thus, the performance of dies 104 may be at a lower risk of thermal cross talk generated by die 102. The package may then be sawed from other device packages (not shown) along scribe lines.

Figure 16:
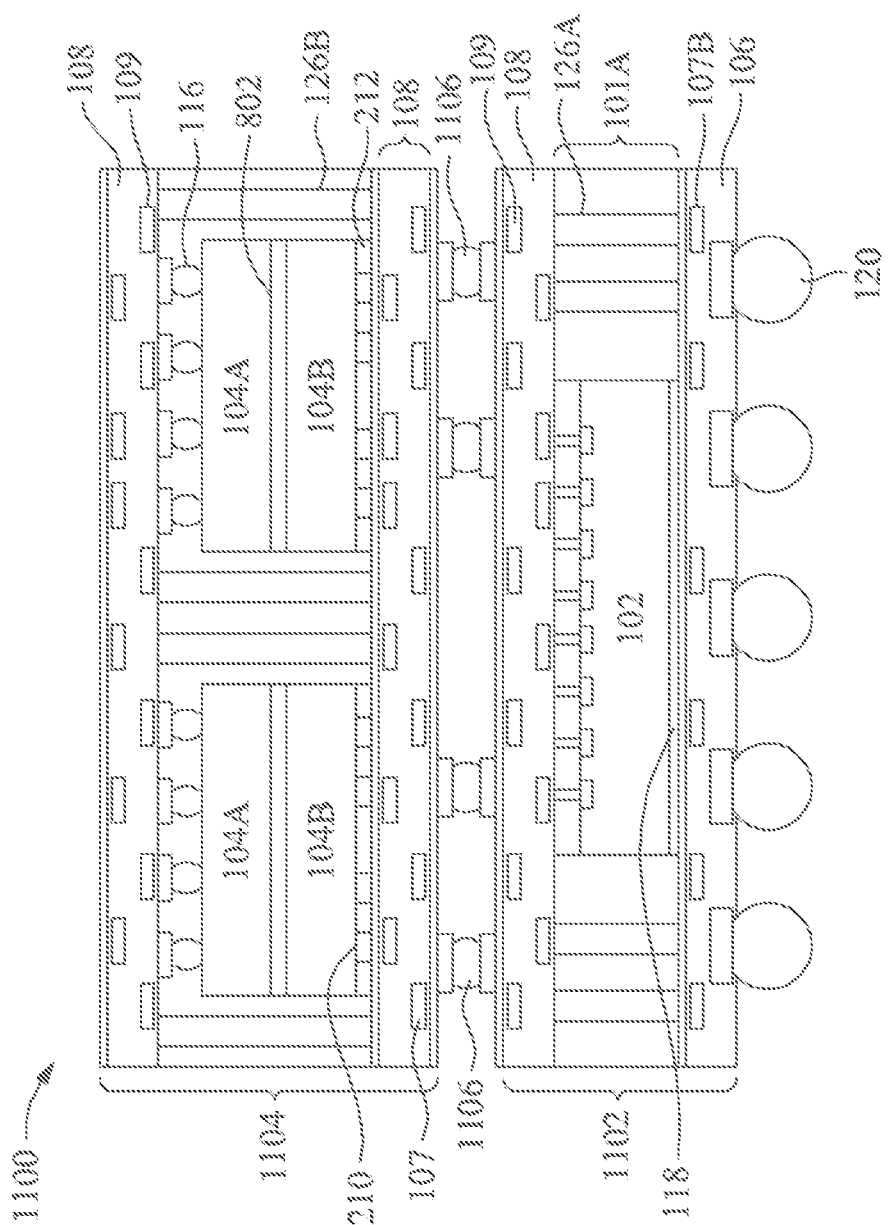
FIG. 16 illustrates a cross-sectional view of a ninth device package in accordance with some embodiments.

FIG. 16 illustrates a cross sectional view of device package 1100 in accordance with alternative embodiments. Device packages 1100 may be similar to the device package 800, where like reference numerals indicate like elements. However, device package 1100 may have a package on package (PoP) configuration. For example, a bottom package 1102 may be bonded to a top package 1104 by connectors 1106 (e.g., BGA balls, C4 bumps, microbumps, and the like). Bottom package 1102 may include various fan-out RDLs 106/108 and a core logic die 102. Top package 1104 may include various fan-out RDLs 108 and bonded dies 104A and 104B. Packages 1102 and 1104 may be formed in separate process steps and functional tests (e.g., electrical and/or mechanical tests) may be performed on each package 1102 and 1104 prior to bonding. Thus, only known good packages (KGPs) may be bonded in the final package allowing for improved yield.

Furthermore, the separate formation of packages 1102 and 1104 allows for modular configuration of various device packages 1100. For example, different packages 1104 having different technical specifications (e.g., memory space, and the like) may be bonded to packages 1102 formed using the same process steps. A common bottom package 1102 may be bonded to different top packages 1104 depending on device design. Therefore, increased flexibility during the manufacturing process may be advantageously achieved.

Figure 17A:
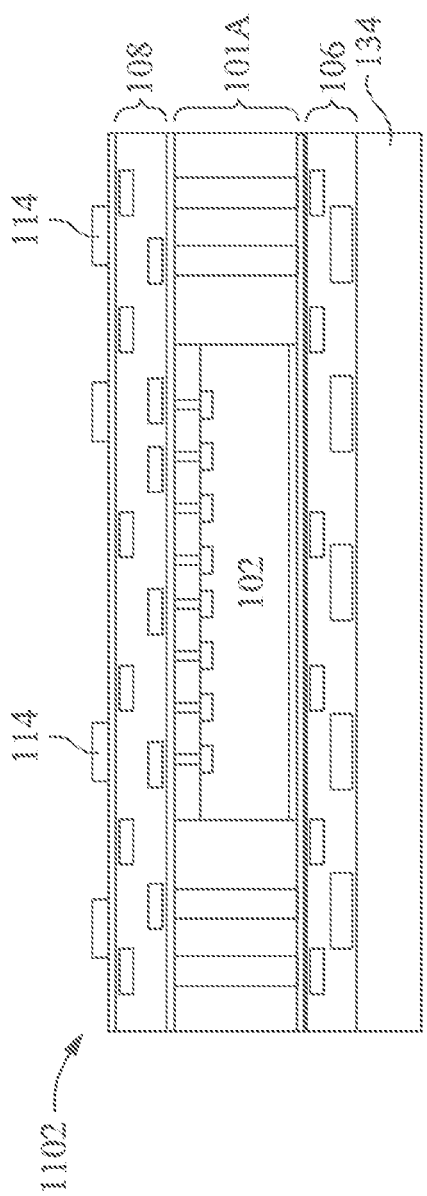
FIG. 17A through 17G illustrate various intermediary steps of manufacturing the ninth device package in accordance with some embodiments.
Figure 17B:
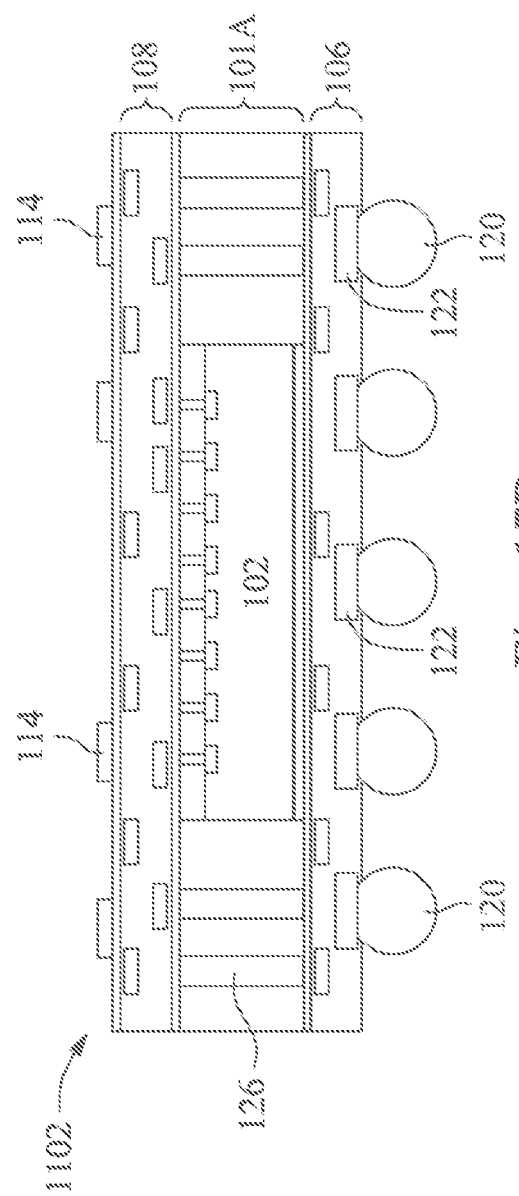

FIG. 17A through 17F illustrate various intermediary steps of manufacturing device package 1100 in accordance with some embodiments. FIGS. 17A and 17B illustrate the formation of bottom package 1102. In FIG. 17A, a portion of package 1102 during an intermediary step of manufacture is illustrated. The structure illustrated by FIG. 17A is substantially similar as the structure of FIG. 2G, and substantially similar process steps as those illustrated in FIGS. 2A through 2G may be used to form the structure of FIG. 17A. Thus, detailed description of the formation of FIG. 17A is omitted for brevity.

As illustrated by FIG. 17A, a FS RDLs 108 is formed over a first fan-out tier 101A, and contacts (e.g., UBMs 114) are formed over FS RDLs 108. Tier 101A includes TIVs 126A and a core logic die 102 electrically connected to FS RDLs 108. BS RDLs 106 may be disposed on a backside of tier 101A, and TIVs 126A may electrically connect FS RDLs 108 to BS RDLs 106. A carrier 134 may be used to provide temporary structural support for package 1102 during the formation of various features illustrated by FIG. 17A.

Next, in FIG. 17B, package 1102 may be removed from carrier 134. Additional package features may also be formed. For example, conductive features (e.g., contact pads 122) in BS RDLs 106 may be exposed by laser drilling, etching, and the like. Connectors 120 may be mounted on exposed contact pads 122. Connectors 120 may be BGA balls and may be used to bond the device package to other package components, such as, a printed circuit board. Package 1102 may be sawed from other device packages (not shown) along scribe lines. Thus, bottom package 1102 is formed. After bottom package 1102 is formed, functional tests (e.g., electrical and/or structural tests) are performed, and only KGPs (e.g., packages passing such functional tests) may be processed further. In some embodiments, packages 1102 that fail such functional tests may be reworked so that the functional tests are passed.

Figure 17C:
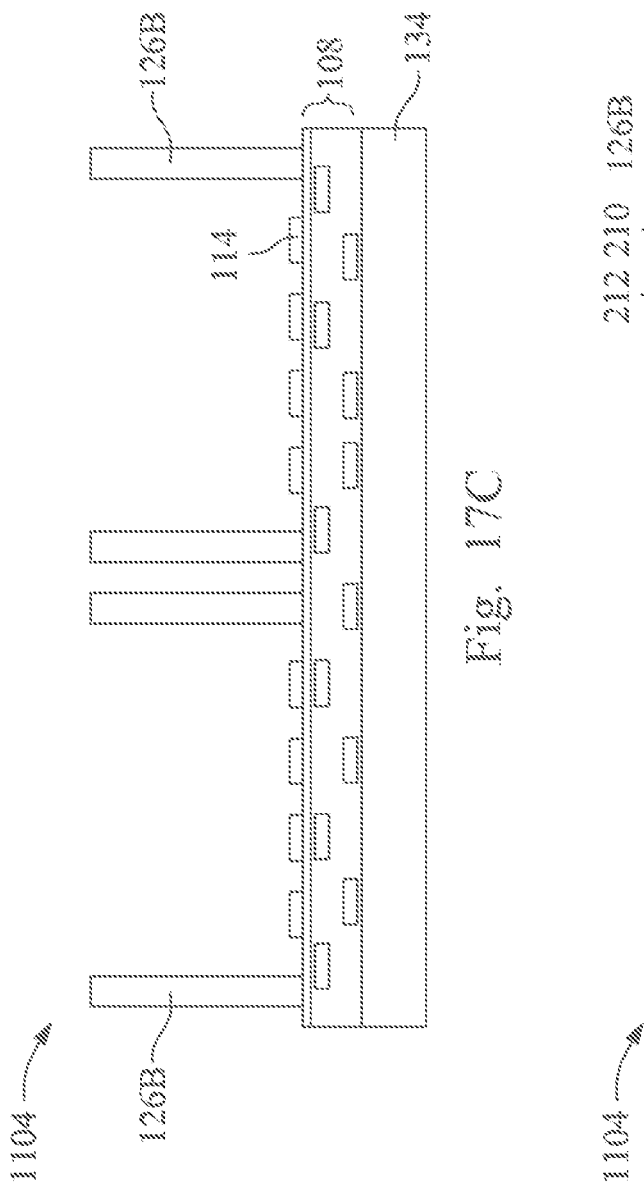

FIGS. 17C through 17F illustrate various intermediary steps during the formation of a top package 1104. In FIG. 17C, a carrier 134 is provided, and RDLs 108 and TIVs 126B may be formed over carrier 134. The formation of RDLs 108 and TIVs 126B may be done using substantially similar process steps as those described with respect to FIGS. 2A through 2C, and detailed description of their formation is omitted for brevity. Additionally, UBMs 114 may be formed over RDLs 108.

Figure 17D:
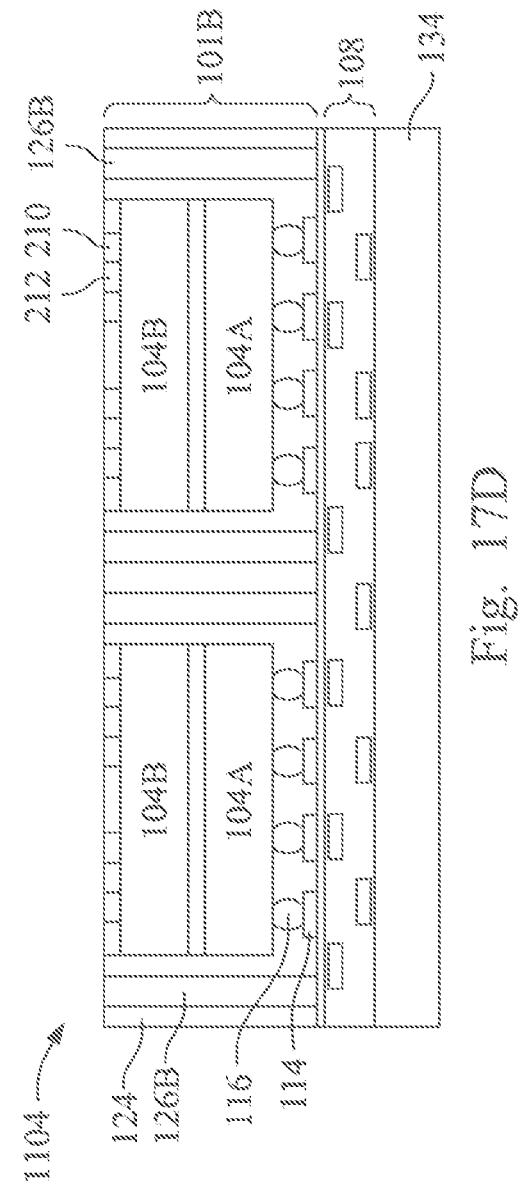

Subsequently, in FIG. 17D, semiconductor dies (e.g., dies 104A bonded to dies 104B) may be bonded (e.g., flip chip bonded) to UBMs 114 over RDLs 108. A back surfaces of dies 104A may be bonded to a back surface o dies 104B by an adhesive layer 802. Connectors 116 (e.g., microbumps, C4 bumps, BGA balls, and the like) of dies 104A may be bonded to UBMs 114 over RDLs 108. Dies 104A may be electrically connected to RDLs 108, which may electrically connect dies 104A to die 102. Furthermore, a wafer level molding/grind back may be performed. For example, a molding compound 124 may be dispensed between the bonded dies 104A/104B and TIVs 126B. The molding compound may be planarized to expose connectors (e.g., pillar bumps 210) on a front side of dies 104B. Thus, a second fan-out tier 101B is completed in package 1104.

Figure 17E:
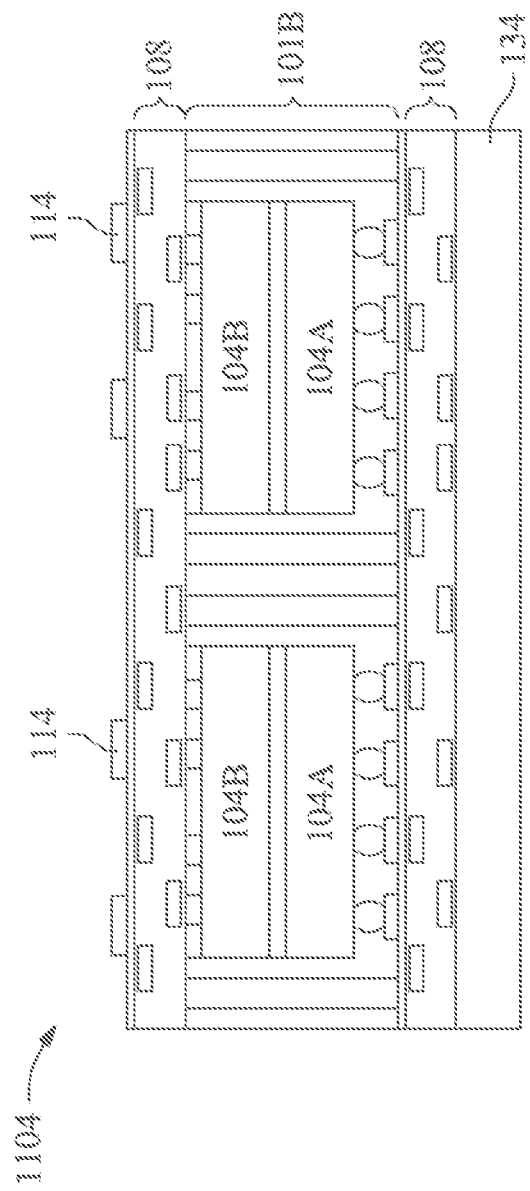

FIG. 17E illustrates the formation of additional RDLs 108 over tier 101B. RDLs 108 may be electrically connected to pillar bumps 210 of dies 104B. TIVs 126B in tier 101B electrically connect RDLs 108 in package 1104. In some embodiments, dies 104B may optionally be electrically connected dies 104A through FS RDLs 108 and TIVs 126B. UBMs 114 (or other contact pads) may further be disposed over a top surface of package 1104.

Figure 17F:
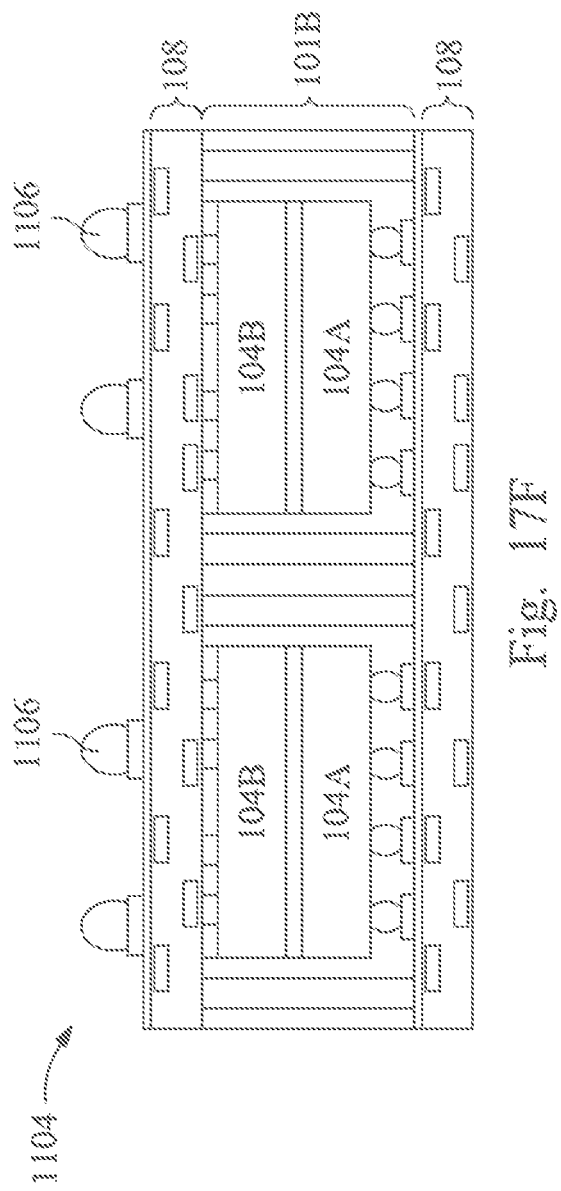
Figure 17G:
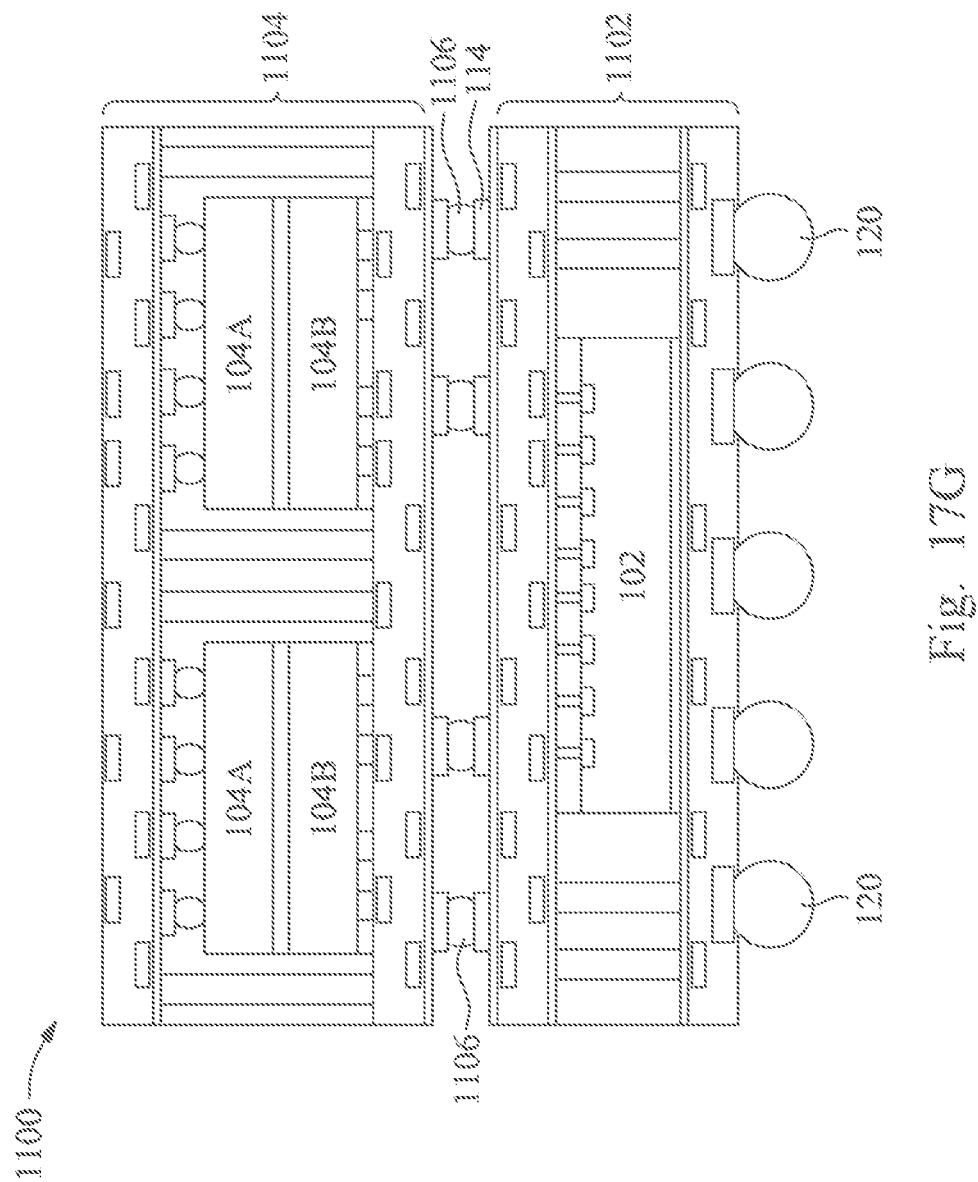

Although the illustrated device package 1104 has one fan-out tiers, any number of additional fan-out tiers may also be formed over tier 101B as desired based on package design. Furthermore, while tier 101B includes a particular configuration of two bonded dies (e.g., dies 104A bonded to dies 104B by adhesive layer 802) bonded to RDLs 108, various tiers in package 1104 may include dies bonded to RDLs 108 in any configuration (e.g., see dies 104A in tier 101B of FIG. 1A). After various fan-out tiers are formed, carrier 134 may be removed as illustrated by FIG. 17F and additional package features may be formed. Connectors 1106 may be mounted on UBMs 114 over package 1104. Connectors 1106 may be BGA balls, C4 bumps, microbumps, and the like. Thus, top package 1104 is formed. After top package 1104 is formed, functional tests (e.g., electrical and/or structural tests) are performed, and only KGPs (e.g., packages passing such functional tests) may be processed further. In some embodiments, packages 1104 that fail such functional tests may be reworked so that the functional tests are passed. Subsequently, connectors 1106 may be used to bond the package 1104 to package 1102 as illustrated by FIG. 17G. Thus, package 1100 having a bottom package 1102 bonded to a top package 1104 may be formed.

Figure 18:
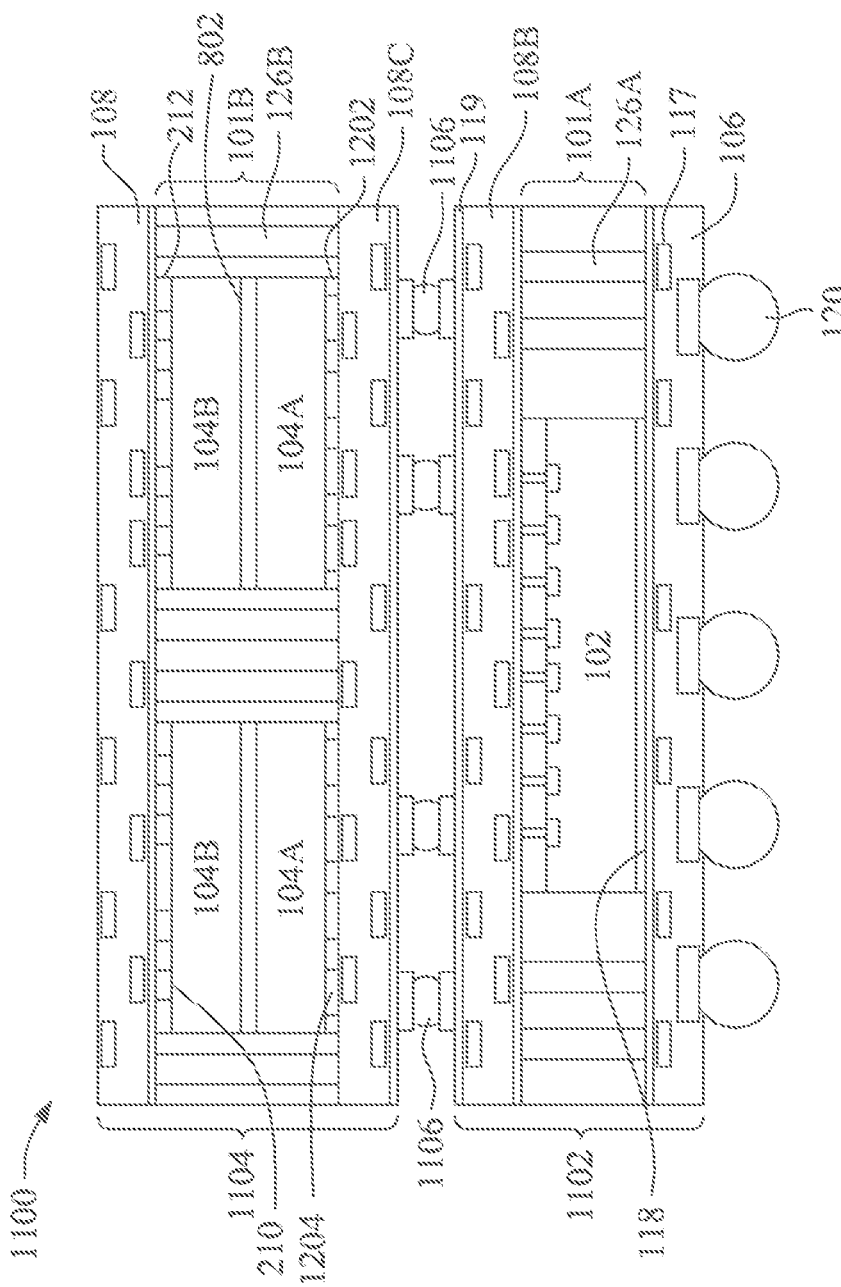
FIG. 18 illustrates a cross-sectional view of a tenth device package in accordance with some embodiments.

FIG. 18 illustrates a cross sectional view of device package 1200 in accordance with alternative embodiments. Device packages 1200 may be similar to the device package 1100, where like reference numerals indicate like elements. However, device package 1200 may include a differently configured top package 1104. For example, in package 1200, top package 1104 includes dies 104A, which are attached to RDLs 108 in a different manner than dies 104A in package 1100. The formation process of package 1104 may also be different as detailed below with respect to FIGS. 19A through 19I. Bottom package 1102 may remain substantially similar, and detailed description of package 1102 is omitted for brevity.

Figure 19C:
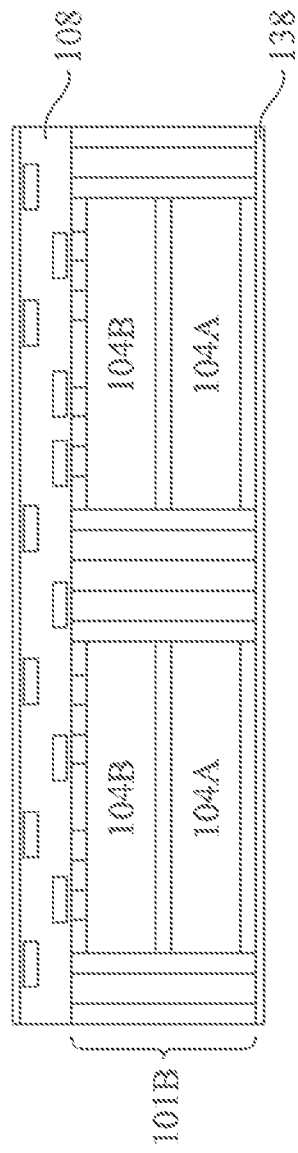

FIG. 19A through 19I illustrate various intermediary steps of manufacturing device package 1104 in accordance with some embodiments. In FIG. 19A, a carrier 134A is provided TIVs 126B may be formed over carrier 134B. The formation TIVs 126B may include depositing a seed layer 138, using a patterned photoresist to define a shape of TIVs 126B, and an electro-chemical plating process.

Additionally, semiconductor dies (e.g., dies 104A bonded to dies 104B) may be bonded (e.g., flip chip bonded) to carrier 134A. A laminated film (e.g., ABF 1202) may be disposed on a front surface of dies 104A, and dies 104A may be oriented face-down towards carrier 134A. For example, ABF 1202 may contact seed layer 138. Back surfaces of dies 104A may be bonded to a back surface o dies 104B by an adhesive layer 802. Next, in FIG. 19B, a wafer level molding/grind back may be performed. For example, a molding compound 124 may be dispensed between the bonded dies 104A/104B and TIVs 126B. The molding compound may be planarized to expose connectors (e.g., pillar bumps 210) on a front side of dies 104B. Thus, a second fan-out tier 101B is completed in package 1104.

Figure 19D:
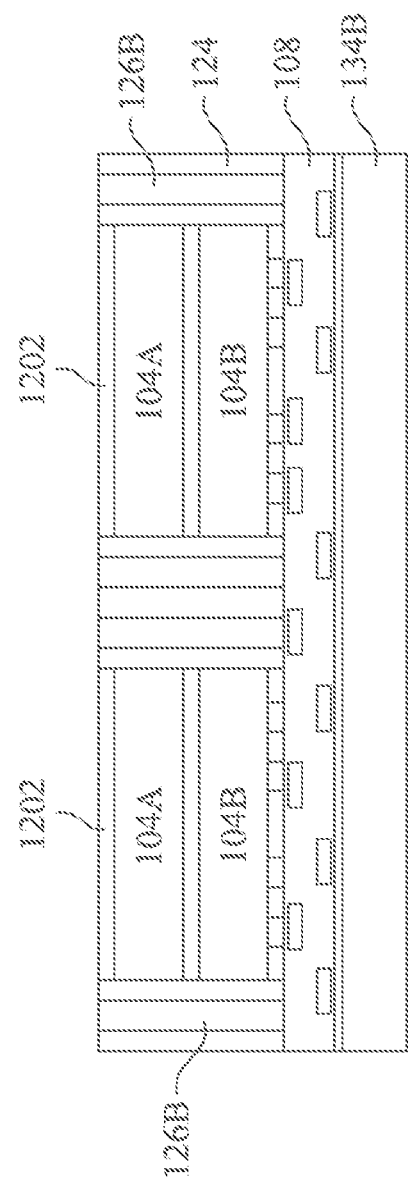

FIG. 19C illustrates the formation of RDLs 108 over tier 101B. RDLs 108 may be electrically connected to pillar bumps 210 of dies 104B and TIVs 126B. Subsequently, carrier 134A is removed. In FIG. 19D, the orientation of tier 101B is flipped (e.g., dies 104A are disposed over dies 104B), and RDLs 108 are attached to another carrier 134B. Alternatively, RDLs 108 may be attached to a same carrier 134A. Subsequently, ABF 1202 is exposed by removing seed layer 138. For example, a planarization (e.g., CMP or etch back) may be performed to remove seed layer 138.

Figure 19E:
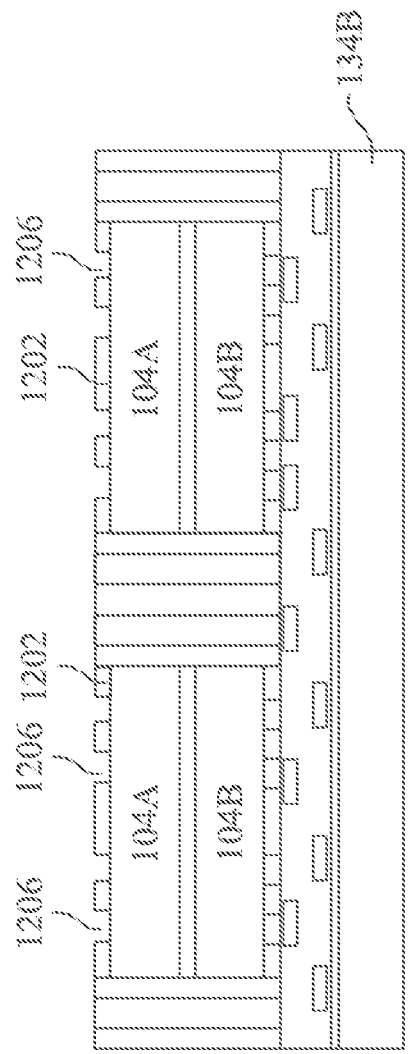

In FIG. 19E, openings 1206 are patterned in ABF 1202. Openings 1206 may expose conductive features (e.g., contact pads, not shown) at a top surface of dies 104. Subsequently, in FIG. 19F, openings 1206 are filled with a conductive material to form contacts 1204. The filling of openings 1206 may include the deposition of a seed layer and an electro-chemical plating process, for example.

Figure 19F:
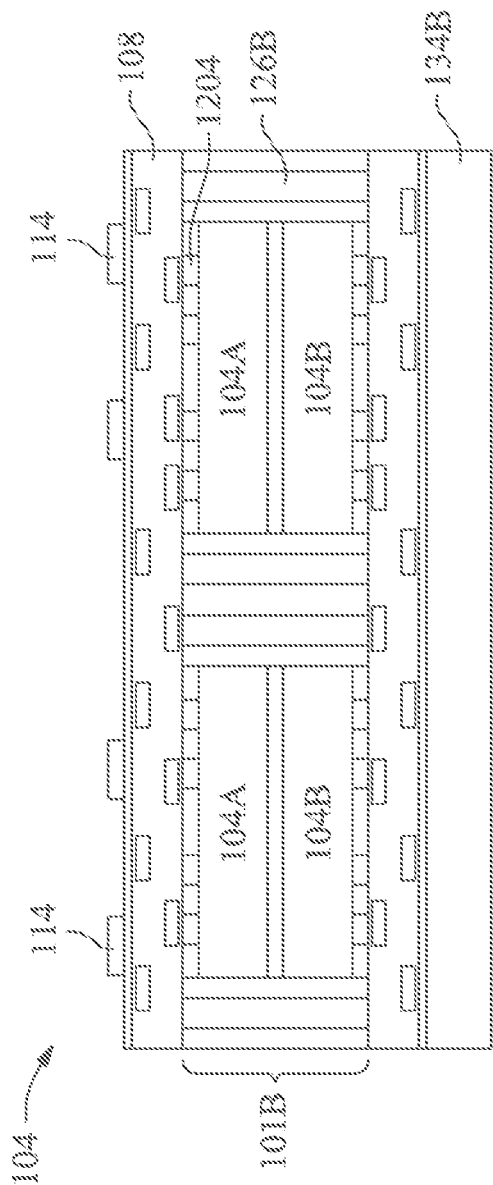

As further illustrated in FIG. 19F, additional RDLs 108 may be formed over tier 101B. TIVs 126B electrically connect RDLs 108 in package 1104. In some embodiments, dies 104B may be optionally electrically connected dies 104A through FS RDLs 108 and TIVs 126B. UBMs 114 (or other contact pads) may further be disposed over a top surface of package 1104. Next, referring to FIG. 19G, connectors 1106 may be mounted on UBMs 114 over package 1104. Connectors 1106 may be BGA balls, C4 bumps, microbumps, and the like, and connectors 1106 may be used to bond the package 1104 to package 1102 as illustrated by FIG. 19I.

Although the illustrated device package 1104 has one fan-out tiers, any number of additional fan-out tiers may also be formed over tier 101B as desired based on package design. Furthermore, while tier 101B includes two bonded dies (e.g., dies 104A bonded to dies 104B by adhesive layer 802), various tiers in package 1104 may include individual dies bonded to RDLs 108 (e.g., see dies 104A in tier 101B of FIG. 1A). After various fan-out tiers are formed, carrier 134 may be removed as illustrated by FIG. 19H. Thus, top package 1104 is formed. After top package 1104 is formed, functional tests (e.g., electrical and/or structural tests) are performed, and only KGPs (e.g., packages passing such functional tests) may be processed further. In some embodiments, packages 1104 that fail such functional tests may be reworked so that the functional tests are passed. Subsequently, connectors 1106 may be used to bond the package 1104 to package 1102 as illustrated by FIG. 19I. Thus, package 1200 having a bottom package 1102 bonded to a top package 1104 may be formed.

Figure 20:
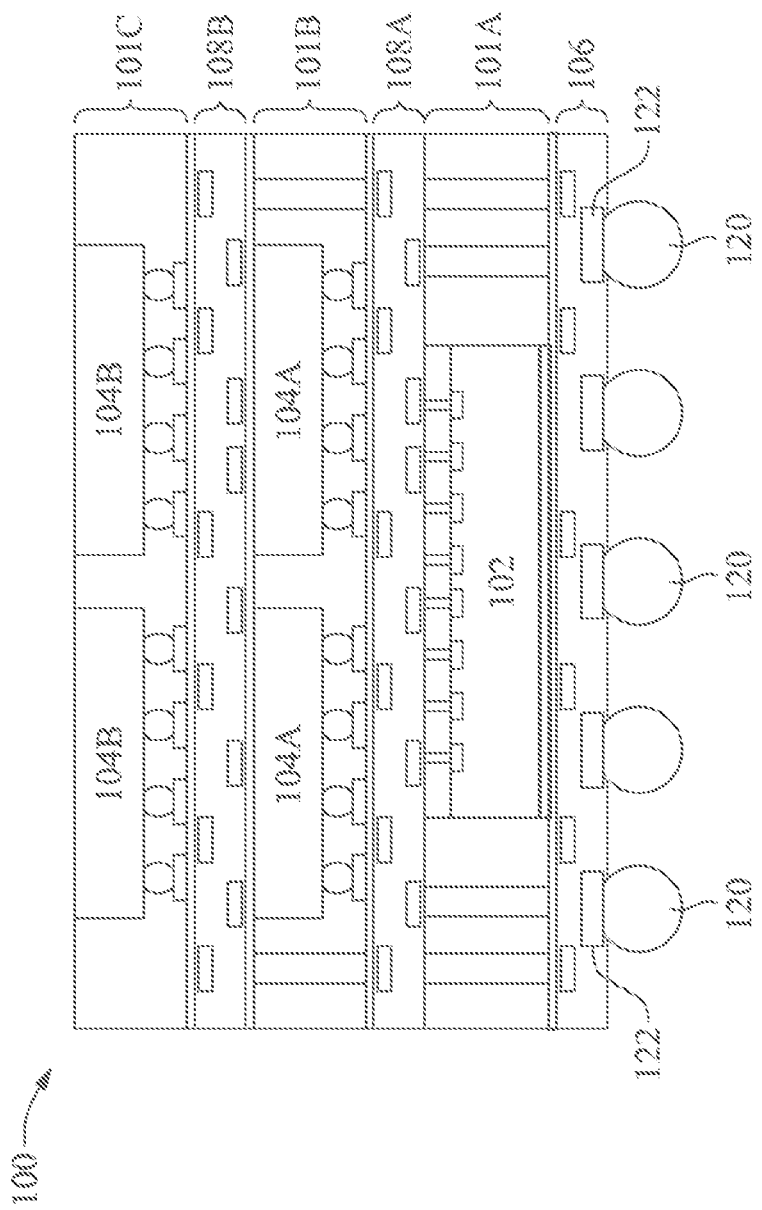
FIG. 20 illustrates a process flow for forming a device package having through-intervias (TIVs) and redistribution layers (RDLs) in accordance with some embodiments.

FIG. 20 illustrates a process flow 1300 for forming a device package in accordance with some embodiments. In step 1302, one or more backside RDLs (e.g., BS RDLs 106) is formed. The backside RDLs may include conductive features, which may be used a contact pads (e.g., pads 122) for external connectors in subsequent process steps. In step 1304, a fan-out tier (e.g., fan-out tier 101A of FIG. 1A) is formed over the one or more backside RDLs. In step 1306, one or more front-side RDLs (e.g., FS RDLs 108A of FIG. 1A) is formed over the fan-out tier. In step 1306, a second die (e.g., die 104A) is bonded to the one or more front-side RDLs. Next, in step 1308, a conductive feature in the one or more backside RDLs is exposed, for example, by laser drilling. In step 1310, an external connector (e.g., connector 120) is disposed on the exposed conductive feature. The external connector may be used to electrically connect the device package to other package features such as other device dies, interposers, package substrates, printed circuit boards, a mother board, and the like.

FIG. 21 illustrates a process flow 1400 for forming a device package in accordance with some alternative embodiments. In step 1402, a first package (e.g., package 1102) is formed. The first package may include a first fan-out tier, such as, fan-out tier 101A having device dies, RDLs, TIVs, and the like formed therein. In step 1404, functional tests (e.g., electrical and/or mechanical stress tests) are performed on the first package. In step 1406, a second package (e.g., package 1104) is formed. The second package may include a second fan-out tier, such as, fan-out tier 101B having device dies, RDLs, TIVs, and the like formed therein. In step 1408, functional tests (e.g., electrical and/or mechanical stress tests) are performed on the second package. In step 1410, the first and second packages are bonded together using connectors (e.g., connectors 1106), for example, in a PoP configuration. In various embodiments, only packages having passed the functional tests (e.g., KGPs) are bonded in step 1410. Packages that fail the functional tests may be reworked until they pass such functional tests.

FIG. 22 illustrates a process flow 1500 for forming a device package in accordance with some alternative embodiments. In step 1502, a first device die (e.g., die 104A of FIG. 3) is provided. The first device die may be a memory die, logic die, sensor die, networking die, MEMs die, and the like. In step 1504, a fan out tier (e.g., tier 101B of FIG. 3) is formed. The fan-out tier may be bonded to the first device die, and the fan-out tier may include a second device die (e.g., die 104B) and a TIV (e.g., TIV 126A of FIG. 3). In step 1506, a fan-out RDL (e.g., RDLs 108B) is formed. The fan-out RDL may be bonded to the fan-out tier. Next, in step 1508, a third device die is electrically (e.g., die 102) is electrically connected to the fan-out RDL. The third device die may be a core logic die, and the first and the third device dies may be electrically connected by a dedicated signaling path comprising the TIV. In some embodiments, the first and second device dies may be electrically isolated. In other embodiments, TSVs in the first and/or second device dies may electrically connect the first and the second device dies.

Various embodiments described herein include core logic dies bonded to other dies (e.g., memory, logic, sensor, networking, and the like circuits) in various package configurations. Each die may be disposed in various fan-out tiers. RDLs may be disposed on a front and/or back side of such fan-out tiers, and TIVs extending between tiers may provide electrical connection between different RDLs. Thus, dies in a package may be electrically connected to other dies and/or external connectors. In some embodiments, such external connectors may be disposed on metal lines formed within a RDL (e.g., a BS RDL). Heat dissipation features may be disposed on various dies (e.g., core logic dies, memory dies, and the like). Various embodiments may also include dedicated signaling paths (e.g., comprising dedicated TIVs and/or conductive features in RDLs) that electrically connect a single die to a core logic die and/or external connectors.

In accordance with an embodiment, a package includes a first fan-out tier having a first device die, a molding compound extending along sidewalls of the first device die, and a through intervia (TIV) extending through the molding compound. One or more first fan-out redistribution layers (RDLs) are disposed over the first fan-out tier and bonded to the first device die. A second fan-out tier having a second device die is disposed over the one or more first fan-out RDLs. The one or more first fan-out RDLs electrically connects the first and second device dies. The TIV electrically connects the one or more first fan-out RDLs to one or more second fan-out RDLs. The package further includes a plurality of external connectors at least partially disposed in the one or more second fan-out RDLs. The plurality of external connectors are further disposed on conductive features in the one or more second fan-out RDLs.

In accordance with another embodiment, package includes a first device die and a fan-out tier bonded to the first device die. The fan-out tier includes a second device die, a molding compound extending along sidewalls of the second device die, and a through intervia (TIV) extending through the molding compound. A fan-out RDL is bonded to the fan-out tier, and a third device die is electrically connected to the fan-out RDL. The first device die is electrically connected to the third device die by a first dedicated signaling path comprising the TIV.

In accordance with yet another embodiment, a method for forming a package includes forming one or more first fan-out redistribution layers (RDLs) having a conductive line and forming a fan-out tier over the one or more first fan-out RDLs. Forming the fan-out tier includes forming a through intervia (TIV) over the one or more first fan-out RDLs, bonding a first device die to the one or more first fan-out RDLs, dispensing a molding compound around the first device die and the TIV, and exposing connectors on the first device die and the TIV. The method further includes forming one or more second fan-out RDLs over the fan-out tier and bonding a second device die to the one or more second fan-out RDLs. The first TIV electrically connects the one or more second fan-out RDLs to the one or more first fan-out RDLs, and the one or more second fan-out RDLs electrically connects the first and the second device dies. The one or more first fan-out RDLs is patterned to expose the conductive line, and an external connector is disposed on the conductive line. The external connector is at least partially disposed in the one or more first fan-out RDLs.

In accordance with yet another embodiment, a method includes forming one or more first redistribution layers (RDLs) over a carrier. A plurality of first conductive columns is formed over the carrier. A first device die is attached to the one or more first RDLs, the first device die being interposed between adjacent ones of the a plurality of first conductive columns. A first molding compound is dispensed over the first device die and the one or more first RDLs, the first molding compound extending along a sidewall of the first device die and sidewalls of the plurality of first conductive columns. One or more second RDLs are formed over the first device die and the first molding compound, the one or more second RDLs being electrically coupled to the first device die. A plurality of second conductive columns is formed over the one or more second RDLs. A second device die is attached to the one or more second RDLs, the second device die being interposed between adjacent ones of the plurality of second conductive columns, the one or more second RDLs being interposed between the first device die and the second device die. A second molding compound is dispensed over the second device die and the one or more second RDLs, the second molding compound extending along a sidewall of the second device die and sidewalls of the plurality of second conductive columns. One or more third RDLs are formed over the second device die and the second molding compound. One or more external connectors are formed over the one or more third RDLs, the one or more external connectors being electrically coupled to the one or more third RDLs. The carrier is debonded from the one or more first RDLs. After debonding the carrier from the one or more first RDLs, a third device die is attached to the one or more first RDLs, the one or more first RDLs being interposed between the first device die and the third device die.

In accordance with yet another embodiment, a method includes attaching a first device die to a carrier. A first molding compound is dispensed over the first device die and the carrier. First connectors are exposed on the first device die, a topmost surface of the first molding compound being level with topmost surfaces of the first connectors. One or more first redistribution layers (RDLs) are formed over the first device die and the first molding compound, the one or more first RDLs being electrically coupled to the first device die. A plurality of conductive columns is formed over the one or more first RDLs. A first device die stack is attached to the one or more first RDLs using second connectors, the first device die stack being interposed between adjacent ones of the plurality of conductive columns, the first device die stack comprising a second device die bonded to a third device die, a backside of the second device die facing a backside of the third device die. A second molding compound is dispensed over the first device die stack and the one or more first RDLs, the second molding compound extending along a sidewall of the second device die, a sidewall of the third device die, and sidewalls of the plurality of conductive columns. Third connectors are exposed on the third device die, a topmost surface of the second molding compound being level with topmost surfaces of the third connectors and topmost surface of the plurality of conductive columns. One or more second RDLs are formed over the first device die stack and the second molding compound. One or more external connectors are formed over the one or more second RDLs, the one or more external connectors being electrically coupled to the one or more second RDLs.

In accordance with yet another embodiment, a method includes forming one or more first redistribution layers (RDLs) over a first carrier. A plurality of first conductive columns is formed over the one or more first RDLs. A first device die is attached to the one or more first RDLs, the first device die being interposed between adjacent ones of the plurality of first conductive columns. A first molding compound is dispensed over the first device die and the one or more first RDLs. One or more second RDLs are formed over the first device die and the first molding compound, the one or more second RDLs being electrically coupled to the first device die. One or more first external connectors are formed over the one or more first RDLs, the one or more first external connectors being electrically coupled to the one or more first RDLs. One or more third RDLs are formed over a second carrier. A plurality of second conductive columns is formed over the one or more third RDLs. A device die stack is attached to the one or more third RDLs, the device die stack being interposed between adjacent ones of the plurality of second conductive columns, the device die stack comprising a second device die bonded to a third device die, a backside of the second device die facing a backside of the third device die. A second molding compound is dispensed over the device die stack and the one or more third RDLs, the second molding compound extending along a sidewall of the second device die, a sidewall of the third device die, and sidewalls of the plurality of second conductive columns. One or more fourth RDLs are formed over the device die stack and the second molding compound. One or more second external connectors are formed over the one or more fourth RDLs, the one or more second external connectors being electrically coupled to the one or more fourth RDLs. The one or more second RDLs are attached to the one or more fourth RDLs using the one or more second external connectors.

In accordance with yet another embodiment, a package includes a first fan-out tier. The first fan-out tier includes a first device die, a first molding compound extending along sidewalls of the first device die, and a first through intervia (TIV) extending through the first molding compound. The package further includes one or more first fan-out redistribution layers (RDLs) over the first fan-out tier and bonded to the first device die. The package further includes a second fan-out tier over the one or more first fan-out RDLs. The second fan-out tier includes a second device die bonded to the one or more first fan-out RDLs. The one or more first fan-out RDLs electrically connects the first device die to the second device die. The package further includes one or more second fan-out RDLs on an opposing side of the first fan-out tier from the one or more first fan-out RDLs. The first TIV electrically connects the one or more first fan-out RDLs to the one or more second fan-out RDLs. The package further includes a plurality of external connectors at least partially disposed in the one or more second fan-out RDLs. The plurality of external connectors are further disposed on conductive features in the one or more second fan-out RDLs.

In accordance with yet another embodiment, a package includes a first device die and a first fan-out tier bonded to the first device die. The first fan-out tier includes a second device die, a first molding compound extending along sidewalls of the second device die, and a first through intervia (TIV) extending through the first molding compound. The package further includes a first fan-out RDL bonded to the first fan-out tier and a third device die electrically connected to the first fan-out RDL. The first device die is electrically connected to the third device die by a first dedicated signaling path comprising the first TIV.

In accordance with yet another embodiment, a package includes a first redistribution structure, a first device die over the first redistribution structure, a second redistribution structure over the first device die, and a first molding compound between the first redistribution structure and the second redistribution structure. The first molding compound surrounds the first device die. The package further includes a first conductive pillar extending through the first molding compound. The first conductive pillar is in physical contact with the first redistribution structure and the second redistribution structure. The package further includes a second device die over the second redistribution structure, a third redistribution structure over the second device die, a second molding compound between the second redistribution structure and the third redistribution structure, and a third device die over the third redistribution structure. The second molding compound surrounds the second device die.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A package comprising:
   a first redistribution structure, the first redistribution structure comprising a first conductive feature and a second conductive feature;
   a first die directly connected to the first conductive feature of the first redistribution structure;
   a second die over the first die;
   a third die attached to the second conductive feature of the first redistribution structure; and
   a fourth die, wherein a back side of the fourth die faces a back side of the third die;
   a second redistribution structure including a first redistribution line and a second redistribution line, wherein the first redistribution line is connected to a third conductive feature of the second die, wherein the fourth die is coupled to the second redistribution line of the second redistribution structure;
   a first encapsulant around the first die, the second die, the third die, and the fourth die, the first encapsulant extending from the first redistribution structure to the second redistribution structure, wherein a surface of the first encapsulant is level with a first surface of the second die, wherein the first surface of the second die faces away from the first die; and
   a first through via extending through the first encapsulant and electrically connecting the first redistribution structure to the second redistribution structure.

2. The package of claim 1, further comprising:
   a third redistribution structure;
   a fifth die directly connected to the first redistribution structure, wherein the fifth die is between the third redistribution structure and the first redistribution structure;
   a second through via extending from a third conductive feature of the first redistribution structure to a fourth conductive feature of the third redistribution structure; and
   a second encapsulant around the third die, the second encapsulant extending from the first redistribution structure to the third redistribution structure.

3. The package of claim 2, wherein the fifth die overlaps an edge of the first die.

4. The package of claim 1, further comprising:
   a third redistribution structure attached to the first redistribution structure;
   a fifth die connected to the third redistribution structure, wherein the fifth die comprises a second through via; and
   a fourth redistribution structure, wherein the fifth die is between the third redistribution structure and the fourth redistribution structure, wherein the fifth die is attached to the fourth redistribution structure with an adhesive.

5. The package of claim 4, wherein the third redistribution structure is attached to the first redistribution structure using solder.

6. The package of claim 1, wherein the first die is attached to the second die by an adhesive layer.

7. The package of claim 1, wherein the first die is directly connected to the first conductive feature by solder.

8. The package of claim 1, wherein the first encapsulant is between the first die and the first redistribution structure.

9. A package comprising:
   one or more first fan-out redistribution layers (RDLs);
   a first fan-out tier over the one or more first fan-out RDLs, the first fan-out tier comprising:
      a first device die attached directly to a first conductive feature of the one or more first fan-out RDLs;
      a second device die, wherein a back side of the first device die faces a back side of the second device die;
      a first encapsulant extending along sidewalls of the first device die and the second device die; and
      a first through via extending through the first encapsulant;
   one or more second fan-out RDLs over the first fan-out tier, wherein a first conductive feature of the one or more second RDLs directly contacts and is bonded to the second device die; and
   solder connectors on a first RDL layer of the one or more second fan-out RDLs, wherein the first RDL layer of the one or more second fan-out RDLs is an outermost RDL layer from the first encapsulant.

10. The package of claim 9, further comprising:
    one or more third fan-out RDLs attached to the one or more first fan-out RDLs;
    a second fan-out tier attached to the one or more third fan-out RDLs, wherein the one or more first fan-out RDLs is between the first fan-out tier and the second fan-out tier, wherein the second fan-out tier comprises:
       a third device die bonded to the one or more third fan-out RDLs, wherein the one or more third fan-out RDLs electrically connects the first device die to the third device die;
       a second encapsulant extending along sidewalls of the third device die; and
       a second through via extending through the second encapsulant.

11. The package of claim 10, wherein the first encapsulant is completely separated from the second encapsulant.

12. The package of claim 9, wherein the first fan-out tier further comprises:
    a fourth device die attached to a second conductive feature of one or more first fan-out RDLs; and
    a fifth device die, wherein a back side of the fourth device die faces a back side of the fifth device die, wherein the fifth device die is coupled to the one or more second fan-out RDLs, wherein the first encapsulant extends along sidewalls of the fourth device die and the fifth device die.

13. The package of claim 12, wherein the first through via is between the first device die and the fourth device die.

14. The package of claim 9, further comprising an underfill between the first device die and the one or more first fan-out RDLs.

15. The package of claim 9, further comprising an adhesive layer between the back side of the first device die and the back side of the second device die.

16. A package comprising:
    a first redistribution structure;
    a first device die over the first redistribution structure, wherein the first device die comprises a first through via;
    a second redistribution structure over the first device die;
    a first encapsulant between the first redistribution structure and the second redistribution structure, the first encapsulant surrounding the first device die;
    a first conductive pillar extending through the first encapsulant, a first end of the first conductive pillar being level with a first surface of the first encapsulant;

a third redistribution structure bonded to the second redistribution structure, wherein the second redistribution structure is bonded to the third redistribution structure by solder connectors;
a second device die over the third redistribution structure;
a third device die over the second device die;
a fourth redistribution structure over the third device die;
a second encapsulant between the second redistribution structure and the third redistribution structure, the second encapsulant surrounding the second device die and the third device die; and
a second conductive pillar extending through the second encapsulant, a first end of the second conductive pillar being level with a first surface of the second encapsulant.

17. The package of claim 16, wherein a back side of the second device die faces a back side of the third device die.

18. The package of claim 17, wherein the back side of the second device die is attached to the back side of the third device die with an adhesive layer.

19. The package of claim 16, wherein a second end of the second conductive pillar is level with a second surface of the second encapsulant.

20. The package of claim 16, wherein a second end of the first conductive pillar is level with a second surface of the first encapsulant.

* * * * *